(12) United States Patent
Bailey et al.

(10) Patent No.: US 8,053,840 B2
(45) Date of Patent: Nov. 8, 2011

(54) THIN FILM TRANSISTOR COMPRISING NOVEL CONDUCTOR AND DIELECTRIC COMPOSITIONS

(75) Inventors: Richard Kevin Bailey, Newark, DE (US); Graciela Beatriz Blanchet, Wilmington, DE (US); John W. Catron, Jr., Smyrna, DE (US); Reid John Chesterfield, Santa Barbara, CA (US); Marc B. Goldfinger, West Chester, PA (US); Gary Delmar Jaycox, West Chester, PA (US); Lynda Kaye Johnson, Wilmington, DE (US); Irina Malajovich, Swarthmore, PA (US); Hong Meng, Wilmington, DE (US); Jeffrey Scott Meth, Landenberg, PA (US); Kenneth George Sharp, Landenberg, PA (US); Rinaldo Soria Schiffino, Wilmington, DE (US); Feng Gao, Hockessin, DE (US); Gerald Donald Andrews, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 123 days.

(21) Appl. No.: 12/403,685

(22) Filed: Mar. 13, 2009

(65) Prior Publication Data

US 2009/0179198 A1    Jul. 16, 2009

Related U.S. Application Data

(62) Division of application No. 11/488,200, filed on Jul. 17, 2006, now Pat. No. 7,528,448.

(51) Int. Cl.
*H01L 27/01* (2006.01)
*H01L 27/12* (2006.01)

(52) U.S. Cl. .................. 257/352; 257/347; 257/E29.151

(58) Field of Classification Search .................. 257/347, 257/352, E29.151
See application file for complete search history.

(56) References Cited

U.S. PATENT DOCUMENTS

| | | | |
|---|---|---|---|
| 5,256,506 A | 10/1993 | Ellis et al. | |
| 5,362,826 A | 11/1994 | Berge et al. | |
| 5,370,825 A | 12/1994 | Angelopoulos et al. | |
| 5,863,465 A | 1/1999 | Kinlen | |
| 6,228,555 B1 | 5/2001 | Hoffend, Jr. et al. | |
| 7,528,448 B2 * | 5/2009 | Bailey et al. .................. | 257/352 |
| 2005/0038009 A1 | 2/2005 | Starke et al. | |
| 2005/0038010 A1 | 2/2005 | Cao et al. | |
| 2005/0116202 A1 | 6/2005 | Gao et al. | |
| 2006/0081840 A1 | 4/2006 | Mori et al. | |
| 2006/0124922 A1 | 6/2006 | Kim et al. | |

FOREIGN PATENT DOCUMENTS

EP    1 434 281 A    6/2004

(Continued)

OTHER PUBLICATIONS

Kerins et al., Generation of Substituted Styrenes via Suzuki Cross-Coupling of Aryl Halides with 2,4,6-Trivinylcyclotriboroxane, The Journal of Organic Chemistry, 2002, pp. 4968-4971, vol. 67.

(Continued)

*Primary Examiner* — Ngan Ngo

(57) ABSTRACT

The invention relates to thin film transistors comprising novel dielectric layers and novel electrodes comprising metal compositions that can be provided by a dry thermal transfer process.

28 Claims, 4 Drawing Sheets

FOREIGN PATENT DOCUMENTS

| | | |
|---|---|---|
| EP | 143428 A | 6/2004 |
| WO | 03/035279 A1 | 5/2003 |
| WO | 03/052841 A1 | 6/2003 |
| WO | 03/099574 A1 | 12/2003 |
| WO | 2006/024012 A1 | 3/2006 |
| WO | 2006/050496 A1 | 5/2006 |
| WO | 2006/113205 A2 | 10/2006 |

OTHER PUBLICATIONS

Doyle et al., Alkyl nitrite-metal halide deamination reactions. 2. Substitutive deamination of arylamines by alkyl nitrites and copper(II) halides. A direct and remarkably efficient conversion of arylamines to aryl halides, The Journal of Organic Chemistry, 1977, pp. 2431-2436, vol. 42.

Cho et al., Polycyclic fluoranthene hydrocarbons. 2. A new general synthesis, The Journal of Organic Chemistry, 1987, pp. 5668-5678, vol. 52.

Ishiyama et al., Palladium(0)-Catalyzed Cross-Coupling Reaction of Alkoxydiboron with Haloarenes: A Direct Procedure for Arylboronic Esters, The Journal of Organic Chemistry, 1995, pp. 7508-7510, vol. 60.

Murata et al., Novel Palladium(0)-Catalyzed Coupling Reaction of Dialkoxyborane with Aryl Halides: Convenient Synthetic Route to Arylboronates, The Journal of Organic Chemistry, 1997, pp. 6458-6459, vol. 62.

Murata et al., Palladium-Catalyzed Borylation of Aryl Halides or Triflates with Dialkoxyborane: A Novel and Facile Synthetic Route to Arylboronates, The Journal of Organic Chemistry, 2000, pp. 164-168, vol. 65.

Zhu et al., An Improved Preparation of Arylboronates: Application in One-Pot Suzuki Biaryl Synthesis, The Journal of Organic Chemistry, 2003, pp. 3729-3732, vol. 68.

Itami et al., Stereoselective Synthesis of Multisubstituted Butadienes through Directed Mizoroki-Heck Reaction and Homocoupling Reaction of Vinyl(2-pyridyl)silane, Organic Letters, 2004, pp. 3695-3698, Vol. 6.

Miyaura et al., Palladium-Catalyzed Cross-Coupling Reactions of Organoboron Compounds, Chemical Reviews, 1995, pp. 2457-2483, vol. 95.

Darses et al., Potassium Trifluoro(organo)borates: New Perspectives in Organic Chemistry, The European Journal of Organic Chemistry, 2003, pp. 4313-4327, vol. 22.

Reetz et al., Ligand-free Heck reactions using low Pd-loading, Chemical Communications, 2004, pp. 1559-1563, vol. 14.

Bredas, "Handbook of Conducting Polymers", 1986, Marcel Dekker, Inc., New York (Book Not Included).

Matsuoka, "Infrared Absorbing Materials", 1990, Plenum Press (Book Not Included).

Matsuoka, "Absorption Spectra of Dyes for Diode Lasers", 1990, Bunshin Publishing Co., Tokyo (Book Not Included).

Ed G. Wypych, "Handbook of Plasticizers", 2004, ChemTec Publishing, Toronto, Ontario (Book Not Included).

Sze, "Physics of Conductor Devices", 2nd Edition, 1981, John Wiley & Sons, New York (Book Not Included).

Negishi, Palladium- or nickel-catalyzed cross coupling. A new selective method for carbon-carbon bond formation, Accounts of Chemical Research, 1982, pp. 340-348, vol. 15.

Kumada, Nickel and palladium complex catalyzed cross-coupling reactions of oranometallic reagents with organic halides, Pure and Applied Chemistry, 1980, pp. 669-679, vol. 52.

Lighfoot et al., 4,4,6-Trimethyl-2-vinyl-1,3,2-dioxaborinane: a superior 2-carbon building block for vinylboronate Heck couplings, Tetrahedron Letters, 2003, pp. 7645-7648, vol. 44.

Herrmann et al., C-C coupling reactions (Heck et al.), pp. 511-523, in "Aqueous-Phase Organometallic Catalysis" 2nd Edition, 2004, Wiley (Book Not Included).

Huo et al., "Palladium-catalyzed alkenyl-aryl, aryl-alkenyl, and alkenyl-alkenyl coupling reactions", pp. 335-408, in "Handbook of Organopalladium Chemistry for Organic Synthesis", 2002, Wiley (Book Not Included).

Braese et al., "Double and multiple Heck reactions", pp. 1179-1208, in "Handbook of Organopalladium Chemistry for Organic Synthesis", 2002, Wiley (Book Not Included).

Farina, High-Turnover Palladium Catalysts in Cross-Coupling and Heck Chemistry: A Critical Overview, Advanced Synthesis & Catalysis, 2004, pp. 1553-1582, vol. 346(13-15).

Doyle et al., Alkyl Nitrite-Metal Halide Deamination Reactions. 3. Arylation of Olefinic Compounds in the Deamination of Arylamines by Alkyl Nitrites and Copper (II) Halides. A Convenient and Effective Variation of the Meerwein Arylation Reaction, Journal of Organic Chemistry, 1977, pp. 2431-2431, vol. 42, No. 14.

Littke et al., Palladium-Catalyzed Coupling Reactions of Aryl Chlorides, Angew. Chem. Int. Ed., 2002, pp. 4176-4211, vol. 41 (22).

Stille, The Palladium-Catalyzed Cross-Coupling Reactions of Organotin Reagents With Organic Electrophiles, Angew. Chem. Int. Ed., 1986, pp. 508-524, vol. 25.

MacDiarmid, Synthetic Metals: A Novel Role for Organic Polymers (Nobel Lecture), Angew. Chem. Int. Ed., 2001, pp. 2581-2590, vol. 40.

Heeger, Semiconducting and Metallic Polymers: The Fourth Generation of Polymeric Materials (Nobel Lecture), Angew. Chem. Int. Ed., 2001, pp. 2591-2611, vol. 40.

International Search Report dated Jul. 11, 2008 for International Application No. PCT/US2007/016119 (7 pages).

* cited by examiner

THIN FILM TRANSISTOR COMPRISING NOVEL CONDUCTOR AND DIELECTRIC COMPOSITIONS

This invention was made with United States Government support under Agreement No. 70NANB2H03032 awarded by NIST Advanced Technology Program. The United States Government has certain rights in the invention.

FIELD OF INVENTION

The invention relates to thin film transistors comprising novel dielectric layers including polymer/dye and polymer compositions, and novel electrodes comprising metal compositions that can be provided by a dry thermal transfer process.

BACKGROUND

Thin film transistors (TFTs) made in whole or in part of organic materials can be less expensive and easier to manufacture than traditional transistors and can be used in applications where traditional transistors are not economical and high density is not required. For example, organic thin film transistors could be used for electronic paper, posters and books, smart cards, toys, appliances and electronic bar codes for product identification. Organic TFTs can also be made from flexible materials, and such TFTs can be used to control diodes in flexible panel displays for computers, laptops and televisions.

A particular advantage of organic TFTs lies in the opportunities for manufacturing of TFTs using thermal printing methodologies that reduce or eliminate the need for chemical etchants, photomasks, and solvent-based processes. There are several known examples of thermal transfer of layers for the construction of electronic devices.

A particular need for printable electronics includes thermally imageable insulating layers or dielectric passivation layers. WO 2005/004205, for instance, discloses a method of forming a pattern of filled dielectric material on a substrate by a thermal transfer process comprising exposing to heat a thermally imageable donor element comprising a base film, a light to heat conversion (LTHC) layer, and a transfer layer of dielectric material. In a thin film transistor (TFT), the dielectric layer serves to insulate the gate electrode from the semiconductor and source-drain electrodes. Its primary function is to allow the passage of fields, but not currents. Fundamental requirements are that the dielectric layer possess high volume resistivity, greater than $10^{14}$ ohm-cm, to prevent leakage currents; and be largely pinhole free to prevent catastrophic shorts between conductive layers. The dielectric layer also must have high purity in order not to dope the adjacent semiconductor layer; it should be thin, for instance, about 5 microns or less, and have a high dielectric constant for low-voltage operation.

Another particular need for printable electronics are thermal transfer donors that allow patterned thermal transfer of conducting metal layers that exhibit good transfer properties and good adhesion to a variety of materials. For instance, WO 03/035279 A1 discloses precursor compositions and a method for the deposition of electronic features including conducting layers. Particularly desirable are thermal transfer donors wherein, after transfer, no further heating or firing of the patterned metal layer is required to achieve a high conductivity metal layer.

Needed are TFTs comprising a dielectric layer and/or electrodes that can be provided by a dry thermal transfer process.

For optimal performance, the TFT and TFT arrays should have $I_{on/off}$, or median $I_{on/off}$ in the case of the TFT array, of preferably about 1 E+05 or greater and more preferably about 1 E+06 or greater. Additionally, the performance of the TFT arrays should be characterized by very high yields of functioning devices, preferably about 98% or greater, more preferably about 99% or greater and most preferably, about 100%. Also desirable are a long TFT lifetime, preferably a drop in $I_{on/off}$ after 50 days about half the original value or less; and a high mobility, preferably about 0.05 cm$^2$V$^{-1}$s$^{-1}$ or greater, more preferably about 0.1 cm$^2$V$^{-1}$s$^{-1}$ or greater and most preferably about 0.5 cm$^2$V$^{-1}$s$^{-1}$ or greater. Desirable are TFT arrays with narrow distributions of threshold voltage, preferably about 85% with a threshold voltage distribution of about 10 V or less; and TFT/capacitor arrays with yields of both TFT's and capacitors of about 98% or greater, more preferably about 99% or greater and most preferably about 100%.

SUMMARY OF INVENTION

One aspect of the invention is a thin film transistor comprising: (a) a substrate; (b) a gate electrode; (c) a dielectric layer; (d) a source electrode; (e) a drain electrode; and (f) a semiconductor layer; wherein at least one of the gate, source and drain electrodes comprises a metal composition (A) comprising: (1) about 65 to about 95 wt %, based on the total weight of the metal composition, of a metal powder selected from the group consisting of: Ag, Cu and alloys thereof; having a plurality of metal particles having an average longest dimension of about 5 nm to about 1500 nm; and (2) about 5 to about 35 wt % of a dispersant comprising one or more resins selected from the group consisting of: conducting polymers selected from the group consisting of: polyaniline, polythiophene, polypyrrole, polyheteroaromatic vinylenes, and their derivatives; nonconducting polymers selected from the group consisting of: acrylic and styrenic-acrylic latexes, and solution-based acrylics and styrenic-acrylic (co)polymers, and combinations thereof; copolymers of ethylene with one or more monomers selected from the group consisting of: (meth)acrylate(s), vinyl acetate, carbon monoxide and (meth)acrylic acid; and polyvinylacetate and its copolymers.

Another aspect of the invention is a thin film transistor comprising: (a) a substrate; (b) a gate electrode; (c) a dielectric layer; (d) a source electrode; (e) a drain electrode; and (f) a semiconductor layer; wherein the dielectric layer has a resistivity of about $10^{14}$ ohm-cm or greater, and comprises at least one Layer A, comprising: (1) one or more dielectric polymer(s) selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxystyrene), poly(4-hydroxystyrene), and copolymers of poly(4-hydroxystyrene) with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly (vinyl acetate); and (2) about 0.5 wt % to about 10 wt %, based on a dry weight of Layer A, of one or more near-IR dye(s) having an absorption maximum in the range of about 600 to about 1200 nm within Layer A.

Another aspect of the invention is a thin film transistor comprising: (a) a substrate; (b) a gate electrode; (c) a dielectric layer; (d) a source electrode; (e) a drain electrode; and (f) a semiconductor layer; wherein the dielectric layer has a resistivity of about $10^{14}$ ohm-cm or greater, and comprises at least one Layer C, comprising one or more dielectric polymer(s) selected from the group consisting of: acrylic, styrenic and styrenic-acrylic latexes; comprising at least about 85 wt % of monomers selected from the group consisting of: alkyl (meth)acrylate, styrene, and alkyl-substituted styrene wherein the alkyl group is a C1 to C18 straight or branched chain alkyl group.

DETAILED DESCRIPTION

Figure 1A:
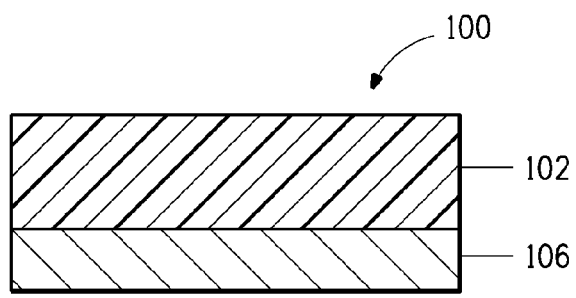
FIGS. 1A and 1B are cross-sectional views of thermal imaging dielectric donors useful in forming TFTs according to one embodiment of the invention.

Before addressing details of embodiments described below, some terms are defined or clarified.

DEFINITIONS

The term "aromatic" as used herein refers to an unsaturated cyclic organic compound or group having continuous conjugation with delocalized π-electrons. The aromatic group may have one or more rings, each having 2n+2π-electrons. The term includes groups having one or more heteroatoms having π-electrons in the ring. In one embodiment, the heteroatom is selected from the group consisting of N, O, and S.

The term "acene" as used herein refers to a hydrocarbon parent component that contains two or more ortho-fused benzene rings in a straight linear arrangement. "Acenes" include naphthalene (two ortho-fused benzene rings) and anthracene (three ortho-fused benzene rings). Systems of four or more fused benzene rings are named from the numerical prefix denoting the number of benzene rings followed by the ending "-acene".

The term "alkyl", whether as part of another term or used independently, denotes a saturated hydrocarbon radical. Examples of alkyl groups include n-butyl, n-pentyl, n-heptyl, iso-butyl, t-butyl, and iso-pentyl. The term includes heteroalkyls. In one embodiment, the alkyl group has from 1-20 carbon atoms. In one embodiment, the alkyl group is a fluoroalkyl group.

The term "alkyl ether" refers to an alkyl group having one or more carbon atoms replaced with O, and attached via the oxygen.

The term "ether alkyl" refers to an alkyl group having one or more carbon atoms replaced with O, and attached via a carbon.

The term "alkenyl", whether as part of another term or used independently, denotes hydrocarbon radicals having one or more double bonds between neighboring carbon atoms of the radical. Examples of alkenyl groups include vinyl, allyl, butenyl, pentenyl, and heptenyl. The term includes heteroalkenyl groups. In one embodiment, the alkenyl group has from 1-20 carbon atoms.

The term "alkynyl", whether as part of another term or used independently, denotes hydrocarbon radicals having one or more triple bonds between neighboring carbon atoms of the radical. Examples of alkynyl groups include ethynyl, propynyl, butynyl, hexynyl and heptynyl. The term includes heteroalkynyl groups. In one embodiment, the alkynyl group has from 1-20 carbon atoms.

The term "aryl", whether as part of another term or used independently, refers to an aromatic group having one point of attachment. The term "arylene" refers to an aromatic group having two points of attachment. In one embodiment, the aryl group has from 4-30 carbon atoms.

The term "silyl", whether as part of another term or used independently, refers to the group —$SiR_3$, where R is selected from the group consisting of hydrogen, alkyl, aryl, alkenyl, alkynyl, and amino.

The term "thioalkyl", whether as part of another term or used independently, refers to the group —SR, where R is selected from the group consisting of hydrogen, alkyl, aryl, alkenyl, and alkynyl.

The prefix "hetero" indicates that one or more carbons have been replaced with a different atom. In one embodiment, the heteroatom is selected from the group consisting of N, O, and S.

The prefix "fluoro" indicates that one or more hydrogens have been replaced with fluorine. The term includes partially and fully fluorinated materials.

Any of the above groups may be a straight-chain or branched-chain. Examples of straight-chain alkyls, alkenyls, and alkynyls include n-butyl, n-pentyl, n-heptyl, n-octyl, n-butenyl, n-pentenyl, n-heptenyl, and n-heptynyl. Examples of branched-chain alkyls, alkenyls, and alkynyls include iso-butyl, t-butyl, iso-pentyl, neo-pentyl, isopentenyl, and neo-pentenyl.

Any of the above groups may be substituted or unsubstituted. The term "substituted" denotes a group that is mono- or poly-substituted with the same or different substituent groups. Suitable substituent groups include cyano, nitro, ester, ether, halogen, hydroxy, alkyl, aryl, and alkoxy groups. In one embodiment, substituents include ether groups and fluorine substituents.

Herein the terms "acrylic", "acrylic resin", "(meth)acrylic resins", and "acrylic polymers", are synonymous unless specifically defined otherwise. These terms refer to the general class of addition polymers derived from the conventional polymerization of ethylenically unsaturated monomers derived from methacrylic and acrylic acids and alkyl and substituted-alkyl esters thereof. The terms encompass homopolymers and copolymers. The terms encompass specifically the homopolymers and copolymers of methyl (meth)acrylate, ethyl (meth)acrylate, butyl (meth)acrylate, 2-hydroxyethyl (meth)acrylate, (meth)acrylic acid and glycidyl (meth)acrylate. The term copolymer herein encompasses polymers derived from polymerization of two or more monomers, unless specifically defined otherwise. The term (meth) acrylic acid encompasses both methacrylic acid and acrylic acid. The term (meth)acrylate, encompasses methacrylate and acrylate.

The terms "styrene acrylic polymers", "acrylic styrene" and "styrene acrylic" are synonymous and encompass copolymers of the above described "acrylic resins" with styrene and substituted styrene monomers, for instance alpha-methyl styrene.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

Dielectric Layers

One aspect of the invention is a TFT comprising a dielectric layer having a resistivity of about $10^{14}$ ohm-cm or greater comprising at least one layer of material, herein referred to as Layer A, comprising: one or more dielectric polymers selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly(vinyl acetate); and about 0.5 wt % to about 10 wt %, based on the dry weight of the Layer A, of one or more near-IR dye(s) having an absorption maximum in the range of about 600 to about 1200 nm within Layer A. The term dielectric polymers herein encompasses homopolymers, copolymers derived from polymerization of two or more monomers, post-derivatized (co)polymers including graft (co)polymers, and low molecular weight homopolymers or copolymers. The polymers may be linear, branched, hyperbranched or dendritic.

Preferred dielectric polymers for Layer A include acrylic, styrenic and styrenic-acrylic latexes comprising alkyl (meth) acrylate, styrene, and alkyl-substituted styrene wherein the alkyl group is a C1 to C18 straight or branched chain alkyl group. Preferred optional monomers for these latex-based polymers include (meth)acrylic acid, hydroxyethyl (meth) acrylate and glycidyl (meth)acrylate. More preferred acrylic, styrenic and styrenic-acrylic latexes are selected from the group: Latexes A, defined herein as one or more latex resins comprising at least about 85 wt %, preferably at least about 90 wt %, and more preferably at least about 95 wt %, of monomers selected from the group: alkyl (meth)acrylate, styrene, and alkyl-substituted styrene wherein the alkyl group is a C1 to C18 straight or branched chain alkyl group. Preferred optional monomers for these latex resins include (meth) acrylic acid, preferably up to about 5 wt %, hydroxyethyl (meth)acrylate, preferably up to about 10 wt %, and glycidyl (meth)acrylate, preferably up to about 5 wt %. Preferably the latexes have an average particle size of less than about 150 nm, more preferably, less than about 100 nm, and an acid number less than about 100, preferably less than about 75, and more preferably less than about 25.

Particularly preferred polymers for Layer A with high resistivity (above $10^{14}$ ohm-cm) are Acrylic Latexes B and Styrene-Acrylic Latexes C and combinations thereof. Acrylic Latexes B are defined herein as one or more acrylic latexes comprising at least about 85 wt %, preferably at least about 90 wt %, and more preferably at least about 95 wt %, of monomers selected from the group consisting of: methyl methacrylate and butyl acrylate. Styrene-Acrylic Latexes C are defined herein as one or more styrene-acrylic latexes comprising at least about 85 wt %, preferably at least about 90 wt %, and more preferably at least about 95 wt %, of monomers selected from the group consisting of: methyl methacrylate, butyl acrylate and styrene. Preferred optional monomers for Acrylic Latexes B and Styrene-Acrylic Latexes C are selected from the group consisting of: (meth)acrylic acid, preferably up to about 5 wt %, hydroxyethyl methacrylate, preferably up to about 10 wt %, and glycidyl methacrylate, preferably up to about 5 wt %. Commercial examples of acrylic and styrenic acrylic latexes useful as dielectric polymers include Joncryl® 95 and 1915 (co)polymers (Johnson Polymer). Methods for synthesizing suitable latex polymers have been reported in WO 03/099574.

Further preferred dielectric polymers for Layer A include solution-based acrylic, styrenic and styrenic-acrylic polymers. Herein the term "solution-based" refers to materials that are soluble in solvents such as water and/or one or more common organic solvents including alcohols, e.g. ethanol and butoxyethanol; ethers, e.g. dimethoxyethane; esters, e.g. ethyl and butyl acetate; ketones, e.g., acetone and 2-butanone; and aromatic hydrocarbons, e.g. xylenes. Preferred solution-based acrylic, styrenic and styrenic-acrylic polymers have a Mw of less than about 100,000, preferably less than 50,000, and more preferably less than 30,000. Furthermore, preferred solution-based acrylic, styrenic and styrenic-acrylic polymers have an acid number less than about 250. Preferred solution-based acrylic, styrenic and styrenic-acrylic polymers comprise monomers selected from the group: alkyl (meth)acrylate, benzyl (meth)acrylate, styrene, and alkyl-substituted styrene wherein the alkyl group is a C1 to C18 straight or branched chain alkyl group. Preferred optional monomers for these solution-based polymers include (meth) acrylic acid and hydroxyethyl (meth)acrylate.

A particularly preferred material for Layer A is a combination of the acrylic, styrenic and styrenic-acrylic latexes and water-based acrylic, styrenic and styrenic-acrylic polymers described above. Preferably the combination comprises about 20 wt % to about 80 wt %, more preferably about 40 wt % to about 80 wt %, of an acrylic or styrenic-acrylic latex fraction and about 20 wt % to about 80 wt %, more preferably about 20 wt % to about 60 wt %, of a water-based acrylic or styrenic-acrylic polymer fraction, based on the dry weight of the combination.

Other preferred dielectric polymers for Layer A include heteroatom-substituted styrenic polymers selected from the group consisting of: partially hydrogenated poly(4-hydroxy) styrene, poly(4-hydroxy)styrene (PHS), and copolymers of PHS with hydroxyethyl (meth)acrylate, alkyl (meth)acrylate, styrene, and alkyl-substituted styrene wherein the alkyl group is a C1 to C18 straight or branched chain alkyl group. Particularly preferred comonomers are hydroxyethyl methacrylate, butyl acrylate, methyl methacrylate and styrene with hydroxyethylmethacrylate and butyl acrylate being especially preferred. The PHS (co)polymers may be linear or branched. When PHS homopolymer is used, the branched structure is preferred Preferred (co)polymers of this class have a $M_w$ of less than about 30,000 and preferably less than about 20,000 and more preferably less than about 10,000. Partially hydrogenated PHS refers to PHS polymers that have been hydrogenated up to about 50 equivalent % of the unsaturation within the polymer and preferred polymers are hydrogenated to about 10 to 20 equivalent %. Commercial examples include PHS-B (branched PHS homopolymer; DuPont Electronic Technologies, Dallas, Tex.), Maruka Lyncur CMM (PHS copolymer with methyl methacrylate; Maruzen Petrochemical Co., LTD. Tokyo, Japan), Maruka Lyncur CHM (PHS copolymer with hydroxyethyl methacrylate; Maruzen), Maruka Lyncur CBA (PHS copolymer with buyl acrylate, Maruzen), Maruka Lyncur CST 15, 50, and 70 (PHS copolymers with styrene, Maruzen), and Maruka Lyncur PHM-C (partially hydrogenated PHS, Maruzen).

Other preferred dielectric polymers for Layer A include those selected from the group consisting of: phenol-aldehyde (co)polymers/(co)oligomers and combinations thereof. Preferred (co)polymers/(co)oligomers in this class are derived from mono- and bis-phenols and mono- and bis-aldehydes selected from the group consisting of: phenol; alkyl- and aryl-substituted phenols; formaldehyde; and alkyl-, aryl- and heteroatom-substituted aldehydes. The phenol-aldehyde resins can be further derivatized, e.g., the hydroxy group converted to an ether group. Preferred (co)polymers/(co)oligomers within this group have a $M_W$ of about 20,000 or less, preferably about 10,000 or less. Commercial examples include Novolac®/Novolak® resins (Schenectady International Inc., Schenectady N.Y.).

Other preferred dielectric polymers for Layer A include poly(vinyl acetate) homopolymer. Preferred polymers within this group have a $M_W$ of about 100,000 or less.

The above polymers may be plasticized for improved flexibility, adhesion, compatibilization with an IR dye, among other characteristics. In certain instances, the plasticizer may be selected from the above classes of polymers. For example, a higher Tg or higher molecular weight (MW) phenol-aldehyde polymer can be blended with a lower Tg or lower MW phenol-aldehyde polymer. Another example is PHS blended with a phenol-aldehyde polymer. Examples of suitable plasticizers for some of the above classes of polymers comprise poly(ethylene) glycol, glycerol ethoxylate, di(ethylenegly-col) dibenzoate, and phthalate-based plasticizers such as dibutyl phthalate. A number of potentially suitable plasticizers for various polymers and details regarding their use may be found in the following reference: "*Handbook of Plasticizers,*" Ed. G. Wypych, ChemTec Publishing, Toronto, Ont. 2004.

Layer A comprises about 0.5 wt % to about 10 wt %, and more preferably about 0.5 wt % to about 6 wt %, based on the dry weight of Layer A, of one or more near-IR dye(s) having an absorption maximum of about 600 to about 1200 nm within the Layer A. Preferably the near-IR dye is chosen such that its absorption band overlaps with the emission band of the exposure laser used in the transfer process. Typically, the exposure laser emits radiation in the near-IR range. Preferred classes of dyes are the cyanine compound(s) selected from the group: indocyanines, phthalocyanines including polysubstituted phthalocyanines and metal-containing phthalocyanines, and merocyanines. A particularly preferred class of near-IR dye(s) is that of indocyanine dyes, preferably having absorption at about 830 nm. A number of suitable indocyanine dyes absorbing at around 830 nm and with solubility in different solvents and in water are available from H. W. Sands Co. and other sources. Preferred near-IR dyes for the invention are selected from the group: 3H-indolium, 2-[2-[2-chloro-3-[(1,3-dihydro-1,3,3-trimethyl-2H-indol-2-ylidene) ethylidene]-1-cyclopenten-1-yl]ethenyl]-1,3,3-trimethyl-, salt with trifluoromethanesulfonic acid (1:1) having CAS No. [128433-68-1]; 2-(2-(2-chloro-3-(2-(1,3-dihydro-1,1-dimethyl-3-(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1]; and indolenine dyes corresponding to formulas (I) and (II) and resonance structures thereof:

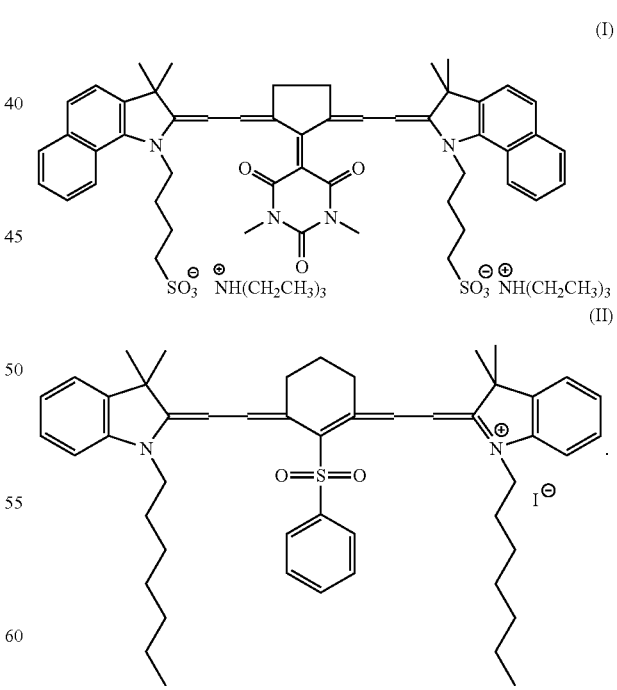

Preferred dye levels in the material will give a film OD of about 0.2 or greater, with an OD of about 0.5 to about 1.5 being preferred. To reach a preferred OD, unfilled water-based latex systems will typically require a higher dye loading of about 4 to 6 wt %. Unfilled solution-based systems will typically require lower dye loadings of about 0.5 to about 2 wt %.

In another preferred embodiment the dielectric layer comprises two or more Layers A that are gradient dye layers with each gradient dye layer independently having a dry wt % of near-IR dye of about 0.5 to about 10 wt %; wherein at least one gradient dye layer has a lower wt % of near-IR dye, at least one gradient dye layer has a higher wt % of near-IR dye, and said higher wt % of near-IR dye is a value at least 20% higher than that of the lower wt % of near-IR dye.

In another preferred embodiment, the at least one Layer A further comprises a high κ nanoparticle fraction, of about 10 to about 90 wt % based on the dry weight of Layer A, with the nanoparticle fraction having a dielectric constant greater than about 20, and an average particle size of about 5 nm to about 500 nm. Herein high κ dielectric nanoparticle fraction refers to nanoparticles with a dielectric constant of about 20 and above, preferably about 30 and above, and more preferably about 100 and above. Preferred dielectric polymers for practicing this embodiment are selected from the group: acrylic and styrenic-acrylic latexes, solution-based acrylic and styrenic-acrylic (co)polymers, and combinations thereof; and phenol-aldehyde (co)polymers/(co)oligomers; as described above. Preferred high κ dielectric nanoparticles for practicing this embodiment are selected from the group: barium titanate, strontium titanate, barium strontium titanate and titanium dioxide.

In another preferred embodiment the dielectric layer comprises two or more Layers A that are gradient nanoparticle layers with each gradient nanoparticle layer independently having a dry wt % of high κ (high dielectric constant) nanoparticle fraction of about 10 to about 90 wt %; wherein at least one gradient nanoparticle layer has a lower wt % of high κ nanoparticle fraction and at least one gradient nanoparticle layer has a higher wt % of high κ nanoparticle fraction, and said higher wt % of high κ nanoparticle fraction is a value at least 20% higher than that of the lower wt %.

In another preferred embodiment the dielectric layer further comprises an additional dielectric layer, herein referred to as Layer B, comprising one or more dielectric polymers, characterized by a resistivity of about $10^{14}$ ohm-cm or greater. Extensive lists of dielectric polymers can be found in WO 03/052841 and WO 06/024012. Preferred dielectric polymers for Layer B are selected from the group consisting of: acrylic and styrenic polymers selected from the group consisting of: acrylic, styrenic and styrenic-acrylic latex, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly (vinyl acetate), as described above. This embodiment can be further practiced including other embodiments disclosed above. Preferred optional additives for Layer B include carbon black and high κ nanoparticles with preferred high κ dielectric nanoparticles for practicing this embodiment selected from the group consisting of: barium titanate, strontium titanate, barium strontium titanate and titanium dioxide.

Another aspect of the invention is a TFT wherein the dielectric layer has a resistivity of $10^{14}$ ohm-cm or greater and comprises at least one layer of material, herein referred to as Layer C, comprising one or more dielectric polymer(s) selected from the group consisting of: Latexes A, as defined above. This embodiment can be further practiced including other embodiments disclosed above for Latexes A. In one embodiment Layer C further comprises a high κ nanoparticle fraction, up to about 90 wt % of the dry weight of Layer C, with the nanoparticle fraction having a dielectric constant greater than about 20, and an average particle size of about 5 nm to about 500 nm. Preferred optional additives for Layer C include carbon black and high κ dielectric nanoparticles with preferred high κ dielectric nanoparticles for practicing this embodiment selected from the group: barium titanate, strontium titanate, barium strontium titanate and titanium dioxide.

The Tg's of the dielectric polymers utilized in Layer A, Layer B and Layer C range from about −30 to about 150° C., preferably about 20 to about 90° C. and most preferably about 30 to about 70° C. Typically, the addition of fillers enables the utilization of lower Tg polymers and the addition of plasticizers enables the utilization of higher Tg polymers. The preferred Tg of the dielectric layer itself and of the layers utilized in the dielectric layer, including Layer A, Layer B, and Layer C is about 30 to about 100° C., preferably about 40 to about 85° C. and most preferably about 45 to about 65° C.

Layer A, optional Layer B and Layer C may include additives such as fillers, surfactants, defoamers, dispersants and grinding aids. Numerous surfactants, defoamers, dispersants and grinding aids are available that are suitable for this purpose. Selection will often be based upon observed coating and dispersion quality and the desired adhesion of the dielectric layer to other layers in the thermal transfer process. In certain embodiments, the surfactants comprise siloxy-, fluoryl-, alkyl- and alkynyl-substituted surfactants. These include the Byk® (Byk Chemie), Zonyl® (DuPont), Triton® (Dow), Surfynol® (Air Products) and Dynol® (Air Products) surfactants. Preferred surfactants are Byk® 345, 346 and 348 and Zonyl® FSO and FSN. In certain embodiments, the defoamers comprise alkyl and alkynyl functionality and include Surfynol® defoamers. In certain embodiments, the dispersants comprise functionalized polymers, oligomers and monomers and include Surfynol® and Disperbyk® dispersants.

The preferred thickness of the dielectric layer and of the layers utilized in the dielectric layer, including Layer A, Layer B and Layer C, is about 0.05 to about 10 microns, preferably about 0.1 to about 5 microns, and more preferably about 0.2 to about 3 microns.

Multilayer Thermal Imaging Dielectric Donor

The TFTs of the various embodiments of the invention can be made using a multilayer thermal imaging dielectric donor and the thermal transfer process as disclosed herein. The multilayer thermal imaging dielectric donor comprises: a base film; and a dielectric transfer layer comprising at least one Layer A or Layer C described above, wherein the dielectric transfer layer is characterized by a resistivity of $10^{14}$ ohm-cm or greater. In various forms the thermal imaging donor may include: an LTHC layer interposed between the base film and the dielectric transfer layer; an interlayer interposed between the base film and the dielectric transfer layer; and an interlayer interposed between an LTHC layer and the dielectric transfer layer. In another embodiment, the dielectric transfer layer may further comprise one or more additional dielectric layer(s) comprising Layer B as described above. The additional dielectric layer(s) may be below and/or on top of the dielectric transfer layer. Alternatively, the dielectric layer may also be applied by lamination.

The thermal imaging donor may optionally include other layers known in the art, for example, an antistatic layer may be present adjacent the base film and opposite the transfer layer; a primer layer, ejection layer, and/or an underlayer may be disposed between the base film and the LTHC layer; and an adhesive layer may be disposed adjacent the dielectric transfer layer opposite the base film. Thus, the thermal transfer donor can include an interlayer, primer layer, release layer, ejection layer, thermal insulating layer, underlayer, adhesive layer, humectant layer, and light attenuating layer.

FIG. 1A is a cross-sectional view of thermal imaging donor 100, according to some embodiments of in the invention. Thermal imaging donor 100 comprises a dielectric transfer layer 106 and a base film 102 that provides support to the other layers of thermal imaging donor 100. Base film 102 comprises a flexible polymer film and is preferably transparent. A suitable thickness for base film 102 is about 25 μm to about 200 μm, although thicker or thinner support layers may be used. The base film may be stretched by standard processes known in the art for producing oriented films and one or more other layers, such as the LTHC layer, may be coated onto the base film prior to completion of the stretching process. Preferred base films are selected from the group consisting of: polyethylene terephthalate (PET), triacetyl cellulose, polyethylene naphthalate (PEN), and polyimide with PET being especially preferred.

Light-Attenuating Agent

A light-attenuating agent may be present in a discrete layer or incorporated in one of the other functional layers of the donor element, such as the base film, the LTHC layer or the dielectric transfer layer. In one embodiment, the base film comprises a small amount, typically 0.2% to 0.5% by weight of the base film, of a light-attenuating agent such as a dye which can assist in the focusing of the radiation source onto the radiation-absorber in the LTHC layer during the thermal imaging step, thereby improving the efficiency of the transfer process. U.S. Pat. No. 6,645,681, incorporated herein by reference, describes this and other ways in which the base film may be modified to assist in the focusing of a laser radiation source in which the equipment comprises an imaging laser and a non-imaging laser wherein the non-imaging laser has a light detector that is in communication with the imaging laser. The wavelength ranges at which the imaging and non-imaging laser operate (typically in the range from about 300 nm to about 1500 nm) determine the wavelength ranges in which the absorber(s) and/or diffuser(s) are active and inactive. For example, if the non-imaging laser operates in about the 670 nm region and the imaging laser at 830 nm, it is preferred that the absorber and/or diffuser operate to absorb or diffuse light in the 670 nm region, rather than in the 830 nm region. Herein, the light attenuating agent preferably absorbs or diffuses light in the visible region, and in one embodiment absorbs around 670 nm. Suitable light-attenuating agents are well known in the art and include the commercially available Disperse Blue 60 and Solvent Green 28 dyes and carbon black. Preferably the amount of light-attenuating agent is sufficient to achieve an optical density (OD) of 0.1 or greater at some wavelength of about 400 to about 750 nm, more preferably about 0.3 to about 1.5.

The light-attenuating agent of U.S. Pat. No. 6,645,681 referred to herein above may be incorporated into the dielectric transfer layer instead of, or additionally to, the base film. The nature of this light-attenuating agent will be dependent on the particular laser and printing system that is utilized. Dyes useful as attenuating agents for polymer-based dielectric layers include Oil Blue N and Methylene Blue.

Light to Heat Conversion Layer (LTHC)

Figure 1B:
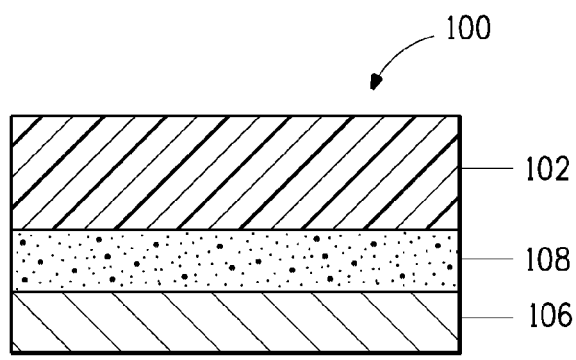

The thermal imaging donor may have a LTHC layer 108, interposed between the base film and the dielectric transfer layer 106 as illustrated in FIG. 1B. The LTHC layer 108 is for radiation-induced thermal transfer, to couple the energy of light radiated from a light-emitting source into the thermal transfer donor. Typically, a radiation absorber in the LTHC layer (or other layers) absorbs light in the infrared, visible, and/or ultraviolet regions of the electromagnetic spectrum and converts the absorbed light into heat. The radiation absorber is typically highly absorptive, providing an optical density (OD) at the wavelength of the imaging radiation of 0.1 to 3 or higher, and preferably from 0.2 to 2. Suitable radiation absorbing materials can include, for example, dyes, pigments, metals, metal compounds, metal films, and other suitable absorbing materials. Suitable radiation absorbers and binders for LTHC layers are well-known in the art and extensive lists and references can be found in PCT/US05/38010; PCT/US05/38009; U.S. Pat. No. 6,228,555 B1; Matsuoka, M., "*Infrared Absorbing Materials*", Plenum Press, New York, 1990; and Matsuoka, M., *Absorption Spectra of Dyes for Diode Lasers*, Bunshin Publishing Co., Tokyo, 1990; which are herein incorporated by reference. Metal radiation absorbers also may be used as LTHC layers, either in the form of particles or as films, as disclosed in U.S. Pat. No. 5,256,506 hereby incorporated by reference. Nickel and chromium are preferred metals for the LTHC layer 108, with chromium being especially preferred. Any other suitable metal for the heating layer can be used.

Figure 2A:
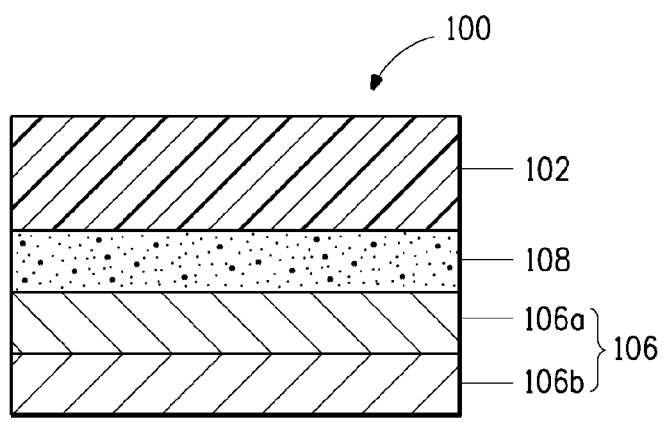
FIG. 2A is a cross-sectional view of a thermal imaging dielectric donor having gradient dyes layers useful in forming TFTs according to one embodiment of the invention.

A preferred donor useful in various embodiments is wherein the dielectric transfer layer comprises two or more Layers A that are gradient dye layers as described above. FIG. 2A illustrates this embodiment, wherein dielectric layers 106A and 106B are gradient dye layers.

Figure 2B:
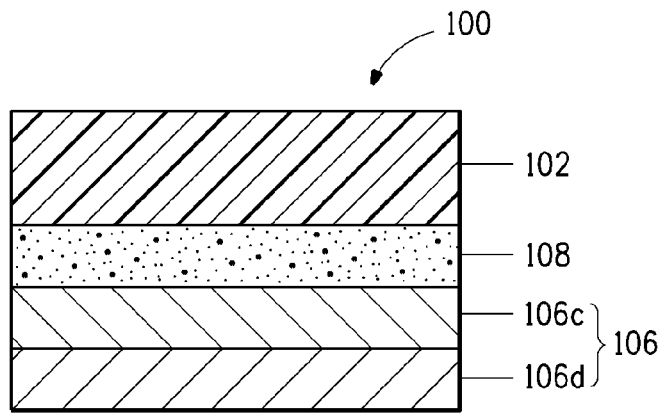
FIG. 2B is a cross-sectional view of a thermal imaging dielectric donor having gradient nanoparticle layers useful in forming TFTs according to one embodiment of the invention.

Another preferred donor useful in various embodiments is wherein the dielectric transfer layer comprises two or more Layers A that are gradient nanoparticle layers, as described above. FIG. 2B illustrates this embodiment, wherein dielectric layers 106C and 106D, are each gradient nanoparticle layers.

Another preferred donor useful in various embodiments is wherein the dielectric transfer layer comprises two or more layers of material that are gradient layers with respect to both near-IR dye loading and high κ nanoparticle fraction, within the limits described above.

Another preferred donor useful in various embodiments includes a dielectric transfer layer comprising one or more Layer(s) A and one or more Layer(s) B.

The multilayer thermal imaging dielectric donor(s) can be prepared by dispersing and/or dissolving the dielectric polymer(s), near-IR dye(s) and, optionally, the high κ nanoparticle fraction, in a suitable volatile carrier fluid to provide a solution or suspension; and coating the solution or suspension onto a suitable substrate and removing the carrier fluid. Typically the volatile carrier fluid is water, an organic solvent, a gaseous material, or some combination thereof, and is chosen to be compatible with the various components of the composition. Examples include water, lower alcohols such as ethanol, aliphatic and aromatic hydrocarbons such as hexane, cyclohexane and xylenes; ethers such as dibutyl ether; ether alcohols such as 2-methoxyethanol; esters such as butyl acetate; and aliphatic and aromatic halocarbons such as 1,2-dichloroethane. Lower molecular weight oligomers and small molecules useful as processing aids, including the dispersants and surfactants listed above, may be present in the compositions. Applying the solution or suspension can be accomplished by any method that gives a uniform layer, or if desired, a patterned or non-uniform layer. Coating, including rod-coating, extrusion coating, gravure coating and spin-coating, spraying, printing, blading or knifing can be used. Coating and spraying are preferred methods. Many commercial coating machines, devices such as a coating rod and knife blade, and printing machines can be used to apply the solution or suspension. The carrier fluid is allowed to evaporate to provide the dielectric layer. The dielectric layer can be dried by any conventional method of drying including applying heat and vacuum.

Metal Compositions

Another embodiment of the invention is a TFT wherein at least one of the gate, source or drain electrodes, comprises a metal composition (A) comprising:

(1) about 65 to about 95 wt %, based on the total weight of the metal composition, of a metal powder selected from the group: Ag, Cu and alloys thereof; comprising a plurality of metal particles having an average longest dimension of about 5 nm to about 1500 nm; and (2) about 5 to about 35 wt % of a dispersant comprising one or more resins selected from the group consisting of: conducting polymers selected from the group consisting of: polyaniline, polythiophene, polypyrrole, polyheteroaromatic vinylenes, and their derivatives; and nonconducting polymers selected from the group consisting of: acrylic and styrenic-acrylic latexes, and solution-based acrylics and styrenic-acrylic (co)polymers, and combinations thereof; copolymers of ethylene with one or more monomers selected from the group consisting of: (meth)acrylate(s), vinyl acetate, carbon monoxide and (meth)acrylic acid; polyvinylacetate and its copolymers.

Preferably the metal composition (A) comprises about 85 to about 95% metal powder, and preferably with an average particle size of between 100 nm and about 400 nm. In one preferred embodiment the metal powder is silver metal flake, with an average equivalent spherical diameter of about 100 to about 900 nm. In various embodiments the metal composition (A) comprises 96 wt % or greater, and preferably 98 wt % or greater, of components (1) and (2) as stated above. In another aspect the metal composition (A) consists essentially of the components (1) and (2) as stated above. The metal composition (A), relative to conventional compositions, has a high loading of metal particles and provides conducting layers without the need for firing or burning-off of polymer binders.

Silver is a preferred metal powder for the compositions. The metal powders are readily available from several commercial sources including: Ferro Corp., Electronic Materials Systems, South Plainfield, N.J.; Nanostructured & Amorphous Materials, Houston, Tex.; Inframat® Advanced Materials, Farmington, Conn.; Sumitomo Metal Mining Co., Ltd., Tokyo, Japan; and Mitsui Mining and Smelting Co., Ltd., Tokyo, Japan.

"Dispersant" refers to non-volatile organic or inorganic material that is used as a carrier or matrix medium in the metal composition (A). The dispersant includes one or more of the following components: polymers, oligomers, surface treatments, plasticizers, processing aids such as defoamers, surfactants, stabilizers, coating aids, pigments, dyes including near infrared dyes, and the like. The dispersant has several functions including: allowing the dispersion of the metal particles so they are evenly distributed and applied as conducting layers; and contributing to the transfer properties, most notably the relative adhesion of the metal transfer layers to the donor element and the thermal imaging receiver in the thermal transfer process. The dispersant also may contribute to the functional properties of the transfer layers. For instance, the dispersant may be a conducting polymer.

The properties of the dispersant refer to the bulk properties of the fully formulated dispersant formulations, unless specifically noted. Preferred dispersants are polymers having a Tg of about −30° C. to about 90° C., and more preferably, about 30° C. to about 70° C.

Polymers useful as dispersants in metal composition (A) include conducting organic polymers and doped versions of these polymers, e.g., polyaniline, polythiophene, polypyrrole, polyheteroaromatic vinylene, polyfuran, poly(para-phenylene), poly(phenylenevinylene), polyisothianaphthene, polyparaphenylene sulphide, and their derivatives. Preferred derivatives fall in one or more of the following categories: (a) stable conducting polymers such as polyaniline (PANI) and polyethylene dioxythiophene (PEDOT); (b) soluble or dispersible conducting polymers that form films using standard coating techniques, including PANI, PEDOT; and other alkyl- or alkoxy-substituted derivatives of conducting polymers such as poly(2,5 dialkoxy)paraphenylene vinylene and poly(3-hexyl)thiophene); and (c) conducting polymers that give high conductivity upon doping. Preferred conducting polymers are selected from the group consisting of: polyaniline; polythiophene; polypyrrole; polyheteroaromatic vinylenes; and their derivatives; preferably at a level of 1 to about 5 wt % based on the dry weight of metal composition (A).

Further polymers useful as dispersants in metal composition (A) are those defined earlier for dielectric layers, including Layer A and Layer B. Preferred are polymers selected from the group consisting of: acrylic and styrenic-acrylic latex and solution-based acrylic and styrenic-acrylic (co) polymers including random and graft copolymers; and combinations thereof; ethylene copolymers with one or more monomers selected from the group consisting of: (meth)acrylates, vinyl acetate, carbon monoxide and (meth)acrylic acid; polyvinylacetate and its copolymers; and polyvinylpyrrolidone and its copolymers including polyvinylpyrrolidone-co-vinyl acetate. Preferably the solvent-soluble polymers within the group are characterized by a $M_W$ of about 10,000 to about 200,000.

The dispersant may comprise up to about 10 wt %, based on the total weight of the dispersant, of one or more resin additives selected from the group of: pigments, dyes and conducting particles selected from the group: carbon black, carbon nanotubes, and modifying metal and metal alloy powders. Preferred modifying metals are Au and Pd. A preferred composition comprises 0.5 wt % to about 10 wt %, based on the total weight of the dispersant, of the conducting additive with an average particle size greater than 5 nm and less than about 1500 nm. The most preferred conducting additives are carbon black and carbon nanotubes. In another embodiment preferred additives are near-infrared dyes and more preferably, are cyanine compounds selected from the group: indocyanines, phthalocyanines including polysubstituted phthalocyanines and metal-containing phthalocyanines, and merocyanines.

Lower molecular weight oligomers and small molecules useful as processing aids in the dispersant include surfactants, for instance, those comprising siloxy-, fluoryl-, alkyl- and alkynyl-substituted surfactants. These include the Byk® (Byk Chemie), Zonyl® (DuPont), Triton® (Dow) Surfynol® (Air Products) and Dynol® (Air Products) surfactants. Preferred surfactants are Triton® X-114, Disperbyk® 163, Byk® 345, 346 and 348 and Zonyl® FSA, FSO and FSN.

The metal composition (A) is typically prepared by mixing metal powder and the dispersant with a volatile carrier fluid to provide a fluid dispersion. Typically the volatile carrier fluid is water, an organic solvent, a gaseous material, or some combination thereof. The volatile carrier fluid is chosen to be compatible with the metal particles and any optional dispersant that is used. Examples of volatile carrier fluids include water, lower alcohols such as ethanol, aliphatic and aromatic hydrocarbons such as hexane, cyclohexane and xylenes;

ethers such as dibutyl ether; ether alcohols such as 2-methoxyethanol; esters such as butyl acetate; and aliphatic and aromatic halocarbons such as 1,2-dichloroethane.

Thermal imaging metal donors are useful in making TFTs of various embodiments. In various embodiments the thermal imaging metal donor comprises, in layered sequence, a base film, and optional LTHC layer, a metal transfer layer comprising the metal composition (A) and an optional protective strippable cover layer. Other embodiments can include one or more additional transfer layers interposed between the base film and the metal transfer layer, herein defined as below the metal transfer layer; and/or on a side of the metal transfer layer opposite said base film, herein defined as above the metal transfer layer. One or more other conventional thermal transfer donor element layers can be included in the thermal imaging metal donor useful in the present invention, including but not limited to an interlayer, primer layer, release layer, ejection layer, thermal insulating layer, underlayer, adhesive layer, humectant layer, and light attenuating layer.

Figure 3A:
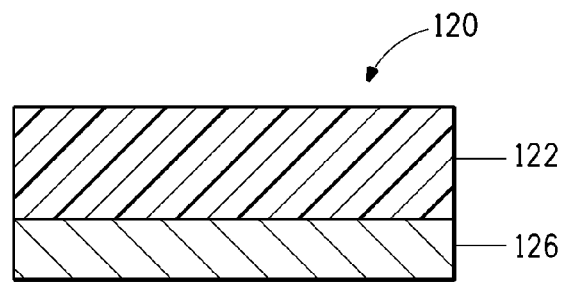
FIGS. 3A and 3B are cross-sectional views of thermal imaging metal donors useful in forming TFTs according to one embodiment of the invention.
Figure 3B:
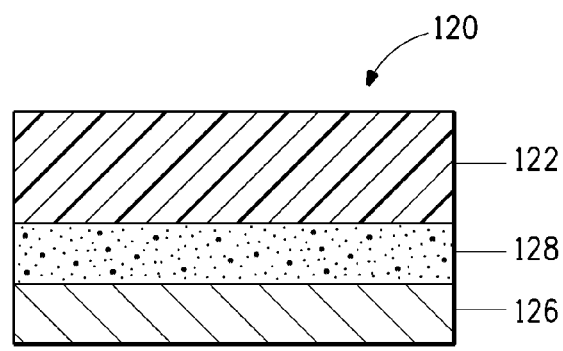

FIG. 3A is a cross-sectional view of thermal imaging metal donor 120, useful in preparing TFTs, comprising a base film 122 and a metal transfer layer 126 comprising the metal composition (A) dispersed on the surface of the base film. Base film 122 can be the same as described above. The thermal imaging metal donor may have a LTHC layer 128, as described above, interposed between the base film and the metal transfer layer 126, as illustrated in FIG. 3B. The thermal imaging metal donor(s) can be prepared by methods similar to those described for the dielectric donors, using the metal composition (A) fluid dispersion described above.

Thermal Transfer Processing

The thermal imaging donors comprising dielectric transfer layers or metal transfer layers described above are useful in formation of TFTs using a dry thermal transfer process. To use a thermal imaging donor, the donor is contacted with a thermal imaging receiver. By contacted is meant that the donor is in close proximity, preferably within several microns, of the thermal imaging receiver. The receiver may be off-set from the donor by, for example, previously printed layers, fibers or particles that act as spacers to provide a controlled gap between donor and receiver. Vacuum and/or pressure can be used to hold the donor element 100 or 120 and the receiver element 200 together. As one alternative, the donor element 100 or 120 and the receiver element 200 can be held together by fusion of layers at the periphery of the assembly.

In transferring metal layers or dielectric layers, at least a portion of the metal or dielectric transfer layer, and optionally, a portion of one or more additional transfer layers, is transferred to the thermal imaging receiver by thermal transfer to form a patterned layer. Thermal transfer can be achieved by a laser-mediated transfer process. In one embodiment, the assembly of the donor element 100 or 120 and the receiver element 200 is selectively exposed to heat, which is preferably in the form of laser radiation, in an exposure pattern of the image of the desired pattern to be formed on the receiver element. The laser radiation is focused about at the interface between those layers to be transferred and those to remain with the donor. For instance, if an LTHC layer is present the laser is focused at the LTHC layer. Sufficient radiation is applied to achieve transfer of the desired transfer layers to the receiver.

A variety of light-emitting sources can be used to heat the thermal transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Other light sources and irradiation conditions can be suitable based on, among other things, the donor element construction, the transfer layer material, the mode of thermal transfer, and other such factors.

The radiation is preferably applied through the backside of base film 102 or 122, that is, the side not containing the transfer layer. Laser radiation is preferably provided at a laser fluence of up to about 600 mJ/cm$^2$, more preferably about 75-440 mJ/cm$^2$. Various types of lasers can be used. The laser preferably emits in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, CA.). Other types of lasers and lasers, which emit in other wavelength bands, may be used as well. One device used for applying an image to the receiver is the Creo Spectrum Trendsetter® 3244F, which utilizes lasers emitting near 830 nm. This device utilizes a Spatial Light Modulator to split and modulate the 5-50 Watt output from the ~830 nm laser diode array. Associated optics focus this light onto the imageable elements. This produces 0.1 to 30 Watts of imaging light on the donor element, focused to an array of 50 to 240 individual beams, each with 10-200 mW of light in approximately 10×10 to 2×10 micron spots. Similar exposure can be obtained with individual lasers per spot, such as disclosed in U.S. Pat. No. 4,743,091. In this case each laser emits 50-300 mW of electrically modulated light at 780-870 nm. Other options include fiber-coupled lasers emitting 500-3000 mW and each individually modulated and focused on the media. Such a laser can be obtained from Opto Power in Tucson, Ariz.

Figure 4A:
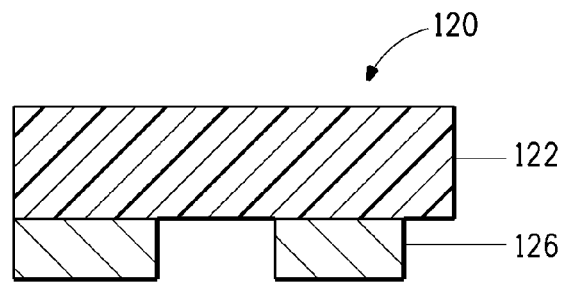
FIGS. 4A and 4B are cross-sectional views of the untransferred portions of a patterned metal donor element 120 and transferred portions of the patterned metal transfer layer on a receiver element 200, respectively.
Figure 4B:
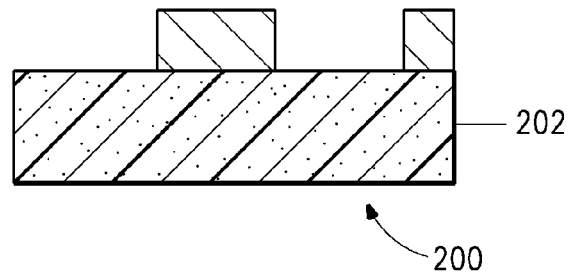

After exposure, the donor element 120 and the receiver element 200 are separated, as illustrated in FIGS. 4A and 4B, leaving the untransferred portions of the patterned metal transfer layer 126 on the donor element 120 and the transferred portions of the patterned metal transfer layer 126 on the receiver element 200.

In some instances, depending upon the nature of the donor and receiver elements and the transfer processing parameters, when the donor element and the receiver element are separated after thermal transfer, the receiver element includes both exposed portions and some non-exposed portions of one or more transfer layers. A useful process for improving a thermally transferred pattern on a thermal transfer receiver, wherein the thermal transfer receiver comprises a surface having an exposed portion and a non-exposed portion, of one or more thermally transferred layers, comprises: (a) contacting the surface with an adhesive layer for a contact period to provide a laminate; (b) separating said adhesive layer from the laminate to provide a treated thermal transfer receiver having a surface substantially free of said non-exposed portion of one or more thermally transferred layers.

Non-exposed portions of one or more thermally transferred layers can be in the form of peel defects, defined herein as non-exposed portions of an imaged layer that are transferred onto the receiver along with the exposed portion of the layer. These peel defects are typically relatively weakly adhered to the receiver as compared to the exposed portions of the image. Minimization and absence of these peel defects can be achieved by optimization of donor formulations, tuning of donor drying times and temperatures, control of the temperature and relative humidity of the printing room, and by selection of the receiver and tuning of its surface through various surface treatments. The peel defects can often be selectively removed by brief contact with an adhesive surface. Contact periods are about from 0.01 seconds to minutes, preferably 1 second to 10 minutes, more preferably 1-90 seconds. Preferred adhesive surfaces include polymer- and metal-coated surfaces. Examples of such adhesive surfaces are Scotch® tape (3M Company), a tacky roller such as a medium tack Dust Removal System-1 roller (Systems Division, Inc., Irvine Calif.), the dielectric donor and receiver substrates reported herein, most preferably the acrylic latex-based donor and receiver substrates, and the LTHC layer donor substrates reported herein, preferably the metallized LTHC donor substrates.

Either or both of the spent donor element (a negative of the image) and the imaged receiver element (a positive of the image) may be useful as a functional object in construction of a TFT of the invention. Furthermore, either or both of the spent donor element and the imaged receiver element may be utilized as a permanent substrate or the image may be transferred from the spent donor or receiver, preferably by lamination, to the permanent substrate.

Semiconductors

The patterned semiconductor layer for the various embodiments of the invention can include a variety of semiconductor materials. Suitable semiconductors include pentacene, sexithiophene, tetracene, polythieneylenevinylene, thiophene oligomers, benzothiophene dimers, and polyacetylenes. A preferred semiconductor layer for the various embodiments of the invention is pentacene. Other preferred semiconductor materials useful in various embodiments of the invention include compounds of Formula (III):

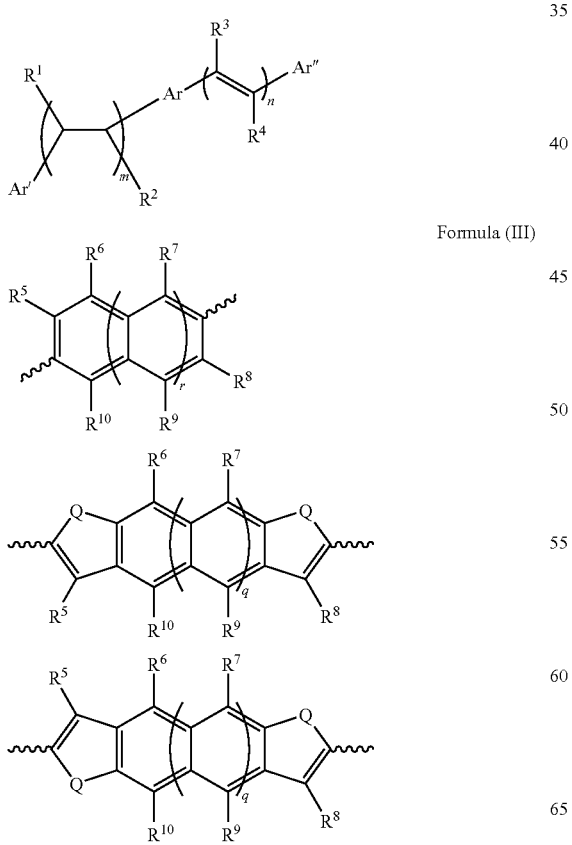

Formula (III)

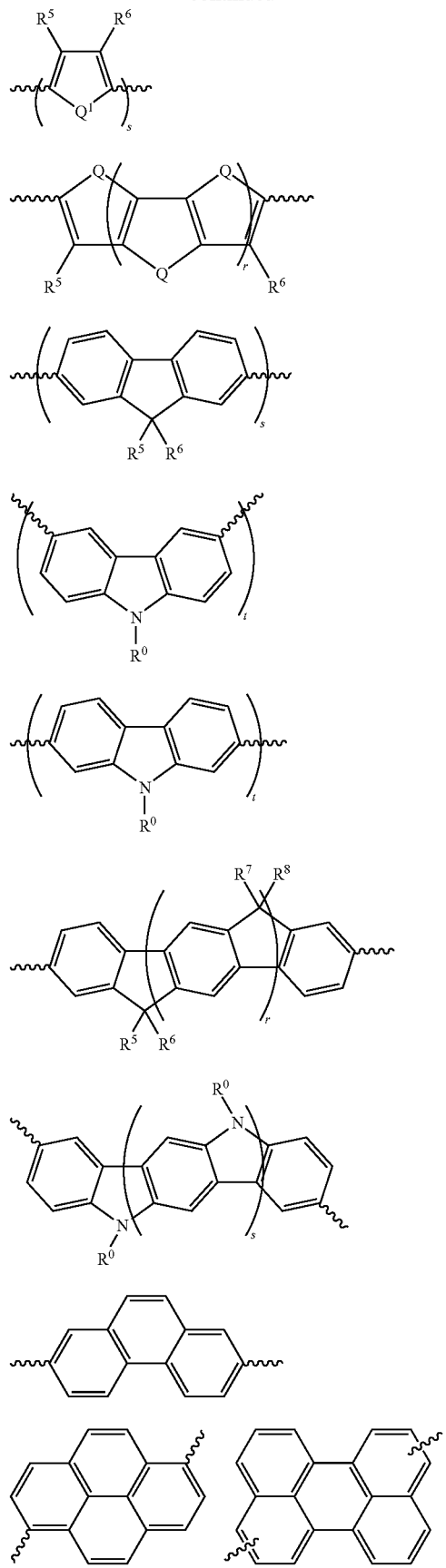

-continued

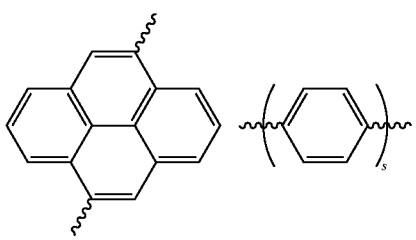

wherein Ar is selected from the group consisting of:
and combinations thereof,
wherein:
  Ar' and Ar" are selected independently from the group consisting of aryl groups;
  m and n are integers each independently having a value of from 0 to 5;
  Q is selected from the group consisting of S, Se, Te, O, and NR⁰;
  Q¹ is selected from the group consisting of Se, Te, O, and NR⁰;
  q and r are selected independently from the group consisting of 0, 1, 2, 3, 4, and 5;
  s is an integer having a value of from 1 to 5;
  t is an integer having a value of from 2 to 5;
  R⁰ is selected from the group consisting of hydrogen, alkyl, and aryl;
  R¹ through R¹⁰ are selected independently from the group consisting of hydrogen, alkyl, aryl, halogen, hydroxyl, aryloxy, alkoxy, alkenyl, alkynyl, amino, alkylthio, phosphino, silyl, —COR, —COOR, —PO₃R₂, —OPO₃R₂, and CN; and
  R is selected from the group consisting of hydrogen, alkyl, aryl, alkenyl, and alkynyl;
  wherein any two adjacent groups, R⁵ through R¹⁰ can be taken together to form a ring.

Other preferred embodiments, independent, or present with one or more other embodiments, include semiconductors wherein r≠0, and s≠1; wherein Ar is selected from the group consisting of:

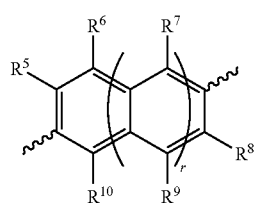

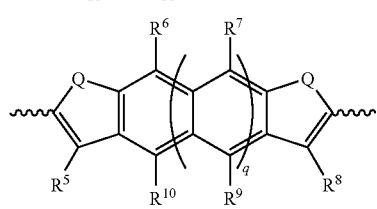

-continued

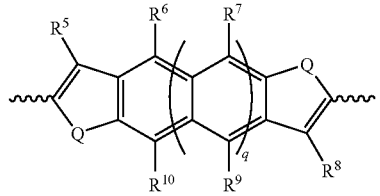

and combinations thereof, wherein r≠0; and, semiconductors wherein Ar is

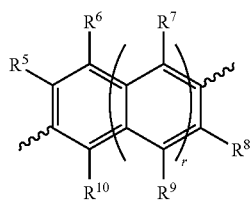

wherein r=2 or 3 and m and n=1.

Another preferred embodiment includes semiconductor compounds wherein Ar is

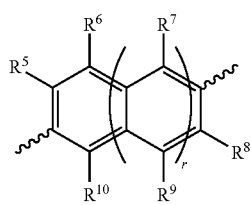

wherein r=2, m and n=0, and Ar' and Ar" are independently

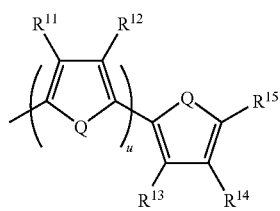

wherein u is an integer selected independently from 0 to 10; Q is selected from the group consisting of S, Se, Te, O, and NR⁰; R¹¹ through R¹⁵ are selected independently from the group consisting of hydrogen, alkyl, aryl, halogen, hydroxyl, aryloxy, alkoxy, alkenyl, alkynyl, amino, alkylthio, phosphino, silyl, —COR, —COOR, —PO₃R₂, —OPO₃R₂, and CN; and
  R is selected from the group consisting of hydrogen, alkyl, aryl, alkenyl, and alkynyl; wherein any two adjacent groups, R¹¹ through R¹⁵ can be taken together to form a ring.

Specific semiconductor compounds preferred in the TFTs include Compounds 1-84:

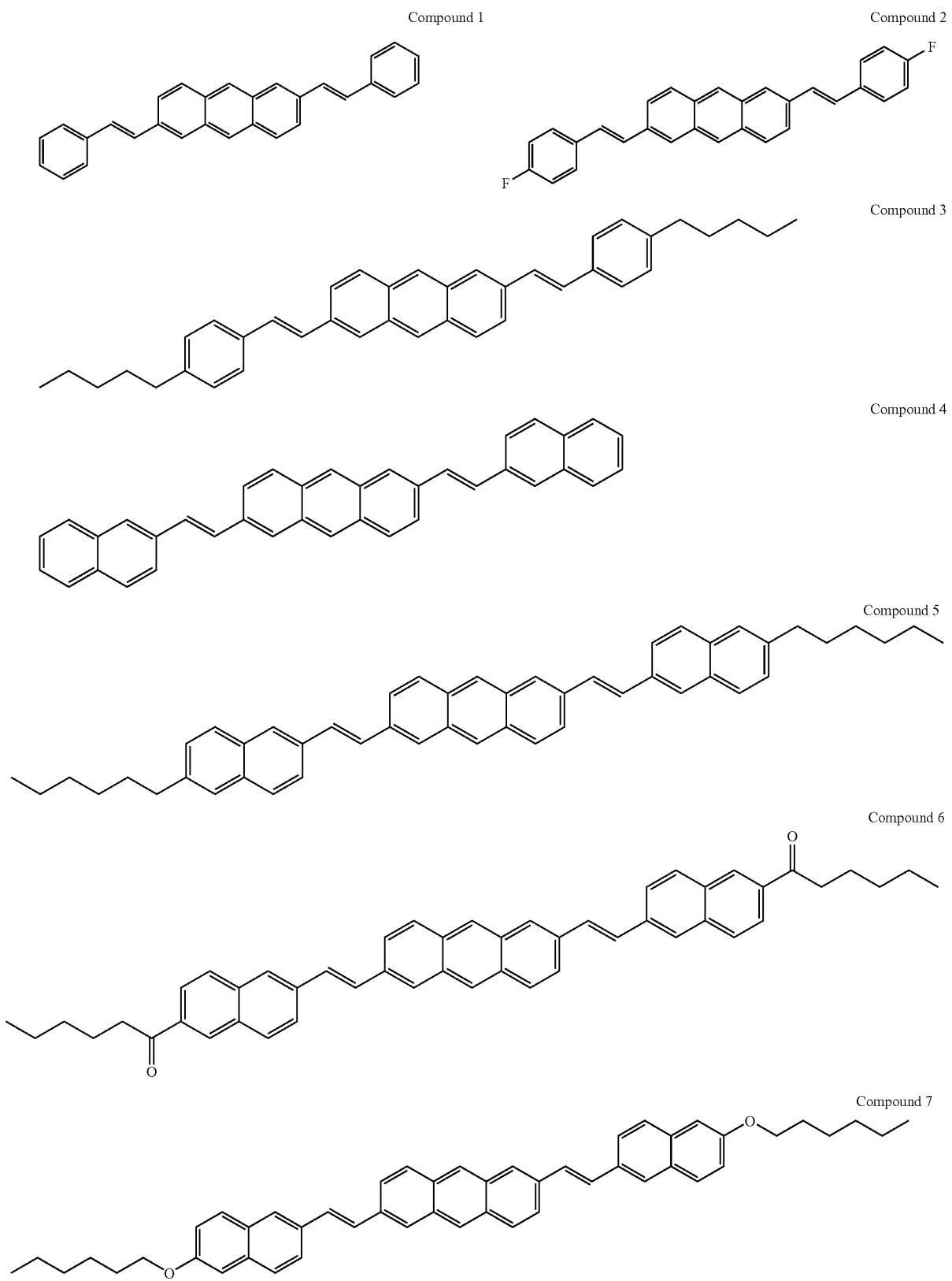

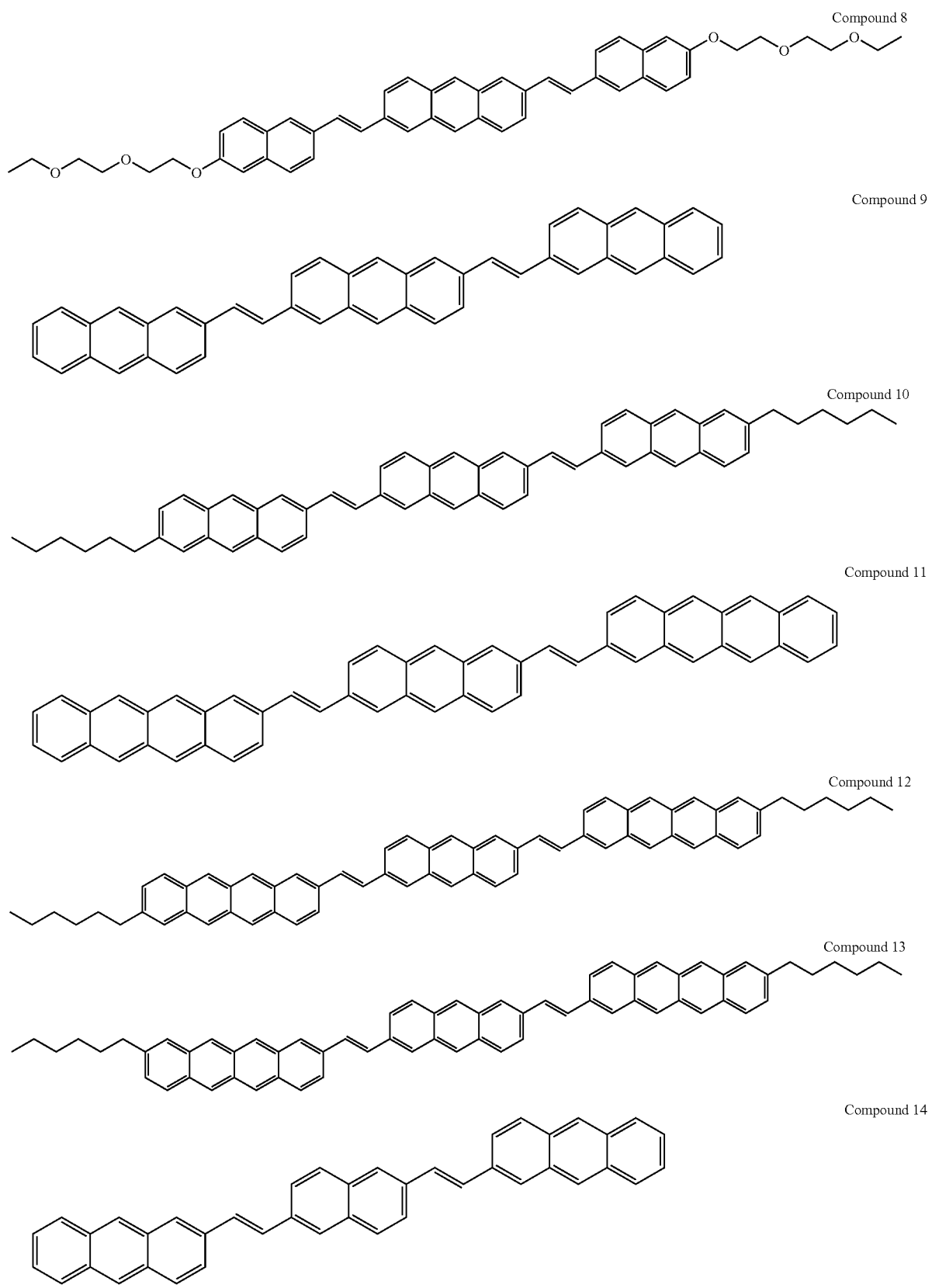

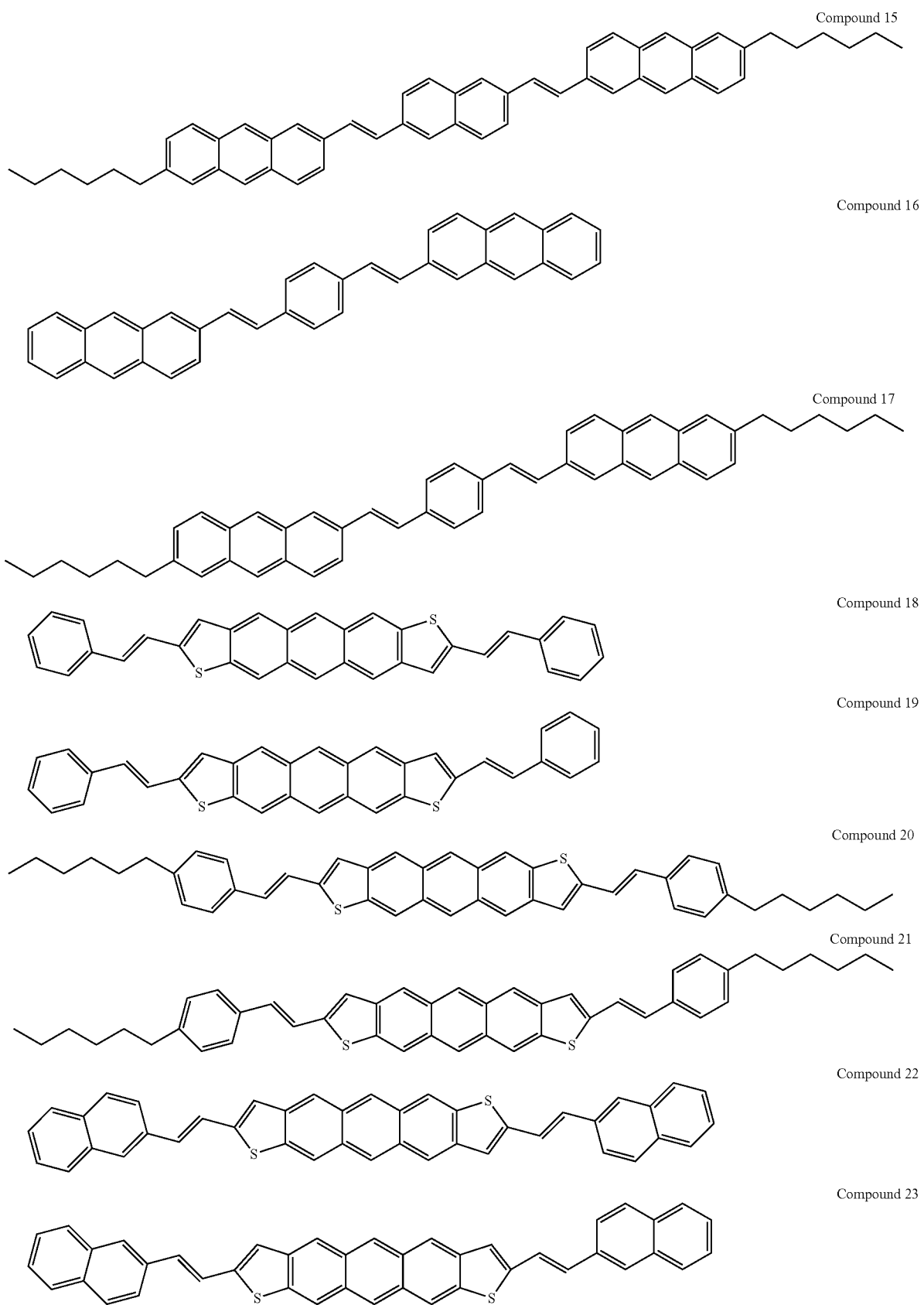

-continued
Compound 24
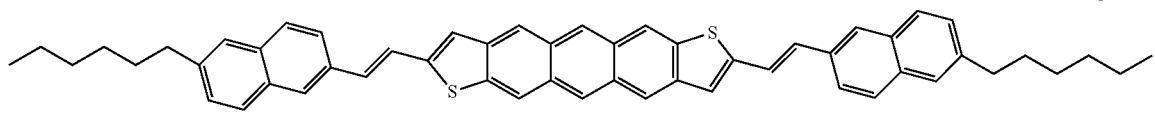
Compound 25
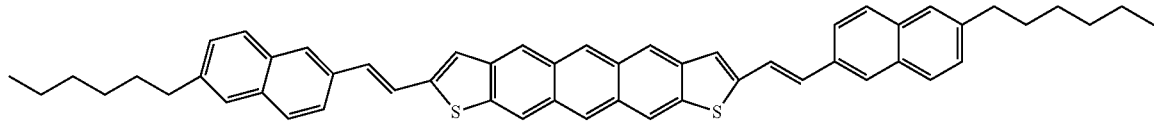
Compound 26
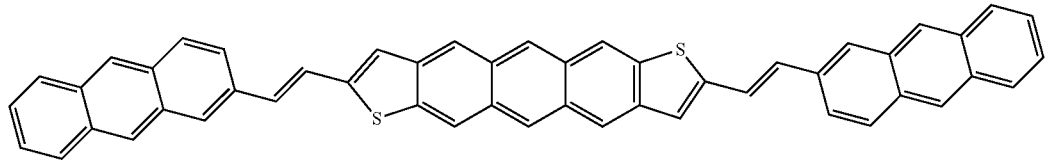
Compound 27
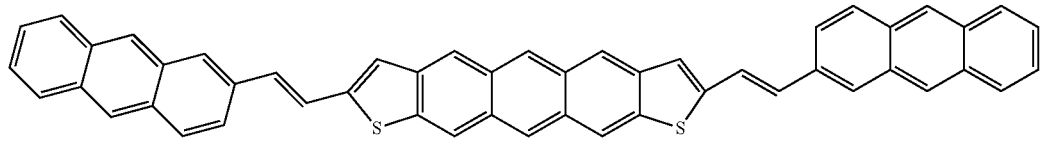
Compound 28
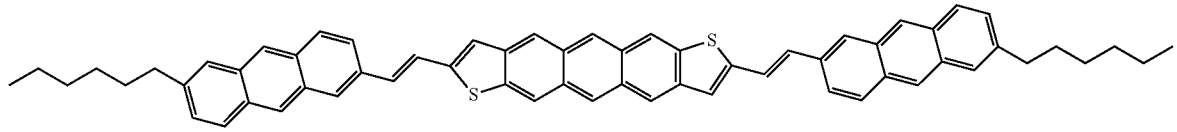
Compound 29
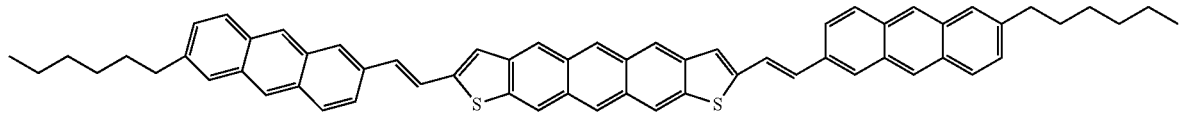
Compound 30
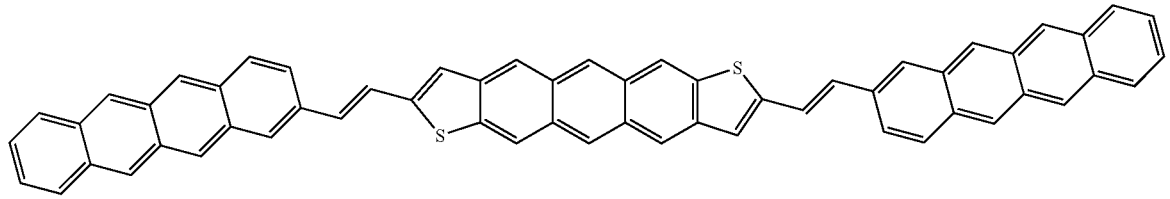
Compound 31
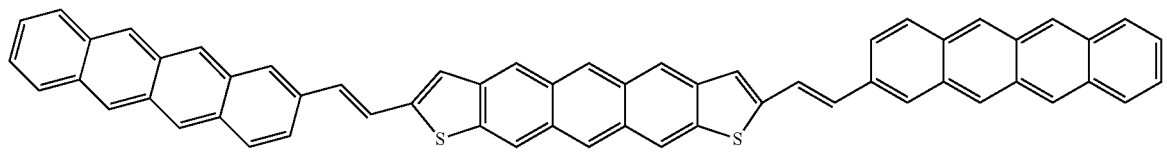
Compound 32
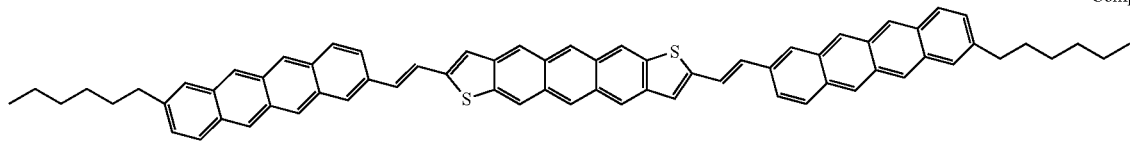
Compound 33
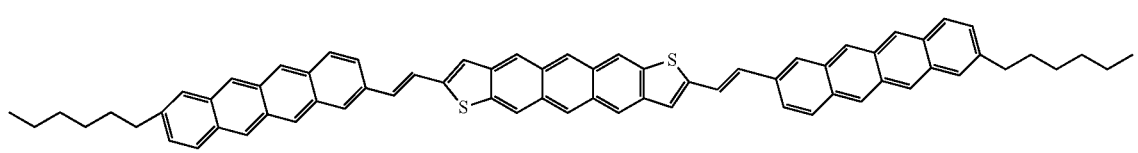

-continued
Compound 34
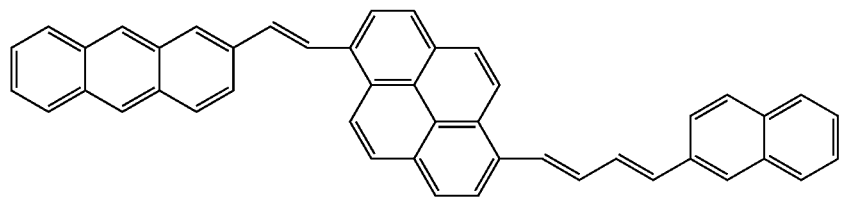
Compound 35
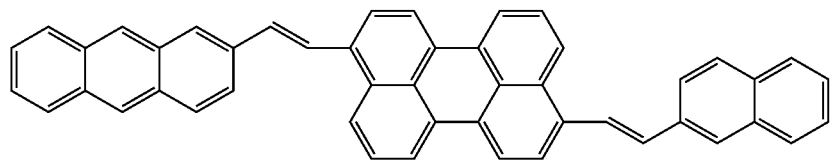
Compound 36
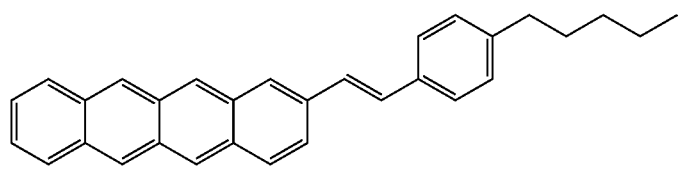
Compound 37
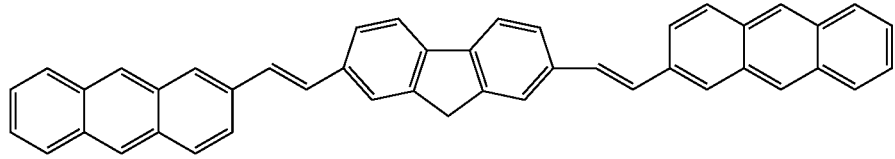
Compound 38
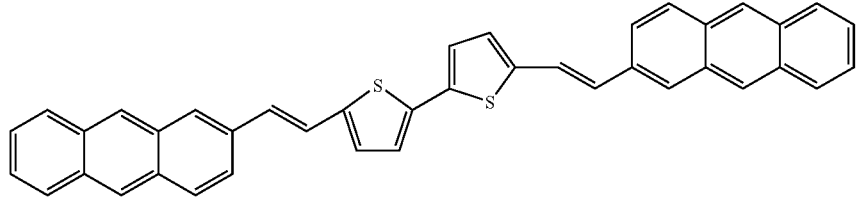
Compound 39
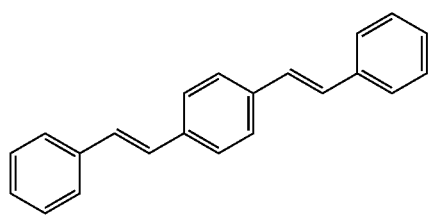
Compound 40
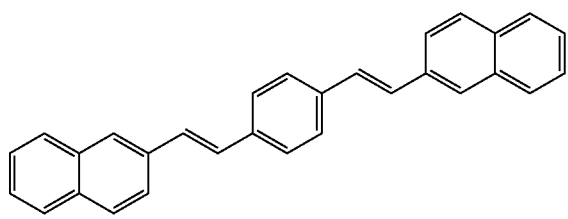
Compound 41
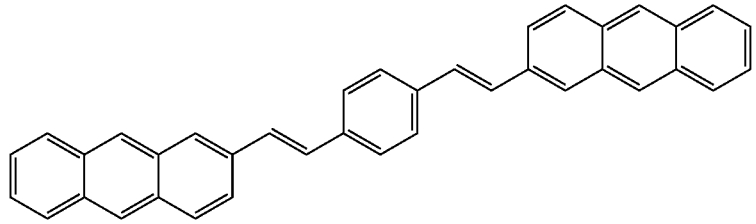
Compound 42
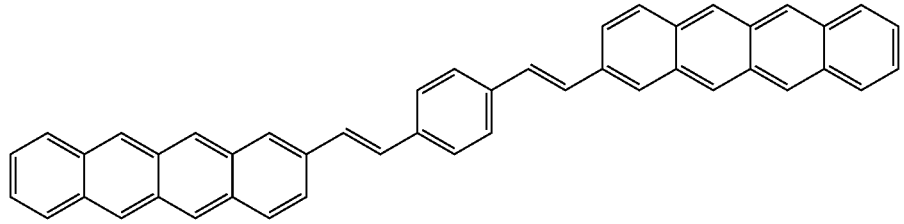

Compound 42
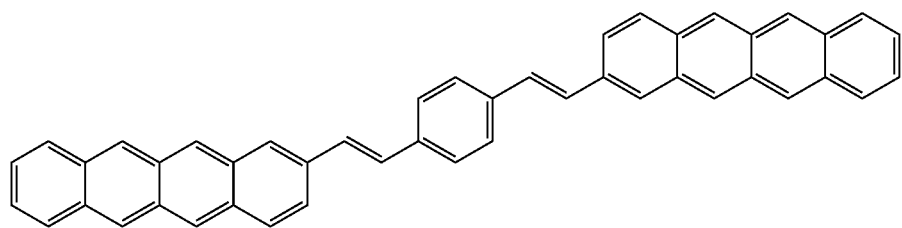
Compound 43
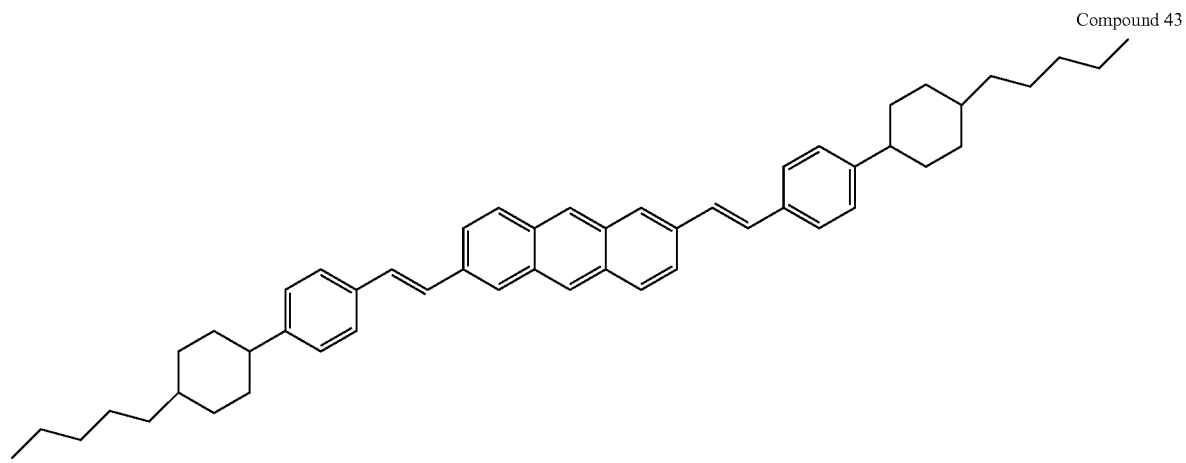
Compound 44
Compound 45
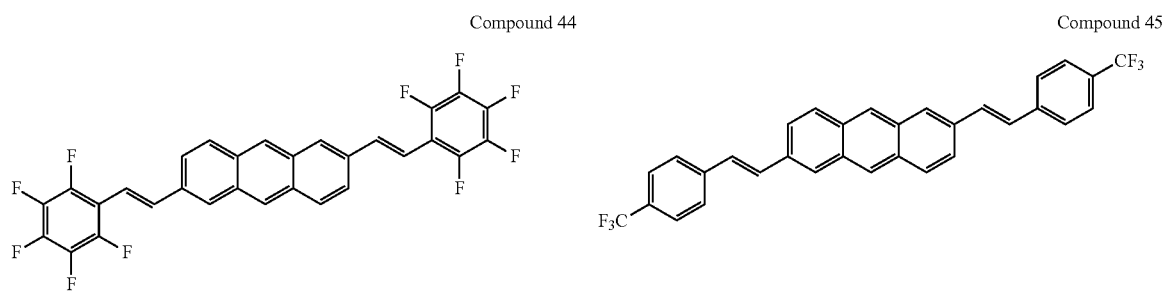
Compound 46
Compound 47
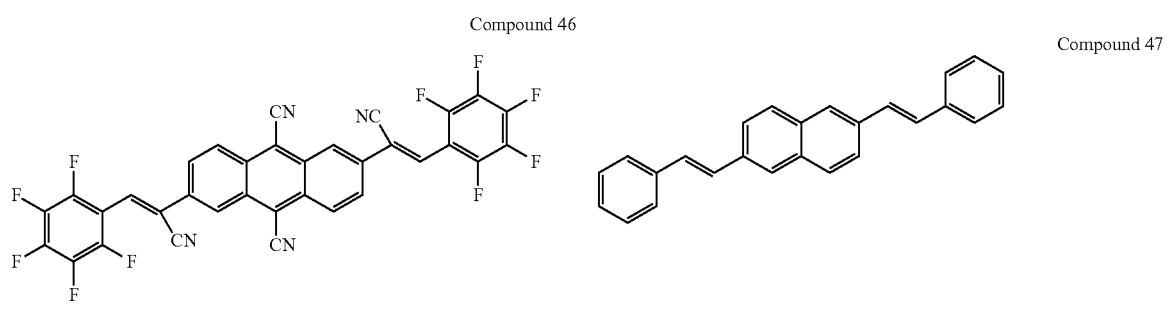
Compound 48
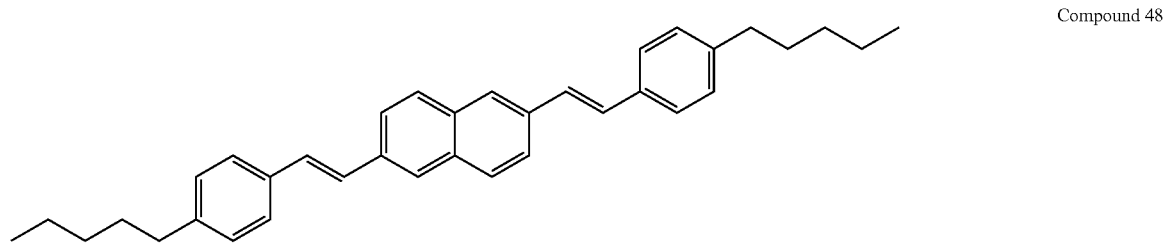

-continued
Compound 49
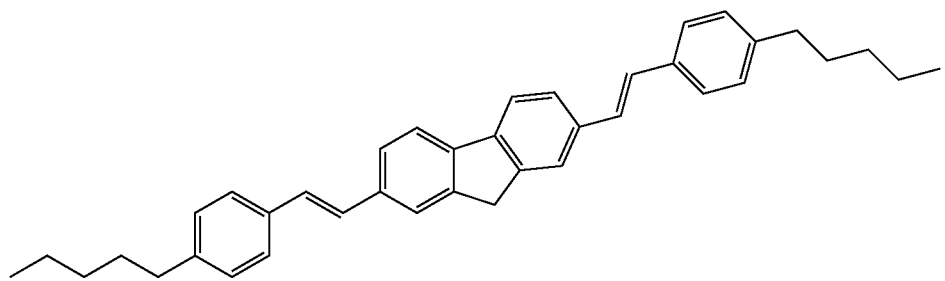
Compound 50
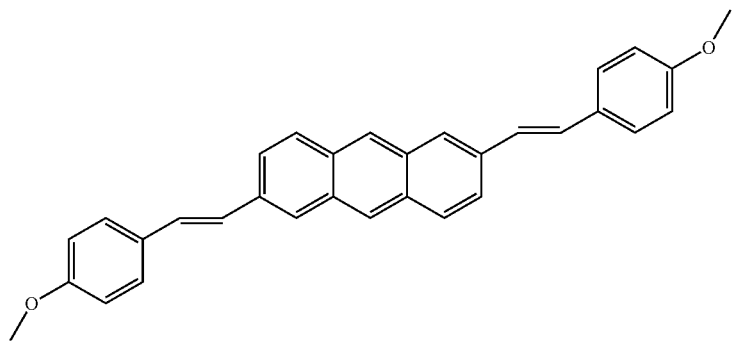
Compound 51
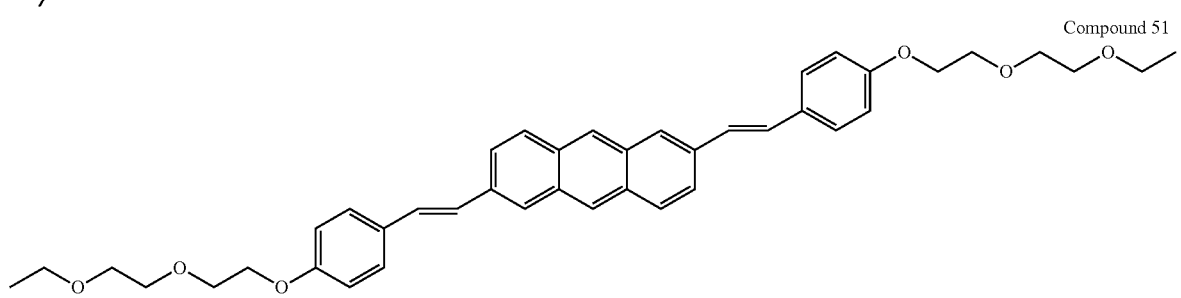
Compound 52
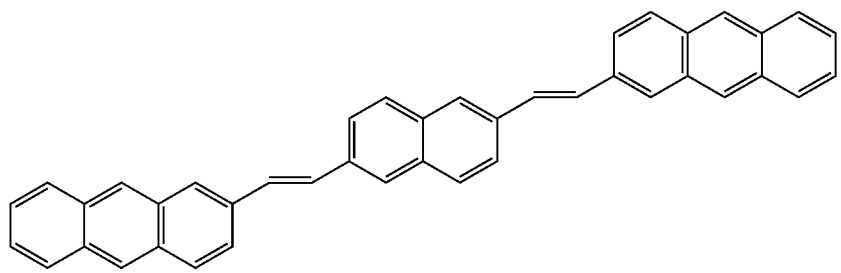
Compound 53
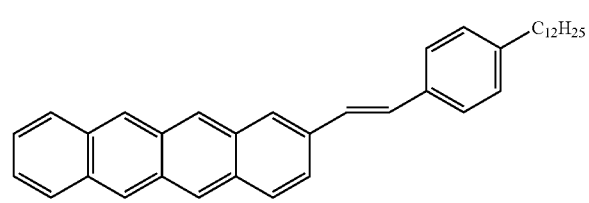
Compound 54
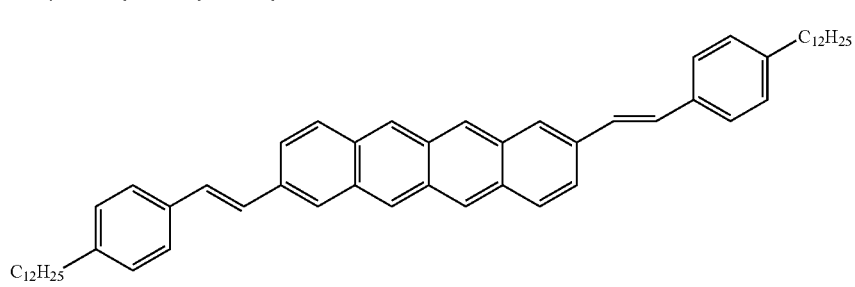

-continued
Compound 55
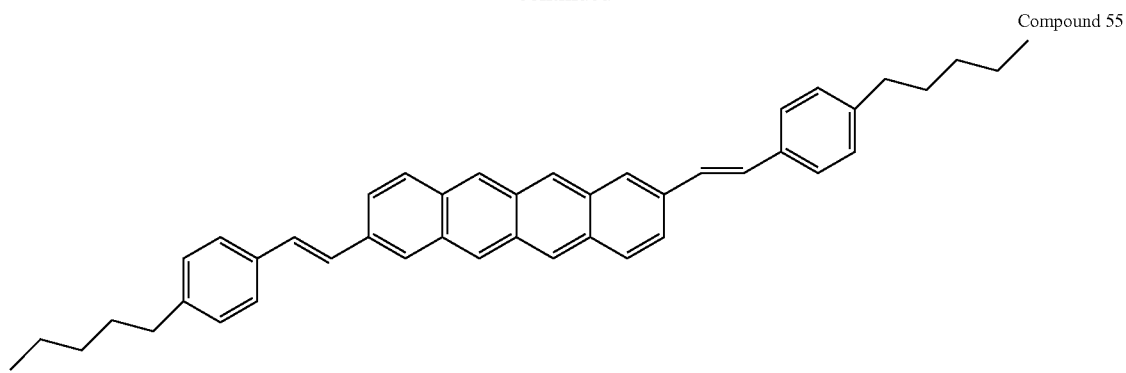
Compound 56
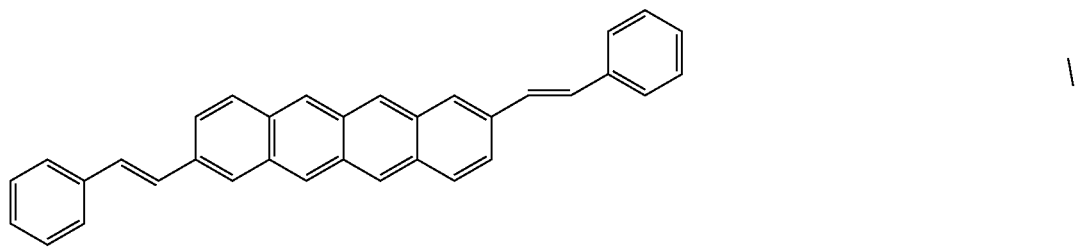
Compound 57
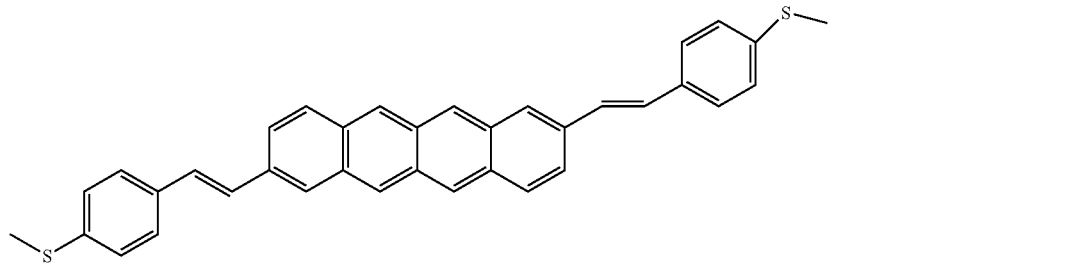
Compound 58
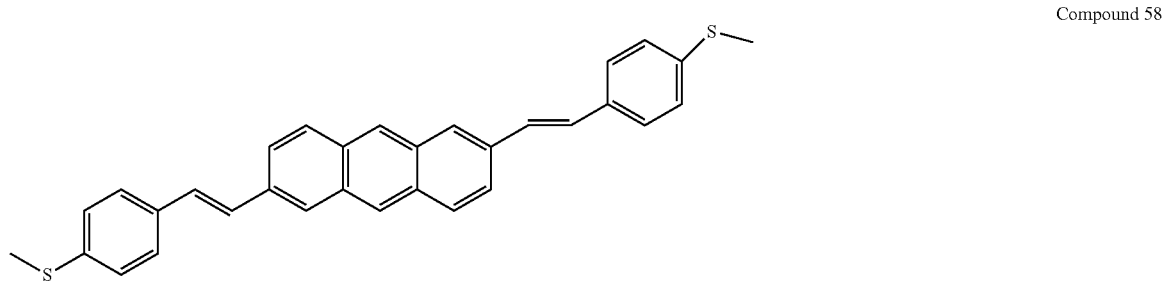
Compound 59
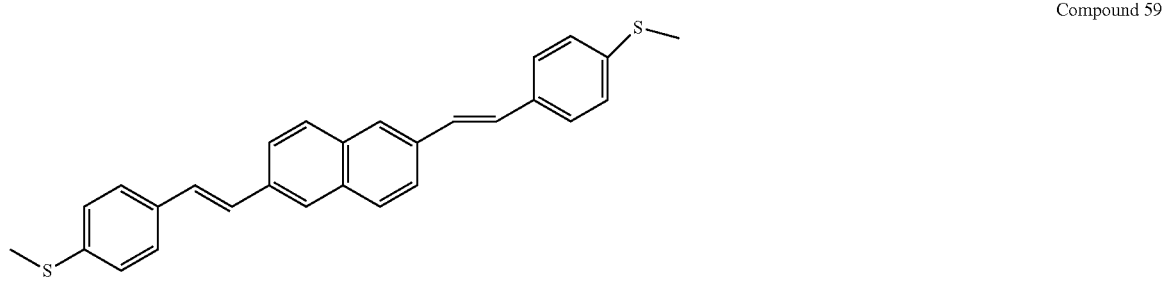

Compound 60
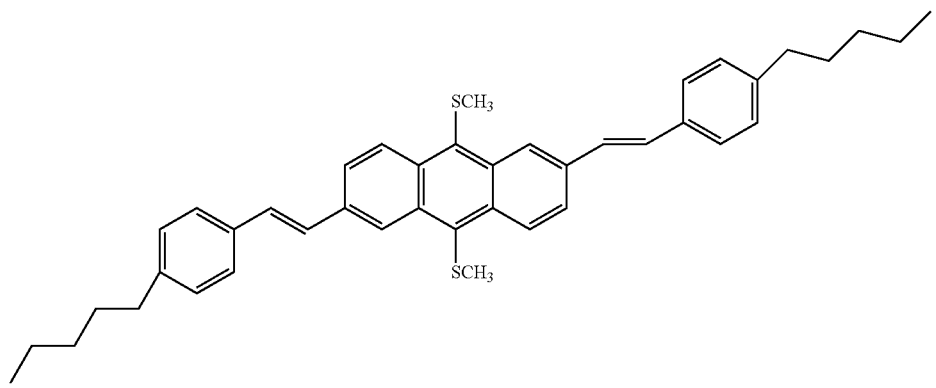
Compound 61
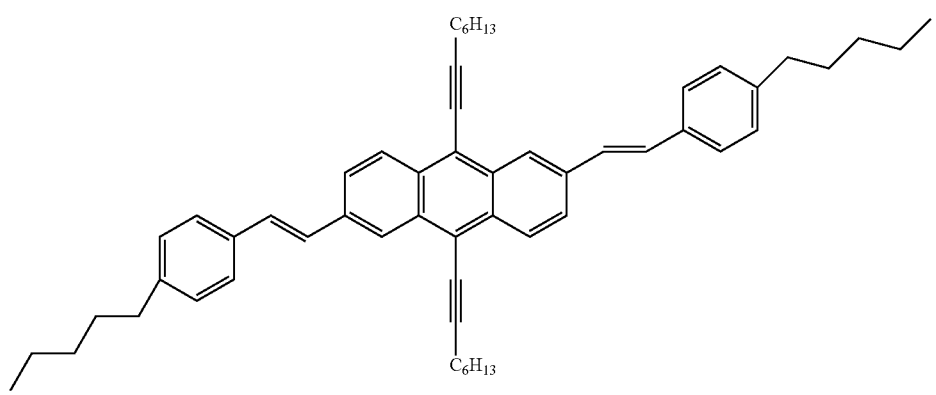
Compound 62
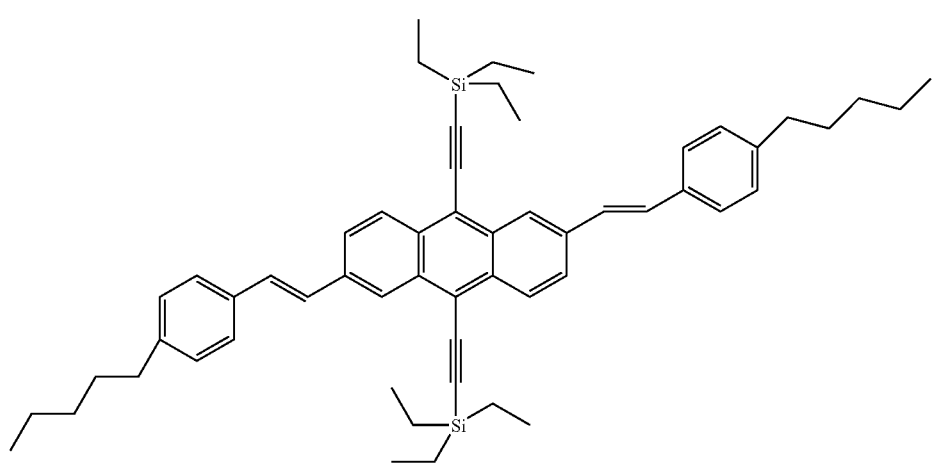

-continued
Compound 63
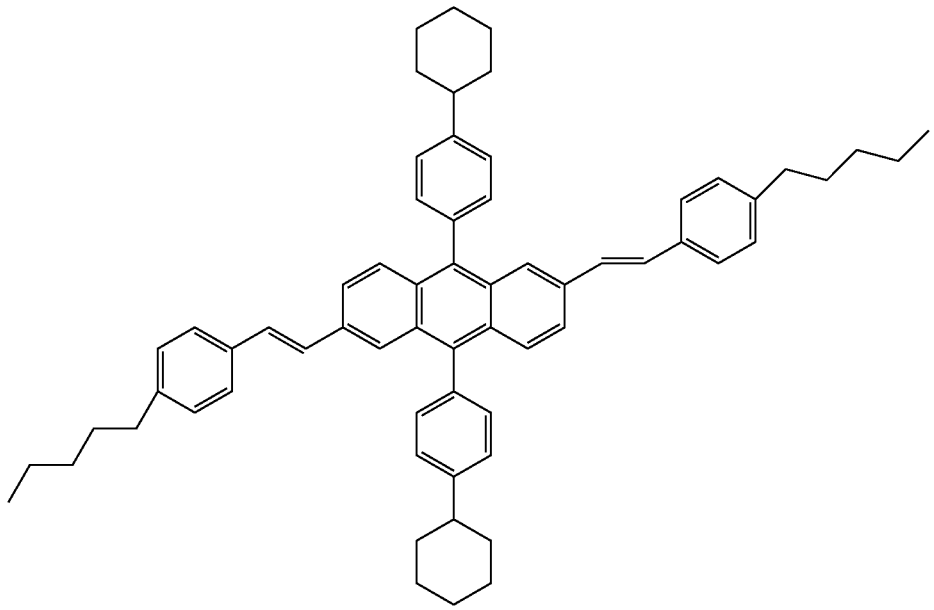
Compound 64
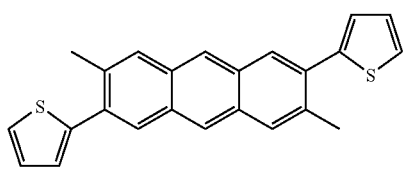
Compound 65
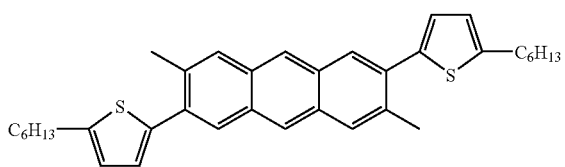
Compound 66
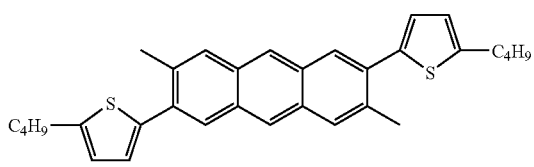
Compound 67
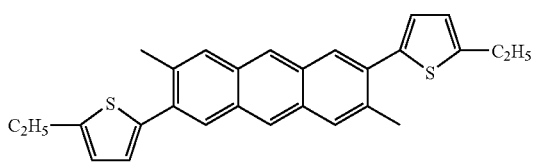
Compound 68
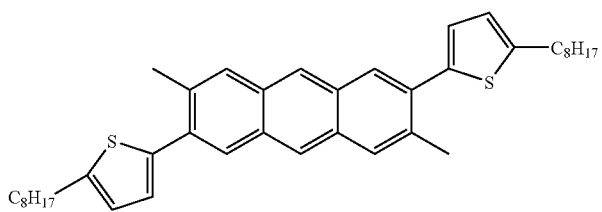
Compound 69
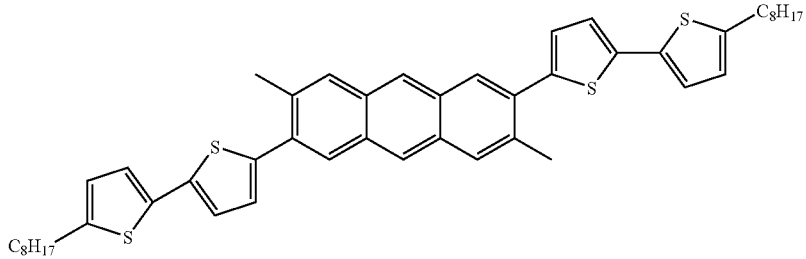

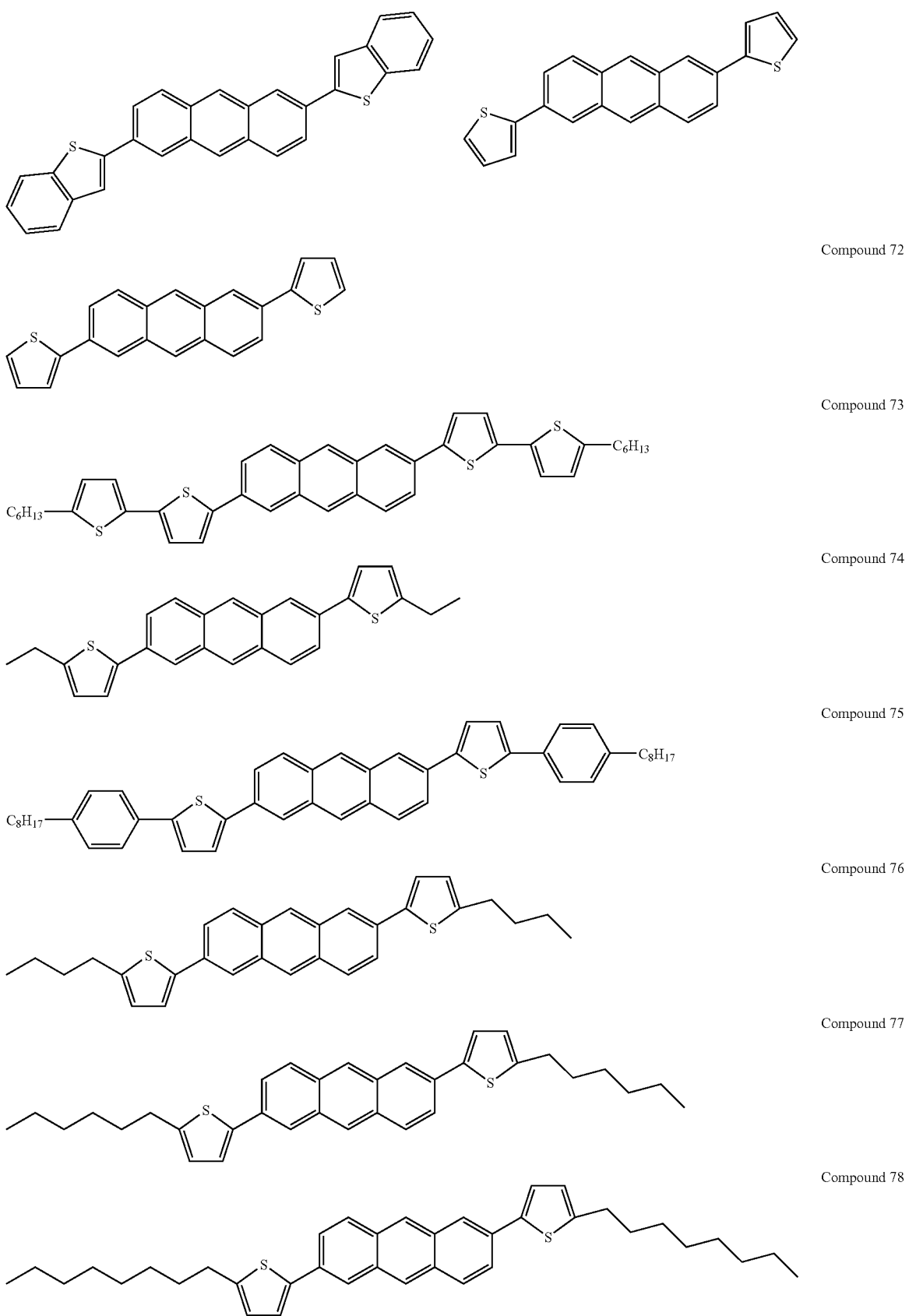

Compound 79
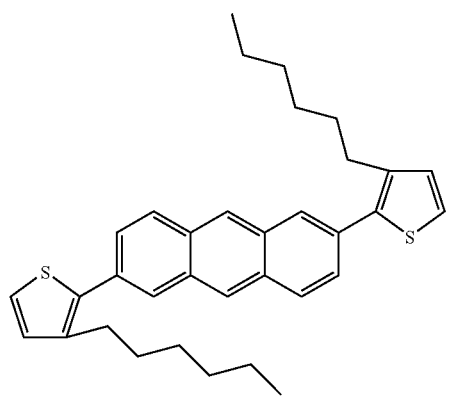
Compound 80
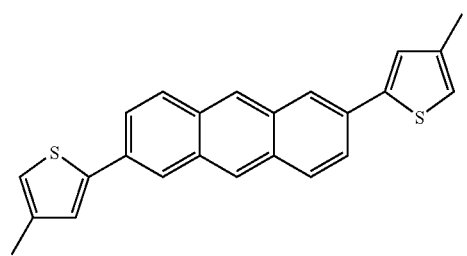
Compound 81
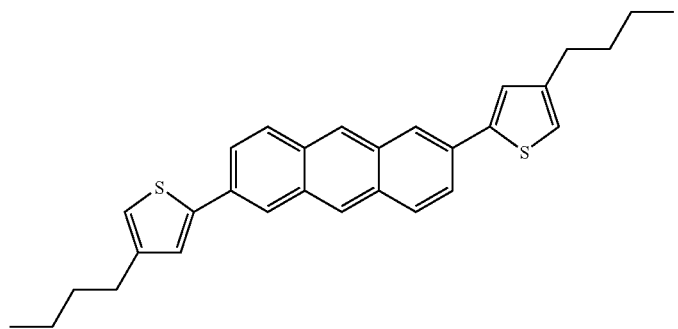
Compound 82
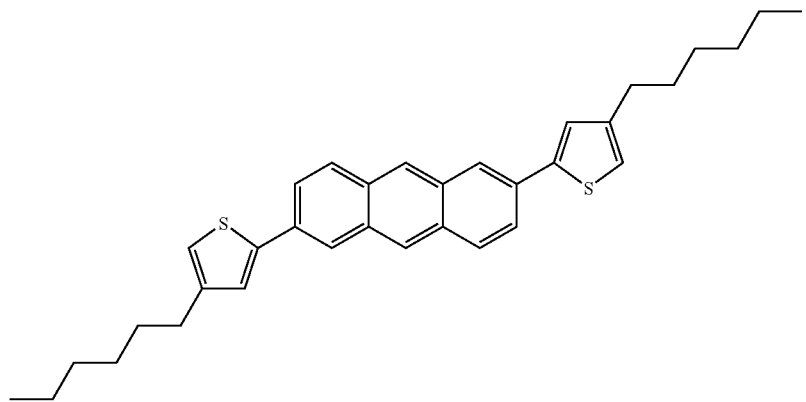
Compound 83
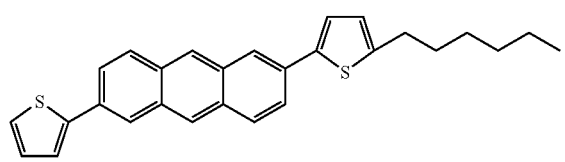
Compound 84
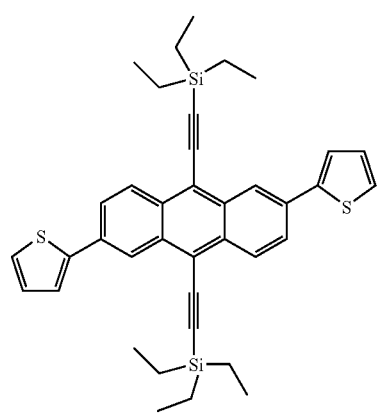

Preferred TFTs of the invention are where the semiconductor is compound 3 or compound 77.

The semiconductors of Formula (III) wherein m and/or n are 1 or greater, can be prepared by the conjugated cross-coupling reaction of a substituted boronic acid (or ester) with a dihaloarylene compound. Such reactions are commonly referred to as "Suzuki couplings" and are illustrated in Scheme 1.

Scheme 1

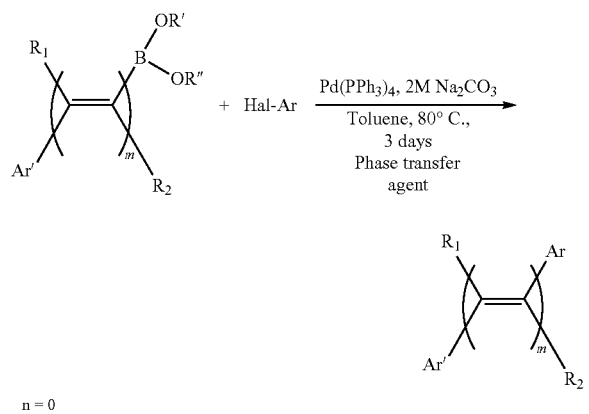

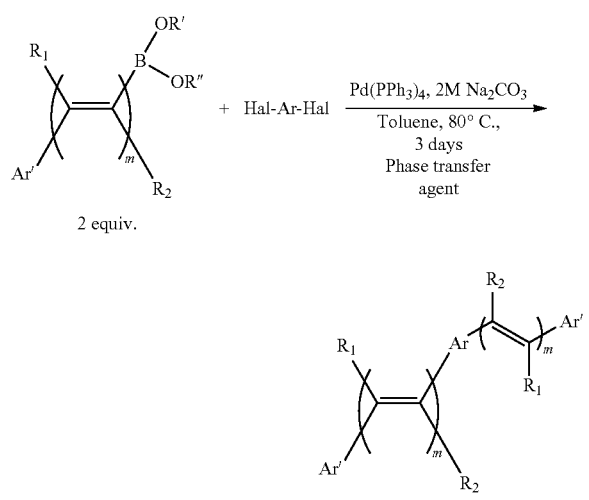

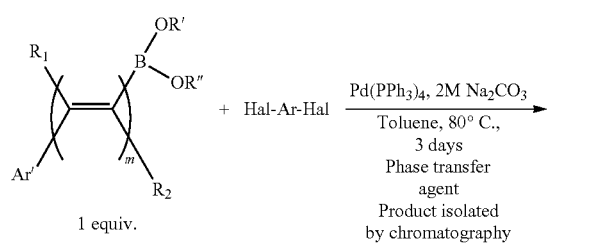

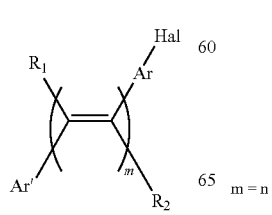

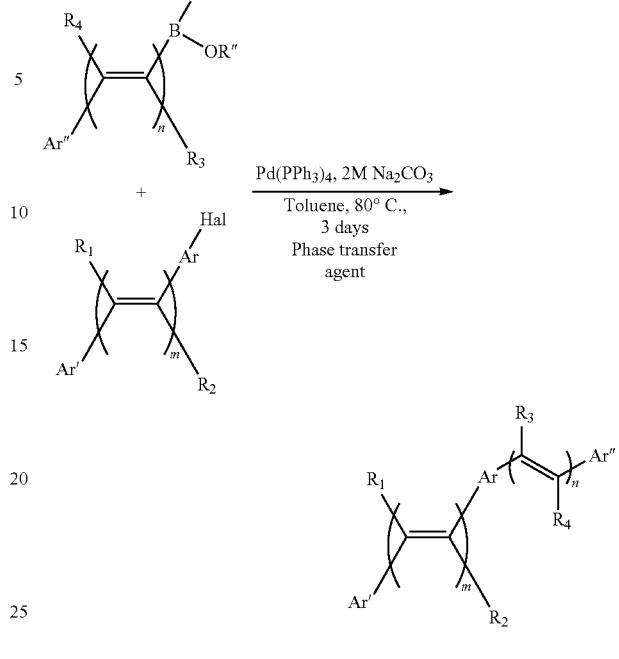

"Heck coupling reactions" can also be used, in which a substituted aryl-ethylene is reacted with a dihaloarylene compound in the presence of a Pd(II) catalyst and a phosphine, as illustrated in Scheme 2. Hal-Ar-Hal is as defined above in Scheme 1.

Scheme 2

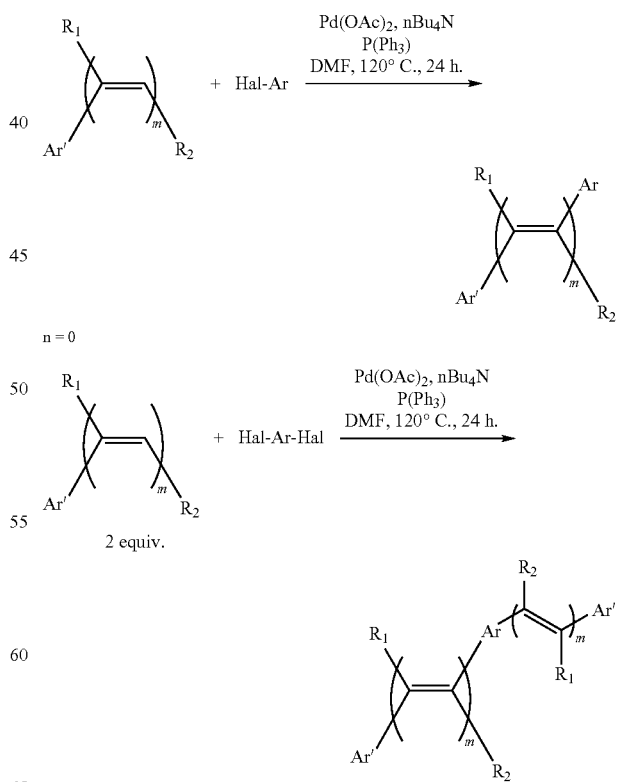

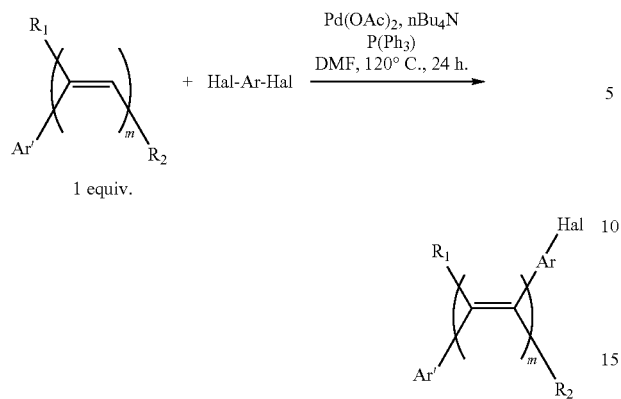

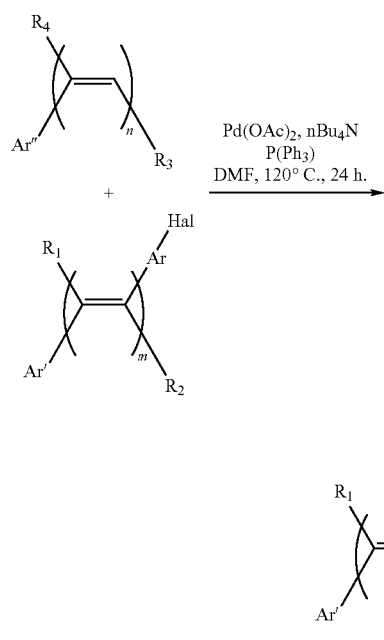

Variations on these synthetic approaches can also be used, as illustrated in the following reactions wherein Ar' is as defined above.

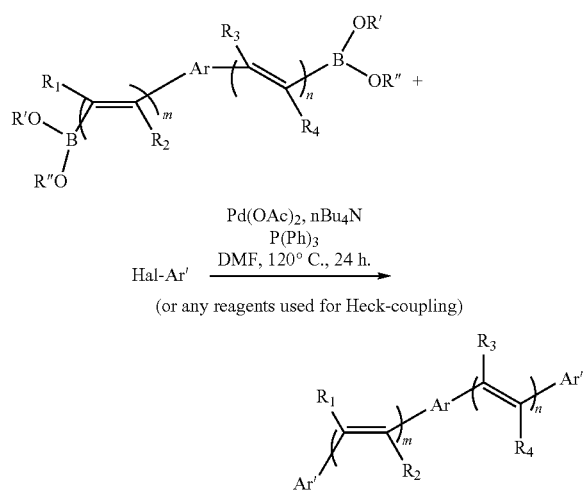

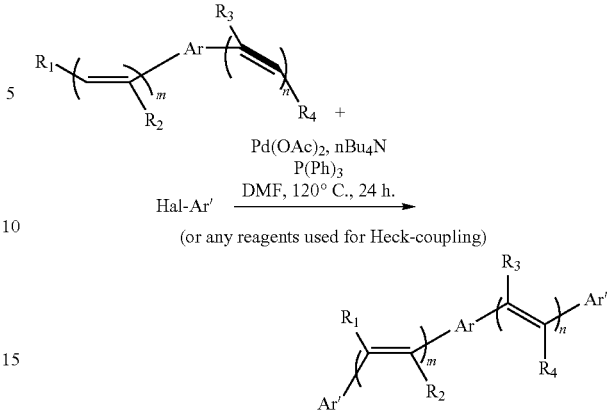

Suzuki coupling reactions are well known in organic chemistry and have been described in the literature (Miyaura, N.; Suzuki, A., Chem. Rev. (1995), 95(7), 2457-83).

The boronic acid or ester reagents can be synthesized according to literature methods as illustrated below (Lightfoot, A. P.; Maw, G.; Thirsk, C.; Twiddle, S. J. R.; Whiting, A., Tetrahedron Lett. (2003), 44(41), 7645-7648.)

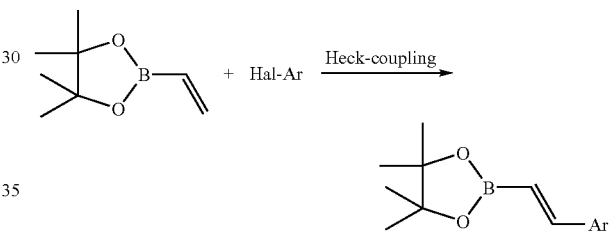

The reagents are not restricted to the above substituted boronic acids or esters. Any Suzuki-coupling reagents used as organoboronic coupling reagents can be used, such as potassium trifluoro(organo)borates. (Darses, S.; Genet, J. P., Eur. J. of Org. Chem. (2003), (22), 4313-4327.) The reaction conditions, catalysts, solvents, phase transfer agents, and reaction media can also be varied. (Herrmann, W. A.; Reisinger, C. P.; Haerter, P.,
"C—C coupling reactions (Heck, Stille, Suzuki, etc.). Aqueous-Phase Organometallic Catalysis" (2nd Edition) (2004), 511-523.)

Heck coupling reactions are also established in organic chemistry and have been described in the literature (Huo, S.; Negishi, E. "Palladium-catalyzed alkenyl-aryl, aryl-alkenyl, and alkenyl-alkenyl coupling reactions" in Handbook of Organopalladium Chemistry for Organic Synthesis (2002), 1, 335-408; Littke, A. F.; Fu, G. C. Angew. Chem. Int. Ed. (2002), 41(22), 4176-4211; Farina, V., Adv. Synthesis & Catalysis (2004), 346(13-15), 1553-1582; Braese, S.; De Meijere, A. "Double and multiple Heck reactions" in Handbook of Organopalladium Chemistry for Organic Synthesis (2002), 1, 1179-1208; Itami, K.; Ushiogi, Y.; Nokami, T.; Ohashi, Y.; Yoshida, J. Org. Lett., (2004), 6(21), 3695-3698; Reetz, M. T.; de Vries, J. G., Chem. Commun. (2004), (14) 1559-1563).

The aryl-ethylene or substituted styrene reagents can be synthesized according to literature methods as illustrated below (Kerins, F.; O'Shea, D. F. J. Org. Chem. 2002, 67, 4968-4971).

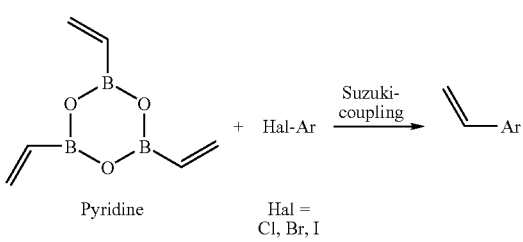

Semiconductors of Formula (III) wherein m and n are equal to 0 (for instance, compounds 64-84) are available by synthesis by reacting a 2,6-dihaloanthracene with a boron reagent in the presence of a palladium catalyst to form a 2,6-diboron-substituted anthracene; and reacting the 2,6-diboron-substituted anthracene with a halogenated heterocycle in the presence of a palladium(0) catalyst to provide the desired anthracene.

In a typical synthesis of a substituted anthracene, a 2,6-dihaloanthraquinone serves as the starting material and is available commercially or can be prepared, for example, from the corresponding 2,6-diaminoanthraquinone derivative by bromination with $CuBr_2$ (M. P. Doyle et al., *J. Org. Chem.* 1977, 42, 2431-2436). Other dihaloanthraquinones can be prepared by similar methods to those of M. P. Doyle et al., or by the methods published by T. Yanagimoto et al., J. Chem. Soc. Chem. Commun., (1993), (6), 519-20. Reduction to the corresponding 2,6-dihaloanthracene can be carried out, for example, by reacting the 2,6-dihaloanthraquinone with $HI/H_3PO_2$ in acetic acid (B. P. Cho et al. *J. Org. Chem.* 1987, 52, 5668-5678).

The 2,6-dihaloanthracene can be reacted with a boron reagent in the presence of a suitable catalyst, to form the 2,6-diborate-substituted anthracene as shown below wherein Hal=halogen. Suitable reaction conditions, catalysts, bases, and boron reagents are described by T. Ishiyama et al., *J. Org. Chem.* 1995 60, 7508-7510; M. Murata et al., *J. Org. Chem.* 1997 62, 6458-6459; M. Murata et al., *J. Org. Chem.* 2000 65, 164-168; and L. Zhu, et al., *J. Org. Chem.* 2003 68, 3729-3732.

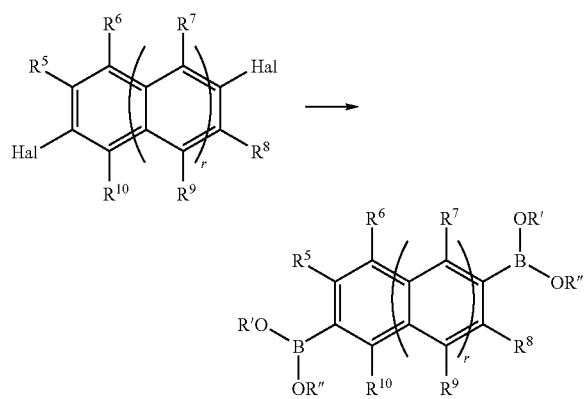

Suitable boron reagents include boronic acids, boronic esters, dialkoxyboranes and bis(alkoxy)diborons that contain a —B(OR')(OR") group, wherein R' and R" are selected independently from hydrogen; substituted and unsubstituted alkyl; substituted and unsubstituted aryl; substituted and unsubstituted heteroaryl; substituted and unsubstituted alkenyl; substituted and unsubstituted alkynyl; $C_nF_{2n+1}$; and $—C_nF_{2n+1}C_mH_{2m+1}$, and wherein any two adjacent groups, R' and R", can be taken together to form a ring.

Suitable catalysts include Pd(II) complexes such as [1,1'-bis(diphenylphosphino)ferrocene]-dichloropalladium ($PdCl_2(dppf)$); $PdCl_2(PPh_3)_2$; and palladium acetate. Optionally, the reaction can be carried out in the presence of a mild base such as potassium acetate.

The 2,6-diborate-substituted anthracene is reacted with a halogenated heterocycle in the presence of a suitable catalyst (e.g., $Pd(PPh_3)_4$ and other similar Pd(0) catalysts, $Pd(PAr_3)_4$; $PhPdI(PPh_3)_2$; and $Pd(OAc)_2$) to form semiconductors of Formula (III) wherein m and n are equal 0.

Suitable halogenated heterocycles include compounds of Formula (IV)

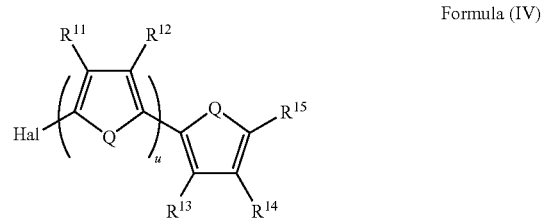

Formula (IV)

wherein u is an integer selected independently from 0 to 10;
Q is selected from the group consisting of S, Se, Te, O, and $NR^0$;
$R^{11}$ through $R^{15}$ are selected independently from the group consisting of hydrogen, alkyl, aryl, halogen, hydroxyl, aryloxy, alkoxy, alkenyl, alkynyl, amino, alkylthio, phosphino, silyl, —COR, —COOR, —$PO_3R_2$, —$OPO_3R_2$, and CN; and
R is selected from the group consisting of hydrogen, alkyl, aryl, alkenyl, and alkynyl; wherein any two adjacent groups, $R^{11}$ through $R^{15}$ can be taken together to form a ring.

Compounds of Formula (IV) wherein Hal=Br can be prepared from the corresponding heterocycle by bromination with NBS (N-bromosuccinimide).

Alternatively semiconductors of Formula (III) wherein m and/or n are equal 0 can be prepared by converting a halogenated heterocycle of Formula (IV) to the corresponding boron reagent of Formula (V),

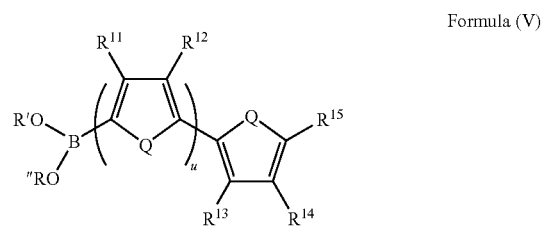

Formula (V)

and then reacting that boron reagent with, for example, a 2,6-dibromoanthracene.

Other C—C coupling reactions, such as the so-called "Stille coupling reactions" (Stille, J. K. *Angew. Chem. Int. Ed. Engl.* 1986, 25, 508), "Kumada coupling reactions" (Kumada, M. *Pure. Appl. Chem.* 1980, 52, 669), and "Negishi coupling reactions" (Negishi, E. *Acc. Chem. Res.* 1982, 15, 340) can also be used to prepare compounds of Formula (III) from the appropriate acene and heterocycle derivatives.

Unsymmetrical compounds can be synthesized via a two-stage coupling reaction: For example, in a first coupling reaction, one bromine of 2,6-dibromoanthracene can be replaced by substituted thienyl group A, and a second coupling will replace the other bromine on the anthracene ring with substituted thienyl B.

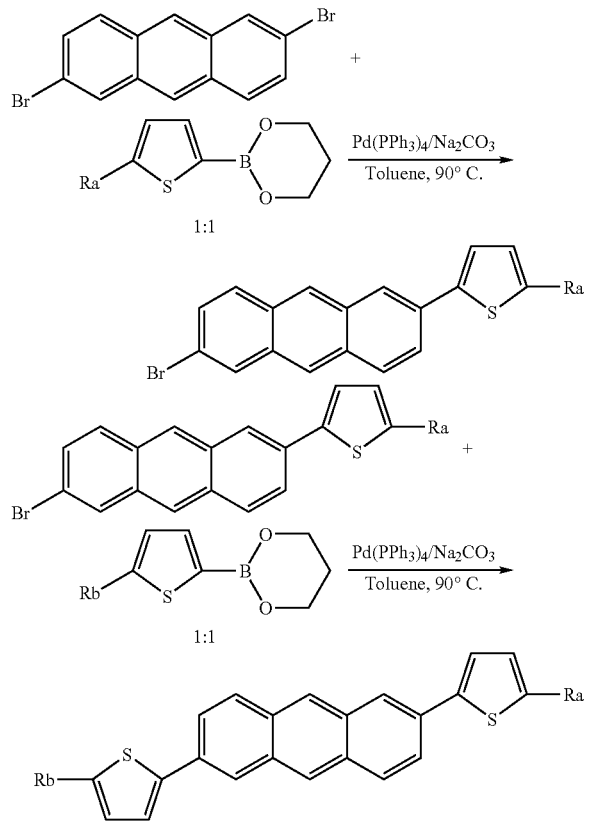

The compounds of Formula (III) have been found to have high mobilities as well as high on/off ratios. In printed devices, mobilities of −0.536 cm²/VS, and on/off ratios of 2.10E+05 have been observed. These properties of the compounds of Formula (III) make these semiconductor materials suitable for incorporation into semiconductor devices such as thin film transistors (TFT) or field effect transistors (FET) at low substrate temperatures. The semiconductor layer can be deposited by vapor deposition using a mask or by printing.

TFTs of the invention generally include a substrate, a gate electrode, a dielectric layer, a source electrode and a drain electrode, and a semiconductor layer. In various embodiments the TFTs of the invention include those wherein the dielectric layer, the gate electrode, the semiconductor layer, the source electrode and the drain electrode can be arranged in any sequence that allows for a functioning TFT. In preferred embodiments the dielectric layer is interposed between the gate electrode and the semiconductor layer, the source electrode and the drain electrode both contact the semiconductor layer and the electrodes do not contact each other. In one embodiment the TFT includes the gate electrode, the dielectric layer on the gate electrode, the source electrode and drain electrode adjacent to the dielectric layer, and the semiconductor layer adjacent to the dielectric layer and adjacent to the source and drain electrodes. For general reference see, for example, S. M. Sze, in Physics of Semiconductor Devices, 2$^{nd}$ edition, John Wiley & Sons, New York (1981) page 492. These components can be assembled in a variety of configurations. These elements are typically mounted on an inert substrate during manufacturing, testing and/or use. Optionally, the substrate can provide an electrical function for the TFT.

Useful substrate materials include organic and inorganic materials. For example, the substrate can comprise inorganic glasses, ceramic foils, polymeric materials (e.g., acrylics; epoxies; polyamides; polycarbonates; polyimides; polyketones; poly(oxy-1,4-phenyleneoxy-1,4-phenylenecarbonyl-1,4-phenylene), sometimes referred to as poly(ether ether ketone) or PEEK; polynorbornenes; polyphenyleneoxides; poly(ethylene naphthalenedicarboxylate) (PEN); poly(ethylene terephthalate) (PET); and poly(phenylene sulfide) (PPS)). The substrate can also comprise filled polymeric materials (for example, fiber-reinforced plastics (FRP)), or coated metallic foils. A preferred substrate for the TFT of the embodiments is selected from the group consisting of: polyethylene terephthalate, polyethylene naphthalate, triacetyl cellulose, glass and polyimide.

In certain embodiments the thin film electrodes (i.e., the gate, source, and drain electrodes) can be any useful conductive material. For example, the gate electrode can comprise doped silicon or a metal (e.g., aluminum, chromium, gold, silver, nickel, palladium, platinum, tantalum, or titanium). Conductive polymers also can be used, for example polyaniline or poly(3,4-ethylenedioxythiophene)/poly(styrene sulfonate) (PEDOT:PSS). In addition, alloys, combinations, and multilayers of these materials can be used. In some TFTs, a single material can function as the gate electrode and the substrate. For example, doped silicon can function as the gate electrode and also support the TFT.

The dielectric layer generally covers the gate electrode. The dielectric layer electrically insulates the gate electrode from the balance of the TFT device. Useful materials for the dielectric layer, other than those specifically defined above, can comprise any inorganic electrically insulating material, e.g., strontiates, tantalates, titanates, zirconates, aluminum oxides, silicon oxides, tantalum oxides, titanium oxides, silicon nitrides, barium titanate, barium strontium titanate, barium zirconate titanate, zinc selenide, or zinc sulfide. In addition, alloys, combinations, and multilayers of these materials can be used for the dielectric layer.

The source and drain electrodes are separated from the gate electrode by the dielectric layer, while the semiconductor layer can be over or under the source and drain electrodes. In certain embodiments the source and drain electrodes can be any sufficiently conductive material (e.g., metals such as aluminum, barium, calcium, chromium, gold, silver, nickel, palladium, platinum, titanium, or alloys thereof). Conductive polymers such as polyaniline, PEDOT:PSS, as well as combinations and multilayers thereof can also be used a source and drain electrodes. Some of these materials are appropriate for use with n-type semiconductor materials and others are appropriate for use with p-type semiconductor materials, as is known in the art.

The thin film electrodes can be provided by any of several means, including physical vapor deposition (e.g., thermal evaporation or sputtering) and ink jet printing. The patterning of these electrodes can be accomplished by known methods such as shadow masking, additive photolithography, subtractive photolithography, printing, microcontact printing, or pattern coating. A preferred method for providing thin film electrodes is thermal transfer imaging of metal composition (A), as disclosed above.

In certain preferred embodiments, wherein the dielectric layer is comprised of at least one Layer A or Layer C as described above, at least one of the electrodes of the group: gate electrode, source and drain electrodes; comprises a composition of a conducting polymer. Preferred conducting polymers, referred to herein as Conducting Polymers A, are selected from the group: polyaniline; polythiophene; polypyrrole; polyheteroaromatic vinylenes; and their derivatives. Descriptions of highly conductive polymers and methods for doping conductive polymers can be found in the following references: Bredas, J.-L. In *Handbook of Conducting Polymers*; Skotheim, T., Ed.; Marcel Dekker, Inc.: New York, 1986; Vol. 2, Chapter 25; MacDiarmid, A. G. *Angew. Chem. Int. Ed.* 2001, 40, 2581-2590 and Heeger, A. J. *Angew. Chem. Int. Ed.* 2001, 40, 2591-2611. U.S. Pat. Nos. 5,863,465 and 5,370,825, hereby incorporated by reference, describe the conducting and semiconducting properties of polyanilines. Organic acids, including plasticizing acids, are preferred dopants.

In preferred embodiments, the conductivity of polyanilines and derivatives thereof can be fine-tuned with dopants including organic acids and, optionally, carbon nanotubes to provide appropriate levels of conductivity, as described in US 2005/0116202, hereby incorporated by reference. Preferred conducting polymers comprise polyaniline dispersions of single wall carbon nanotubes (SWNT), preferably about 0.1 to 12 wt % SWNTs. Preferrably the polyaniline and derivatives thereof are further doped with an organic protonic acid having 1 to 30 carbons, said acid at a mole equivalent amount of about 25% to about 100% of the nitrogen or sulfur atoms in the polymer backbone. A preferred organic protonic acid is dinonylnaphthalene sulfonic acid (DNNSA). In this embodiment polyaniline is a preferred conducting polymer for doping with SWNTs and organic acids.

Figure 5A:
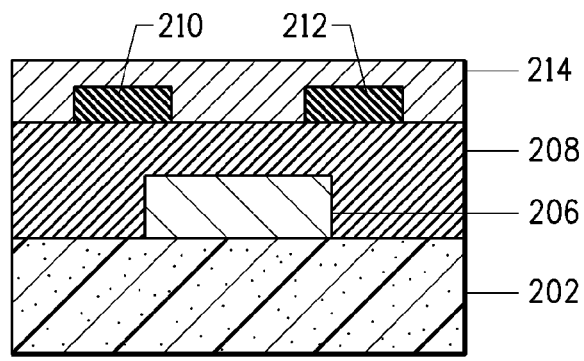
FIGS. 5A-D are a cross-sectional views of various TFT modes useful according to various embodiments of the invention.
Figure 5B:
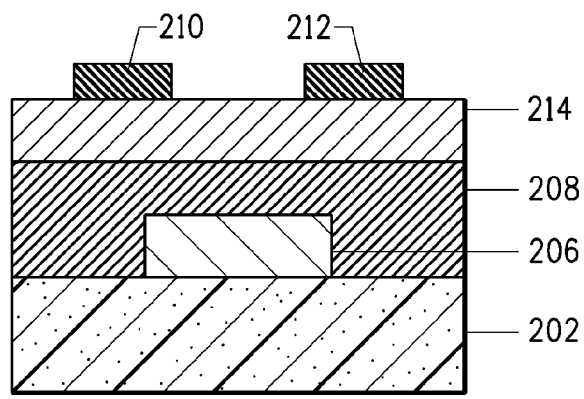

FIGS. 5A and 5B are schematic diagrams of the bottom contact mode and top contact mode, respectively, of a TFT. FIG. 5A illustrates the bottom-contact mode TFT, wherein electrodes 210 and 212, which form channels for the source and drain, respectively, can be created on the dielectric layer 208 using the thermal transfer process described above. A semiconductor layer 214 is then deposited over the surface of electrodes 210 and 212 and layer 208. Layer 206 is the gate electrode, which can be patterned on the substrate layer 202 by the thermal transfer process.

FIG. 5B illustrates the top-contact mode TFT, wherein the semiconductor layer 214 is deposited on the dielectric layer 208 before the fabrication of electrodes 210 and 212.

Figure 5C:
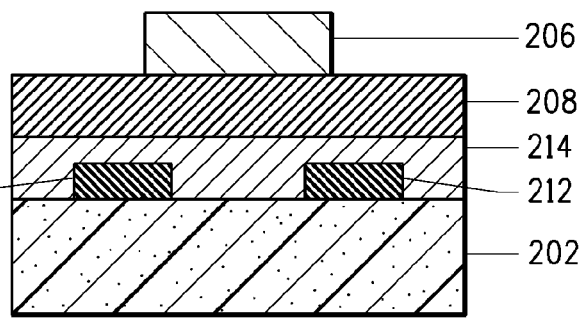

FIG. 5C illustrates a TFT in bottom contact mode with the gate electrode 206 at the top and the source and drain electrodes 210 and 212 created on the substrate 202 before deposition of the semiconductor layer 212.

Figure 5D:
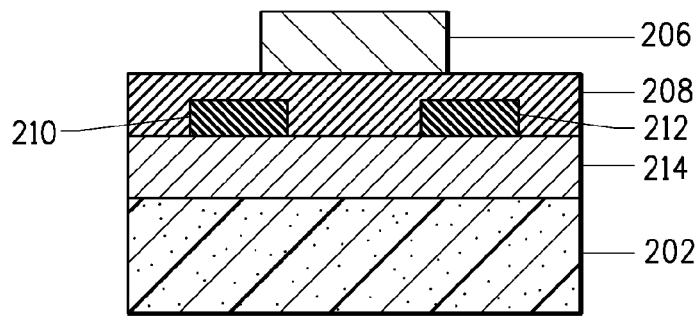

FIG. 5D illustrates a TFT in top contact mode with the gate electrode 206 on the top and the source and drain electrodes 210 and 212 created on a semiconductor layer 214.

Figure 6:
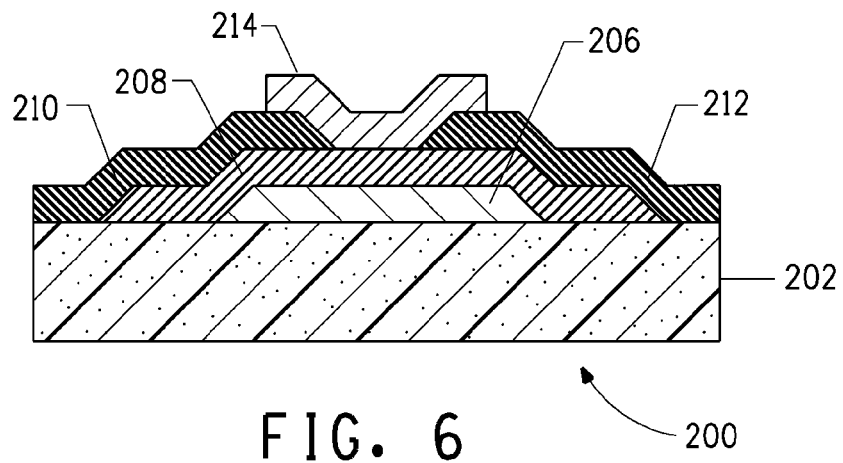
FIG. 6 is a cross-sectional view of a TFT according to one embodiment of the invention.
Figure 7:
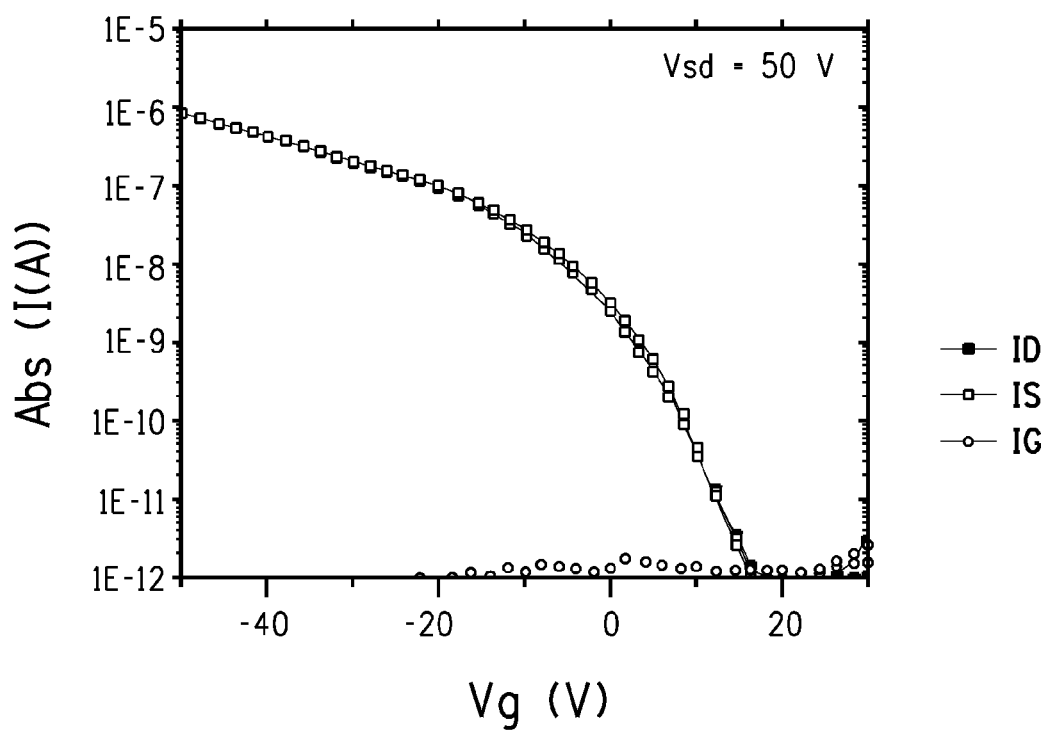
FIG. 7 illustrates the current versus gate voltage sweep with drain voltage equal −50 V for the transistor made with a dielectrics layer according to one embodiment of the invention.

The TFTs of the various embodiments can be made with the thermal transfer metal donors and dielectric donors by iterative thermal transfer of one or more layers onto a receiver. FIG. 6 is a cross-sectional view of thermal imaging receiver 200 comprising base film 202, a patterned gate electrode 206 on base film 202, a patterned dielectric layer 208 on gate electrode 206, patterned source electrode 210 and drain electrode 212 on the dielectric layer 208, and a patterned semiconductor layer 214 contacting the patterned source and drain electrodes. The patterned gate conductor layer 206 and/or the patterned source and drain electrodes 210/212 can be put in place using the thermal transfer metal donor comprising metal composition (A) described above. The patterned dielectric layer 208 can be put in place using the thermal transfer dielectric donor comprising Layer A or Layer C described above.

Characterization of TFT devices provided herein, can be performed as follows:

Linear regime ($V_g <= V_{sd}$) mobility is calculated according to the equation:

$$\mu_{lin} = (L/WC_iV_{sd})(dI_d/dV_g) \qquad \text{Equation 1}$$

where $I_d$ is the drain current, $V_g$ is gate voltage, $V_{sd}$ is source-drain voltage, L is channel length, W is channel width, and $C_i$ is capacitance per unit area of the gate dielectric. $C_i$ is in units F/cm² and is calculated according to the following formula:

$$C_i = (\epsilon_o \epsilon / t)(10^{-4}) \qquad \text{Equation 2}$$

where $\epsilon_o$ is the permittivity constant, $\epsilon$ is the dielectric constant, and t is the dielectric thickness.

Saturation regime ($V_g >= V_{sd}$) mobility is calculated according to the equation:

$$\mu_{sat} = (2L(d\sqrt{I_d}/dV_g)^2)/(WC_i) \qquad \text{Equation 3}$$

Threshold voltage, $V_t$, is measured in the saturation regime. The square root of $I_d$ is plotted versus $V_g$. Extrapolation of a line from the steepest portion of the curve to the x-axis provides $V_t$.

The on/off ratio is the ratio of the current $I_{DS}$ at the highest $V_{GS}$ to the current $I_{DS}$ at the lowest $V_{GS}$ under the highest applied drain voltage $V_{DS}$.

In one embodiment thin film transistors comprising metal composition (A) have Ion/off of about 1 E+05 or greater. Thin film transistor arrays comprising a plurality of transistors comprising metal composition (A) have a yield of functional transistors of about 98% or greater.

In another embodiment thin film transistors wherein the dielectric layer comprises dielectric Layer A have an Ion/off of about 1 E+05 or greater. Thin film transistor arrays comprising a plurality of transistors wherein the dielectric layer comprises dielectric Layer A have a yield of functional transistors of about 98% or greater. In another embodiment the thin film transistor wherein the dielectric layer comprises dielectric Layer A have a mobility of about 0.5 cm²V⁻¹s⁻¹ or greater.

The present invention is further illustrated in the following Examples. It should be understood that these Examples, while indicating preferred embodiments of the invention, are given by way of illustration only.

Materials

The synthetic results were confirmed by mass spectrometry (MS), nuclear magnetic resonance (NMR) analysis, and/or x-ray crystal structure.

NMR spectra were taken on a Bruker™ 500 MHz spectrometer. All chemical shifts were reported relative to tetramethylsilane (TMS) at 0.0 ppm, unless otherwise stated.

2,6-Dibromoanthracene was prepared according to the method of Hodge, P.; Power, G. A.; Rabjohns, M. A. *Chem. Commun.* 1997, 73; as follows:

A 500 mL 3-neck round-bottomed flask was charged with anhydrous copper bromide ($CuBr_2$) (56 g, 0.25 mol), t-butyl nitrite (90%, 34 g, 0.30 mol) and anhydrous acetonitrile (300 mL). The mixture was then refluxed at 65° C. for 10 minutes. Thereafter 2,6-diaminoanthraquinone (23.8 g, 0.10 mol) was slowly added over period of 0.5 h.

When gas evolution ceased, the reaction mixture was cooled to room temperature (RT) and poured into 6 M HCl (500 mL). The precipitate was filtered and washed with water and ethanol. The crude product was then purified by sublimation (~270° C./60 mTorr) to provide 33.62 g (92%) 2,6-dibromoanthraquinone: mp>280° C.

Subsequently, a mixture of 2,6-dibromoanthraquinone (22.41 g, 61.23 mmol), acetic acid (250 mL), 56-58% hydriodic acid (100 mL), and 50% hypophosphorous acid (55 mL) was refluxed for 5 days. The mixture was cooled to RT and poured into ice water (800 mL). The resulting precipitate was filtered, washed with water and ethanol, and recrystallized from toluene (620 mL) to give 2,6-dibromoanthracene: 14.49 g pale yellow flake-like crystals.

2,6-Anthracene-bis-4,4,5,5-tetramethyl-1,3,2-dioxaborolane was prepared as follows:

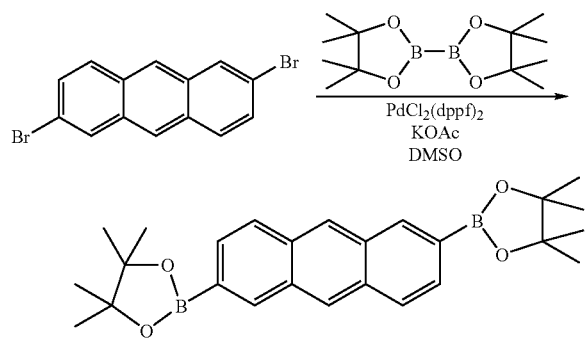

A nitrogen-flushed round bottom flask was charged with 2,6-dibromoanthracene (21.73 g, 64.67 mmol), bis(pinacolato) diboron (41.06 g, 161.67 mmol), potassium acetate (25.90 g, 263.85 mmol) and [1,1'-bis(diphenylphosphino)ferrocene]-dichloropalladium complex with dichloromethane (1:1) (1.64 g, 2.0 mmol). Dimethyl sulfoxide (DMSO, 300 mL) was then added and the mixture was bubbled with nitrogen for 15 min. After heating at 80° C. for 16 h, the reaction mixture was cooled to RT and poured into ice-water (600 ml). It was then extracted with methylene chloride (2×) and the combined organic layer was dried over anhydrous magnesium sulfate. The solvent was evaporated and the residue was purified several times by flash silica gel column with chloroform/hexane (1:2 to 1:1 to 2:1 to chloroform) as eluent to give 13.4698 g (48%) of bright yellow fine crystals: mp: >260° C.; $^1$H NMR (CDCl$_3$, 500 MHz): δ 8.56 ppm (s, 2 H), 8.44 ppm (s, 2 H), 7.99-7.97 ppm (d, 2 H, J=8.5 Hz), 7.79-7.77 ppm (d, 2 H, J=8.5 Hz), δ 1.41 ppm (s, 24 H); $^{13}$C-NMR (CDCl$_3$, 500 MHz): δ 137.7, 133.1, 132.2, 129.5, 127.8, 127.5, 84.37, 25.33 ppm; EI, MS m/z (%): 430 (100, M$^+$); Combustion Anal. Found: C, 71.76; H, 7.32; B, 4.89.

2,6-Anthracene-bis-2'-5'-hexylthiophene (compound 77) was prepared as follows:

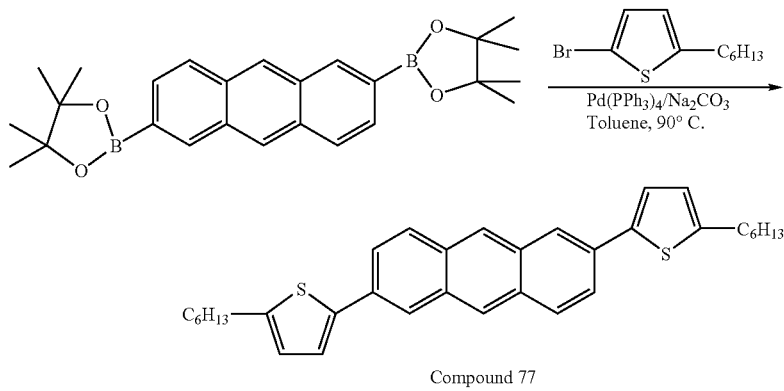

Compound 77

To a solution of 2,6-anthracene-bis-4',4',5',5'-tetramethyl-1', 3',2'-dioxaborolane (6.8220 g, 15.86 mmol) and 2-bromo-5-hexylthiophene (8.6251 g, 34.89 mmol) dissolved in toluene (240 mL) was added sodium carbonate (8.48 g, 80 mmol) dissolved in water (40 ml) followed by the addition of phase-transfer agent Aliquat® 336 (3.2 g, 8.0 mmol). The mixture was bubbled with nitrogen for 15 min. Then, tetrakis(triphenylphosphine)palladium(0) (368 mg, 2% mol) was added. The mixture was heated to 90° C. for three days under a nitrogen atmosphere. The reaction mixture was cooled to RT and poured into methanol (600 mL). The yellow precipitate was filtered, washed consecutively with water, dilute acid (5% HCl), water, methanol, and acetone (3×) to remove the starting material and mono-substituted by-product. The crude product was purified by sublimation (270° C./60 mmTorr) in a 3-zone furnace, followed by recrystallization from xylenes to give 4.2802 g (53%) of bright yellow product: $^1$H NMR (p-dichlorobenzene-d4, 500 MHz): δ 8.15 ppm (s, 2 H), 8.01 ppm (s, 2 H), 7.82-7.80 ppm (d, 2 H, J=8.5 Hz), 7.61-7.59 ppm (d, 2 H, J=8.5 Hz), 7.19 ppm (d, 2 H, J=3.45 Hz), 7.02 ppm (d, 2 H, J=3.45 Hz), 6.71 ppm (s, 2 H), 2.80-2.77 ppm (t, 2 H, J=8.6 Hz), 1.70 ppm (m, 2 H), 1.32 ppm (m, 6 H), 0.89 ppm (t, 3 H, J=7.5 Hz); $^{13}$C-NMR (CDCl$_3$, 500 MHz): δ 146.6, 142.7, 132.8, 132.4, 132.2, 130.2, 129.3, 126.8, 125.9, 125.1, 124.0, 32.36, 32.28, 31.11, 29.64, 23.33, 14.63 ppm; EI, MS m/z (%): 510 (100, M$^+$); HRMS found: 510.241463.

2,6-Bis-[2-4-pentyl-phenyl)-vinyl]-anthracene (compound 3) was prepared as follows:

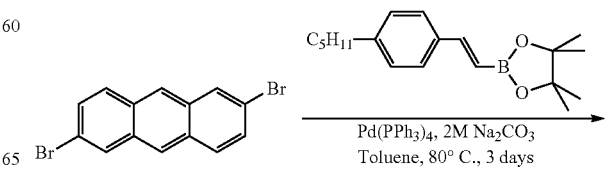

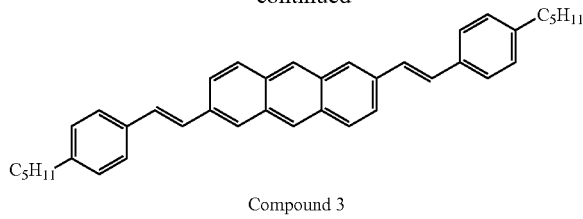

Compound 3

To a mixture of 2,6-dibromoanthracene (5.20 g, 15.48 mmol) and 2-[2-(4-pentylphenyl)vinyl]-4,4,5,5-tetramethyl-1,3,2-dioxaborolane (14.67 g, 46.42 mmol, Sigma-Aldrich Chemical Co.) in toluene (200 mL) was added 2M sodium carbonate (8.20 g, 77.36 mmol) dissolved in water (38.7 mL) followed by the addition of phase-transfer agent Aliquat® 336 (3.10 g, 7.74 mmol, Sigma-Aldrich Chemical Co.). The mixture was bubbled with nitrogen for 15 min, followed by addition of tetrakis(triphenylphosphine)-palladium(0) (358.5 mg, 2% mol, Sigma-Aldrich Chemical Co.). The mixture was heated to 90° C. for three days under a nitrogen atmosphere. The reaction mixture was cooled to room temperature and poured into methanol (600 mL). The precipitate was filtered off, washed with water, dilute acid (5% HCl), water, methanol, then with acetone three times to remove the starting material as well as the mono-substituted by-product. The crude product was purified by sublimation in a 3-zone furnace twice to give 2.00 g (25%) of bright yellow solid.

2,7-Bis-[2-(4-cyclohexyl-phenyl)-vinyl]-anthracene (Compound 44) was prepared as follows:

To a mixture of 2,6-dibromoanthracene (3.36 g, 10.00 mmol) and 4-cyclohexylstyrene (7.45 g, 40.0 mmol) in DMF (200 mL, anhydrous) was added sodium acetate (3.73 g, 45.0 mmol). The mixture was bubbled with nitrogen for 15 min. Then trans-di-m-acetatobis[2-(di-o-tolylphosphino)benzyl]dipalladium(II) (19.1 mg, 0.2 mol %) was added. The mixture was heated at 135° C. (oil bath) for 2 days under a nitrogen atmosphere. The reaction mixture was cooled to room temperature and poured into methanol. The precipitate was filtered off, washed with methanol and acetone. The crude product was purified by sublimation in a 3-zone furnace to give 0.3 g (5.5%) of a yellow solid.

2-(4-Pentylphenyl)-vinyl]-tetracene (Compound 36) was prepared as follows:

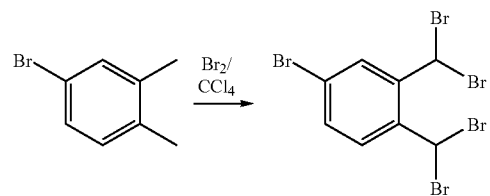

(a) 4-Bromo-o-xylene (75.00 g, 0.28 mol) was dissolved in 900 mL of CCl$_4$. Bromine (82.00 mL, 1.60 mol) was added slowly while irradiating with a UV light. After addition the reaction mixture was irradiated for an additional hour. The reaction mixture was then washed with water 2 times, and concentrated in a rotary evaporator. The precipitate was filtered off and washed with hexane, and dried in a vacuum oven (80.59 g, 57%).

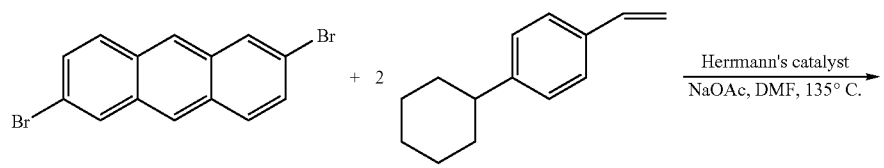

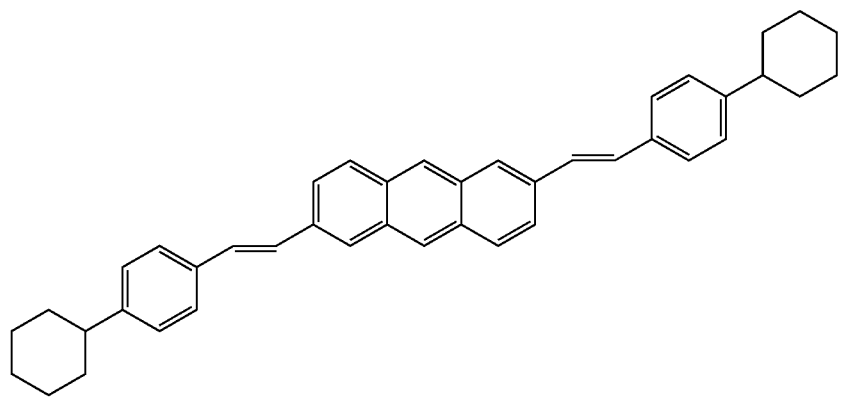

Compound 44

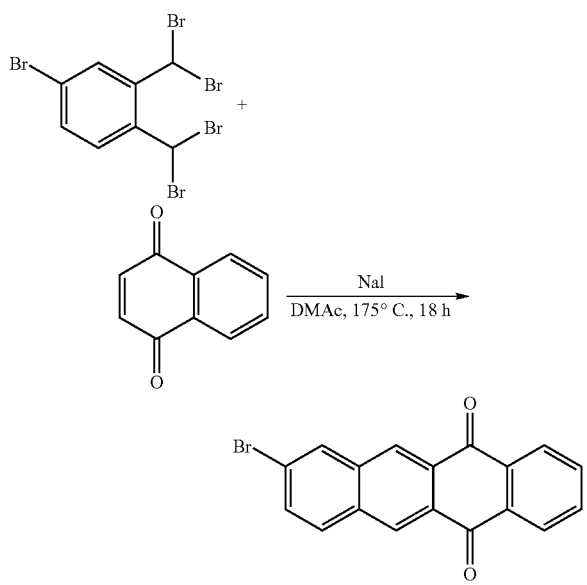

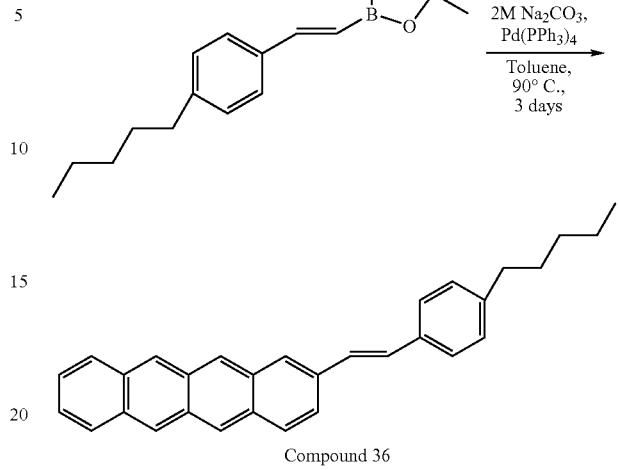

Compound 36

(b) The mixture of 4-bromo-1,2-bis-dibromomethyl-benzene (20.00 g, 0.040 mol), 1,4-naphthoquinone (6.31 g, 0.040 mol) and NaI (68.81 g, 0.46 mol) in 300 ml of DMAc was refluxed for 18 hr. After cooling, the reaction mixture was poured into water. The precipitate was filtered off and washed with MeOH, then purified by sublimation to give a yellow solid product (3.67 g, 27%).

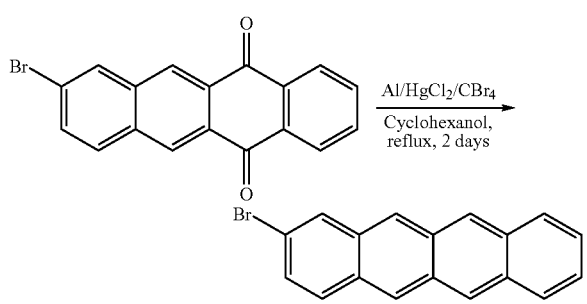

(c) Into a 300 ml of flask was added Al wire (8.67 g, 0.32 mol), $HgCl_2$ (0.17 g, 0.64 mol), cyclohexanol (200 ml) and a catalytic amount of $CBr_4$ (0.85 g, 0.0026 mol). The mixture was bubbled with nitrogen for 15 min. The reaction was initiated by heating, cooling to slow down the reaction, and then completed by refluxing for 4 hr. To this solution was added 8-bromo-naphthacene-5,12-dione (12.72 g, 0.032 mol). The mixture was refluxed for 2 days. After cooling down a little bit the reaction mixture was poured into MeOH/$H_2O$/conc. HCl solution (1/1/1, 800 ml). The precipitate was filtered off, washed with MeOH/$H_2O$/conc. HCl (1/1/1) and then methanol. The crude product was purified by sublimation in a 3-zone furnace to give pure product (8.97 g, 77%) as an orange solid.

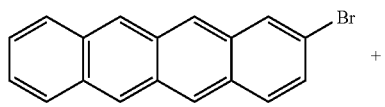

(d) To a mixture of 2-bromotetracene (3.50 g, 11.39 mmol) and 2-[2-(4-pentylphenyl)vinyl]-4,4,5,5-tetramethyl-1,3,2-dioxaborolane (4.32 g, 13.67 mmol) in toluene (150 mL) was added 2M sodium carbonate (6.04 g dissolved in 28.5 ml of water, 56.95 mmol) followed by the addition of phase-transfer agent Aliquat®336 (2.28 g, 5.70 mmol). The mixture was bubbled with nitrogen for 15 min. Then tetrakis(triphenylphosphine)palladium(0) (263.0 mg, 2 mol %) was added. The mixture was heated at 90° C. (oil bath) for three days under a nitrogen atmosphere. The reaction mixture was cooled to room temperature and poured into methanol. The precipitate was filtered off, washed with dilute acid (5% HCl), water, methanol, then with acetone. The crude product was purified by sublimation in a 3-zone furnace to give 2.91 g (64%) compound 36 as a red solid.

Unless otherwise indicated, chemicals were used as received without further purification. Solvents were purchased from Aldrich and VWR and were of reagent-grade purity or higher; HPLC grade and preferably electronic grade solvents were used when available. Water was either deionized water, HPLC grade water from Aldrich, or purified water. Polymers, plasticizers, IR dyes, and surfactants were obtained from the sources listed in the specification or purchased from Aldrich. Pigments such as carbon black dispersions were obtained from Penn Color, Inc., Doylestown, Pa. All raw polyester films were obtained from DuPont Teijin Films (Wilmington, Del.). Silver nanoparticles were purchased from Ferro Co.—Electronic Material Systems; Nanostructured & Amorphous Materials, Inc., and Mitsui Co. HiPco raw carbon nanotubes were purchased form Carbon Nanotechnologies, Inc., Houston Tex. Kapton HN was obtained from DuPont De Nemours, Inc. (Circleville, Ohio). WPTS® 3737 (Water-Proof Transfer Sheet) was obtained from DuPont De Nemours, Inc. (Towanda, Pa.).

Coating

Coating of transfer and other layers onto donor and receiver elements was carried out utilizing stainless steel wrapped and formed 0.5 inch diameter coating rods purchased from R.D. Specialties, Inc. (RDS; Webster, N.Y.) and chrome-plated stainless steel formed 0.625 inch diameter rods with a CN profile purchased from Buschman Corporation (Cleveland, Ohio). The free surface of the donor was cleaned with a pressurized nitrogen stream immediately prior to coating to rid the surface of particle contamination. The coatings were drawn by hand on the donor mounted on a smooth glass surface or machine-coated utilizing a Water-Proof® Color Versatility coating system (CV coater) manufactured by DuPont De Nemours Inc. (Wilmington, Del.).

Coatings were stored in a controlled temperature/humidity environment with an average temperature of about 68° C. and about 40-50% average relative humidity.

Donor Substrates

Cr LTHC Layer. A base film of polyethylene terephthalate (PET, 50 microns thick in all examples unless stated otherwise) was coated with chrome metal in a vacuum deposition chamber. Metallization was carried out on PET films with and without light attenuating agents (670 nm absorbers). The chrome layer was coated at both 50% T and 40% T. In the examples, these donor films will be referred to as: 40% T Cr PET donor substrate and as 50% T Cr PET donor substrate; for the metallized films without light attenuating agents. The donor films with 670 nm absorbers incorporated in the base film will be referred to as: 40% T Cr Blue PET donor substrate and as 50% T Cr Blue PET donor substrate.

Organic LTHC Layer. The organic LTHC layer was prepared as reported in Formulation L of the Examples of PCT/US05/38009:

A LTHC coating formulation was prepared from the following materials: (i) demineralized water: 894 g; (ii) dimethylaminoethanol: 5 g; (iii) Hampford dye 822 (Hampford Research; formula corresponds to SDA 4927): 10 g; (iv) polyester binder (Amertech Polyester Clear; American Inks and Coatings Corp; Valley Forge; PA): 65 g of a 30% aqueous solution; (v) TegoWet™ 251(4) (a polyether modified polysiloxane copolymer, Goldschmidt): 2.5 g; (vi) potassium dimethylaminoethanol ethyl phosphate: 14 g of an 11.5% aqueous solution [The 11.5% aqueous solution was prepared by combining three parts water and 0.5 parts ethyl acid phosphate (Stauffer Chemical Company, Westport, Conn.: Lubrizol, Wickliffe, Ohio) and sufficient 45% aqueous potassium hydroxide to achieve a pH of 4.5, followed by addition of sufficient dimethylaminoethanol to achieve a pH of 7.5 and finally dilution with water to achieve five parts total of final aqueous solution of 11.5 relative mass percent of water-free compound]; (vii) crosslinker Cymel™ 350 (a highly methylated, monomeric melamine formaldehyde resin, Cytec Industries Inc., West Paterson, N.J.): 10 g of a 20% solution; and (viii) ammonium p-toluene sulphonic acid: 2 g of a 10% aqueous solution.

Ingredients (ii) and (iii) were added to the water and allowed to stir for up to 24 hours before addition of the other ingredients in the order shown. The formulation was applied in an in-line coating technique as follows: The polymer base film composition was melt-extruded, cast onto a cooled rotating drum and stretched in the direction of extrusion to approximately 3 times its original dimensions at a temperature of 75° C. The cooled stretched film was then coated on one side with the LTHC coating composition to give a wet coating thickness of approximately 20 to 30 μm. A direct gravure coating system was used to apply the coatings to the film web. A 60QCH gravure roll (supplied by Pamarco) rotated through the solution, taking solution onto the gravure roll surface. The gravure roll rotated in the opposite direction to the film web and applied the coating to the web at one point of contact. The coated film was passed into a stenter oven at a temperature of 100-110° C. where the film was dried and stretched in the sideways direction to approximately 3 times its original dimensions. The biaxially stretched coated film was heat-set at a temperature of about 190° C. by conventional means. The coated polyester film was then wound onto a roll. The total thickness of the final film was 50 microns; the dry thickness of the LTHC layer was 0.07 microns. The PET support layer contained either Disperse Blue 60 or Solvent Green 28 dye to give a final dye concentration of typically 0.2% to 0.5% by weight in the polymer of the substrate layer. The polymer composition containing the Disperse Blue 60 dye (0.26% by weight) had an absorbance of 0.6±0.1 at 670 nm, and an absorbance of <0.08 at 830 nm. The polymer composition containing the Solvent Green 28 dye (0.40% by weight) had an absorbance of 1.2 at 670 nm, and an absorbance of <0.08 at 830 nm. These donor substrates will herein be referred to as: Organic LTHC Blue PET donor substrate and Organic LTHC Green PET donor substrate.

WPTS®: WaterProof® Transfer Sheet (WPTS® 3737; DuPont, Towanda) was used as the donor substrate for laminations. Immediately prior to coating on this substrate, the polyethylene coversheet was removed to expose the release layer of the WPTS® sheet. The coating was applied on this release layer.

Dielectric Measurements

Dielectric electrical properties were tested by spin-coating solvent-based dielectrics or laminating (unless spin-coating is specified) aqueous-based dielectrics from WPTS® onto a glass substrate pre-patterned with ten aluminum "fingers". A top aluminum electrode was then evaporated over the central portion of the substrate to form ten small capacitor structures. Alternatively, if "ITO Method" is specified, the dielectric was rod-coated on the ITO sputtered surface of a PET substrate [700 mil Melinex® ST504 (DuPont Teijin Films) with ITO sputtered on the non-treated side by Courtalds with OC50 (50 ohm/square)] using a Buschman 7CN rod and a CV coater, and ten aluminum fingers were evaporated onto the free surface of the dielectric.

The dielectric constant was determined by measuring the complex admittance from 40 Hz to 110 MHz with an Agilent 4294 impedance bridge. The bulk resistivity was measured by applying a small dc voltage across the device (typically <5 V) and measuring the current through the film with a sensitive preamplifier. Care was taken to confine the measurement to the linear part of the I-V curve before space charge limited currents dominate.

Transistor Electrical Characterization

Transistor electrical performance was measured in air at room temperature using common techniques, for example as shown in S. M. Sze, *Physics of Semiconductor Devices, page 442*, John Wiley and Sons, New York, 1981. A Cascade MicroTech (Beaverton, Oreg.) probestation model Alessi REL-6100 and a semiconductor parameter analyzer Agilent Technologies (Palo Alto, Calif.) model 4155C were used to obtain current versus gate voltage sweeps at constant drain voltage. Typically, gate voltage was swept from +30 to −50 V with a constant source-to-drain bias of −50 V. A plot of square root of current versus gate voltage, at constant drain voltage, was used to determine the saturation mobility. The slope of the straight line portion of the plot was used to define the transconductance. From the transconductance, the device width and length, and the specific dielectric capacitance, the transistor saturation mobility was calculated.

Thermal Imaging Equipment and Donor Mounting

Creo Trendsetter® 800 (Creo/Kodak, Vancouver, Canada) was utilized. The Creo Trendsetter® 800 was a modified drum-type imager utilizing a modified Thermal 1.7 Head with a 12.5 watt maximum average operating power at a wavelength of 830 nm with 5080 dpi resolution. The Creo Trendsetter® 800 was operated in a controlled temperature/humidity environment with an average temperature of ~68° C. and an average relative humidity of ~40-50%. For each printing experiment, a section of thermal imaging receiver was positioned on the drum. The thermal imaging donor was loaded so that the side of the donor element coated with the transfer layer was facing the free side of the receiver. Imaging assemblages were exposed from the back side through the donor film base. Films were mounted using vacuum hold down to a standard plastic or metal carrier plate clamped mechanically to the drum. In some experiments utilizing the Creo Trendsetter® 800, a nonstandard drum with vacuum holes machined directly onto the drum to match common donor and receiver sizes was used as a replacement for the standard drum/carrier plate assemblage. Contact between the donor and receiver was established by ~600 mm of Hg vacuum pressure. Laser output was under computer control to build up the desired image pattern. Laser power and drum speed were controllable and were adjusted in an iterative fashion to optimize image quality as judged by visual inspection of the transferred image on the receiving surface.

Latex Binder Preparation

Latex binders that were used in the preparation of certain donor and receiver elements were prepared according to the procedures of WO 03/099574 with the materials reported in Table 1. Compositions are reported in Table 2 and were characterized by the analytical methods reported in WO 03/099574. Monomers and initiators were commercially available (Aldrich Chemical Co., Milwaukee, Wis.) and used as received. The surfactant was Polystep® B-7, a 29 wt % solution of ammonium lauryl sulphate in water (Stepan Co., Northfield, Ill.).

Chain Transfer Agent. This material was prepared as described in U.S. Pat. No. 5,362,826, Berge, et. al.: A 500 liter reactor was equipped with a reflux condenser and nitrogen atmosphere. The reactor was charged with methyl ethyl ketone (42.5 kg) and isopropyl-bis(borondifluorodimethylglyoximato) cobaltate (III) (Co III DMG) (104 g) and the contents brought to reflux. A mixture of Co III DMG (26.0 g), methyl methacrylate (260 kg), and methyl ethyl ketone (10.6 kg) was added to the reactor over a period of 4 hours. Starting at the same time, a mixture of Vazo® 67 (DuPont, 5.21 kg) and methyl ethyl ketone (53.1 kg) was added to the reactor over a period of 5 hours. After the additions, the reactor contents were kept at reflux for another ½ hour. After cooling, this yielded 372 kg of a 70 wt % solution of Chain Transfer Agent (a chain transfer agent solution), which was used directly in the polymerizations.

TABLE 1

Materials for the Synthesis of Acrylic Latex Resins

| Reagent (grams) | Acrylic Latex Resin | | | | | | | | | |
|---|---|---|---|---|---|---|---|---|---|---|
| | LH-3 | LL-3 | LH-1 | LL-1 | LH-0 | LL-0 | LHEA-6 | LL-3-2GA | LH-3-2GA | LH-10-2GA |
| Polystep B-7 | 6.90 | 6.90 | 6.90 | 6.90 | 6.90 | 6.90 | 6.90 | 6.90 | 6.90 | 6.90 |
| Ammonium Persulfate | 0.40 | 0.20 | 0.20 | 0.20 | 0.40 | 0.20 | 0.20 | 0.40 | 0.40 | 0.40 |
| Methyl Methacrylate | 252.0 | 228.0 | 260.0 | 236.0 | 264.0 | 240.0 | 240.0 | 220.0 | 280.0 | 192.0 |
| Butyl Acrylate | 120.0 | 160.0 | 120.0 | 160.0 | 120.0 | 160.0 | 120.0 | 160.0 | 100.0 | 100.0 |
| Methacrylic Acid | 12.00 | 12.00 | 4.00 | 4.00 | 0 | 0 | 0 | 12.00 | 12.00 | 40.00 |
| Glycidyl Methacrylate | 0 | 0 | 0 | 0 | 0 | 0 | 0 | 8.00 | 8.00 | 8.00 |
| HEMA | 0 | 0 | 0 | 0 | 0 | 0 | 24 | 0 | 0 | 0 |
| Chain Transfer Soln | 16.0 | 0 | 16.0 | 0 | 16.0 | 0 | 16.0 | 0 | 0 | 0 |

HEMA: 2-Hydroxyethyl Methacrylate.

TABLE 2

Composition and Analytical Data for Latex Resins

| Resin | Solids | Chain Transfer Soln | MMA | BA | MAA | HEMA | GMA | Particle Diameter (nm) | Tg (° C.) | Mn/1000 | Mw/1000 |
|---|---|---|---|---|---|---|---|---|---|---|---|
| LH-3 | 32.6 | 4 | 63 | 30 | 3 | | | 75 | 56 | 57 | 135 |
| LL-3 | 33.3 | 0 | 57 | 40 | 3 | | | 93 | 33 | 244 | 1399 |
| LH-1 | 33.5 | 4 | 65 | 30 | 1 | | | 78 | 53 | 57 | 138 |
| LL-1 | 33.4 | 0 | 59 | 40 | 1 | | | 93 | 34 | 235 | 1539 |
| LH-0 | 32.8 | 4 | 66 | 30 | 0 | | | 70 | 53 | 53 | 145 |
| LL-0 | 33.4 | 0 | 60 | 40 | 0 | | | 92 | 34 | 69 | 341 |
| LHEA-6 | 32.6 | 4 | 60 | 30 | 0 | 6 | | 71 | 50 | 57 | 150 |
| LL-3-2GA | 33.4 | 0 | 55 | 40 | 3 | | 2 | 94 | 39 | | |
| LH-3-2GA | 33.5 | 0 | 70 | 25 | 3 | | 2 | 92 | 72 | | |
| LH-10-2GA | 33.5 | 0 | 48 | 40 | 10 | | 2 | 86 | 59 | | |

MMA: Methyl Methacrylate;
BA: Butyl Acrylate;
MAA: Methacrylic Acid;
HEMA: 2-Hydroxyethyl Methacrylate;
GMA: Glycidyl Methacrylate.

Receivers

Kapton® HN (5 mil; E.I. duPont de Nemours Co.) substrate was cleaned prior to use as a receiver by rinsing with methanol, wiping with a particle free cloth, and blowing off with a dry nitrogen stream. Surface-treated 5 mil Melinex® ST504 (DuPont Teijin Films) was used as received.

R-1, R-2 and R-3 PET receivers with an acrylic latex image receiving layer were prepared according to the procedure of WO 03/099574 (Flexible Receiver FR-1 Procedure) by slot-die coating an acrylic latex polymer dispersion with Zonyl® FSA as the surfactant onto 4 mil Melinex® 574 base film (DuPont-Teijin Films) or onto 4 mil Cronar®471x(DuPont-Teijin Films) with an Elvax® 550 (ethylene vinyl acetate copolymer, DuPont) release layer between the acrylic image receiving layer and the Cronar® base film (Cronar®/Elvax®: WPTS®, DuPont). The preparation and compositions of the acrylic latex polymers are described above, and the receiver compositions are reported in Table 3.

TABLE 3

Receiver Material

| | Receiver | | |
|---|---|---|---|
| | R-1 | R-2 | R-3 |
| LH-3-2GA (33% Solids) | 2173 g | 2607.6 | — |
| LL-3-2GA (33% Solids) | 3259 g | 3910.8 | — |
| LH-10-2GA (33% Solids) | — | — | 12574.0 |
| N,N-Dimethylethanolamine (10% in water) | 75.0 g | 90.0 | 109.6 |
| Water (distilled) | 8713 g | 10455.6 | 221868.0 |
| Zonyl® FSA | 30.0 g | 36.0 | 43.2 |
| Butyl Cellosolve | 750 g | 900.0 | 1106.0 |
| % Solids | 12% | 12% | 11.6% |
| Coating Weight | 13 mg/dm2 | 12.9 mg/dm2 | |
| Receiver | 4 mil Melinex® 574 | 1.25 mil Elvax® 550/ Cronar® 471X | 2.5 mil Elvax® 550/ Cronar® 471X |
| Polyethylene Cover Sheet | No | Yes | Yes |

General Procedure for the Preparation of Aqueous Dielectric Layers

A water solution was prepared by combining the specified amounts of water and, optionally, a 3 wt % ammonium hydroxide solution. Next, the IR dye, one-fourth of the water solution, and optional defoamers, surfactants and plasticizers were combined in a brown glass container and mixed well. The optional second binder was weighed in a container together with one-fourth of the water solution and mixed well. Optional filler(s) (e.g., carbon black, high—κ nanoparticles) were weighed in another container with one-fourth of the water solution and mixed well. The binder was weighed in a large container with a stir bar and any remaining water solution was added. The contents of the second binder dispersion, the IR dye dispersion, and the filler dispersion were slowly added to the stirring binder. After stirring for at least 15 additional minutes, the formulation was filtered into a brown or foiled-coated container. The solution was filtered for a second time as it was syringed across the end of a donor sheet and was then coated. Unless specified otherwise, filtrations were carried out with 0.45 micron pore size syringe filters (25 mm GD/X Glass Microfiber GMF filter, Whatman Inc., Clifton, N.J.), and coatings were carried out using a CV coater with a Buschman Rod 7CN at 9.8 ft/min. Typically, 17.95 total wt % solids solutions were utilized to give films with a thickness of ~2.3 microns.

Dielectric Layer Compositions

Dielectric layers comprising styrene-acrylic and acrylic compositions were prepared from the components reported in Table 4. The electrical properties of these dielectrics were determined through the procedures described above.

Diel-9. (Tri-layer Dielectric Donor with Gradient Dye Layers) Using a CV coater, formulation Diel-9a (3 mL) was coated onto a 40% T Cr Blue donor substrate with a CN-3 rod at 9.8 ft/min and then dried for 6 min. at 45° C. This procedure was repeated for formulations Diel-9b and Diel-9c, coating Diel-9b on top of Diel-9a and Diel-9c on top of Diel-9b to give a trilayer dielectric with gradient dye layers. Thermal transfer yielded a TFT with the dielectric layer with the lowest dye loading (Example 14) adjacent to the semiconductor.

TABLE 4

Styrene-Acrylic and Acrylic Dielectric Layer Compositions

| Dielectric | Polymer Amount Wt % | Polymer Amount Wt % | IR Dye Amount Wt % | Surfactant Amount Wt % | Other Additives Wt % | Solvent Amount | pH OD | Dielectric Constant (at $10^3$ Hz) Resistivity Ohm-cm |
|---|---|---|---|---|---|---|---|---|
| Diel-1 | J-95 16.780 g 93.6% | | SDA 2860 0.290 g 5.4% | Byk® 348 0.055 g 1.0% | | H$_2$O 12.840 g | 7.99 0.98 | |
| Diel-2 | J-1915 11.430 g 93.6% | | SDA 2860 0.290 g 5.4% | Byk® 348 0.055 g 1.0% | | H$_2$O 18.170 g | 8.67 | |
| Diel-3 | J-95 8.390 g 48.5% | J-63 8.370 g 48.5% | SDA 2860 0.105 g 2.0% | Byk® 348 0.050 g 1.0% | | H$_2$O 11.980 g | 8.22 0.70 | |
| Diel-4 | LH-3 11.120 g 68.3% | LL-3 4.120 g 25.3% | SDA 2860 0.290 g 5.4% | Byk® 345 0.055 g 1.0% | | H$_2$O/2BuO-Ethanol 12.96/1.38 g | 4.93 0.81 | 3.2 $1.9 \times 10^{15}$ |
| Diel-5 | LH-1 10.310 g 63.3% | LL-1 4.930 g 30.3% | SDA 2860 0.290 g 5.4% | Byk® 345 0.055 g 1.0% | | H$_2$O/2BuO-Ethanol 12.96/1.39 g | 4.48 | |
| Diel-6 | LH-0 11.120 g 68.3% | LL-0 4.120 g 25.3% | SDA 2860 0.290 g 5.4% | Byk® 345 0.055 g 1.0% | | H$_2$O/2BuO-Ethanol 12.96/1.38 g | 7.35 | |

TABLE 4-continued

Styrene-Acrylic and Acrylic Dielectric Layer Compositions

| Dielectric | Polymer Amount Wt % | Polymer Amount Wt % | IR Dye Amount Wt % | Surfactant Amount Wt % | Other Additives Wt % | Solvent Amount | pH OD | Dielectric Constant (at $10^3$ Hz) Resistivity Ohm-cm |
|---|---|---|---|---|---|---|---|---|
| Diel-7 | LH-1 10.310 g 63.3% | LL-1 4.930 g 30.3% | SDA 2860 0.290 g 5.4% | Byk ® 348 0.055 g 1.0% | | $H_2O$ 14.35 g | 4.60 0.95 | |
| Diel-8 | LH-3 11.11 g 67.5% | LL-3 4.11 g 25.0% | SDA 4927 0.265 g 4.9% | Byk ® 346 0.100 g 1.0% | TEOE 0.088 g 1.6% | $H_2O$/2BuO-Ethanol 13.22/1.35 g | 3.29 1.03 | 3.2 $1.2 \times 10^{15}$ |
| Diel-9a | LH-1 11.110 g 70.2% | LL-1 4.110 g 26.0% | SDA 4927 0.080 g 1.5% | Byk ® 348 0.100 g 1.9% | TEOE 0.023 g 0.40% | $H_2O$ 13.83 g | 3.93 | |
| Diel-9b | LH-1 11.110 g 68.9% | LL-1 4.110 g 25.5% | SDA 4927 0.185 g 3.5% | Byk ® 348 0.055 g 1.0% | TEOE 0.061 g 1.1% | $H_2O$ 14.55 g | 3.68 | |
| Diel-9c | LH-1 22.220 g 67.5% | LL-1 8.220 g 25.0% | SDA 4927 0.530 g 4.9% | Byk ® 348 0.110 g 1.0% | TEOE 0.176 g 1.6% | $H_2O$ 30.100 g | 3.52 | |

Wt % refers to wt % of the solids in the final dry formulation.
Abbreviations:
OD: Optical density of ~2.3 micron film;
2BuOEthanol: 2-ButoxyEthanol;
TEOE: Triethanolamine ethoxylate from Aldrich (cat. no. 416584).
Materials:
Acrylic latex compositions (LH and LL) are as described above.
Joncryl ® 95 (J-95) is an acrylic latex fom Johnson Polymer with Tg of 43° C., an acid number of 70, and a Z-average particle size of 40.5 nm.
Joncryl ® 1915 (J-1915) is an acrylic latex from Johnson Polymer with a Tg of 43° C., an acid number of 66, and a Z-average particle size of 75.6 nm.
Joncryl ® 63 (J-63) is styrene acrylic resin solution from Johnson Polymer with a Tg of 73° C., an acid number of 213, and a Mw of 12,000.

Formulation and Coating of Pani-DNNSA-CNT Donors

Pani-7%: (7% HiPco CNT, Pani-DNNSA) A mixture of HiPco Raw CNT (0.1225 g), Disperbyk® 163 (0.066 g, BYK Chemie) and xylenes (27.612 g) was treated in a rt water bath with a sonication probe (Dukane Co. Model 40TP200, Transducer Model 41C28) for 10 min, during which time the mixture was stirred gently with a spatula at 5 min intervals. Then PANI-DNNSA [7.327 g, 24.23% by wt. in xylenes and 2-butoxyethanol (4:1 ratio) with 0.7 acid doping, synthesized according to U.S. Pat. No. 5,863,465] was added into the mixture, and the mixture was placed in a 45° C. water bath for 5 min. After equilibration of the temperature, the mixture was treated with sonication for 5 min, during which time the mixture was stirred gently with a spatula at one-minute intervals. The resulting dispersion was filtered through a 1.0 micron Nitex® 03-1/1 nylon screen (mesh count 690×470, pore size: 1 micron; Sefar America Inc., Depew, N.Y.). Into the filtrate was added 28.8 micro-L of a 10 wt % solution of Triton® X-114 in xylenes. The dispersion (13 mL) was coated onto a 40% T Cr PET donor substrate using a CV coater at 5.8 ft/min with a #10 CN formed Buschman rod and dried at 40° C. for 15 min.

Modified Pani-7% (mPani-7%): The following CNT-PANI donors were prepared according to the procedure for Pani-7%, except that a mixed solvent system [1,2-dichlorobenzene (DCB) and xylenes] was used: mPani-7%-a: 10% DCB; mPani-7%-b: 20% DCB; mPani-7%-c: 30% DCB.

Formulation and Coating of Silver Donors

Ag/Elv-#8: (87.5% Ag with Elvacite® 2028) A mixture of O471CD Ag powder (10.497 g, particle size d50/d90=350/730 nm), a 20 wt % solution of Elvacite® 2028 in xylenes (7.512 g), and xylenes (12.006 g) was treated in a water bath with sonication for 1 h, during which time the mixture was stirred with a spatula at 0.5-h intervals. The mixture was then treated in a rt water bath with probe sonication for an additional 10 min, during which time the mixture was stirred gently with a spatula at 5-min intervals. The resulting dispersion was filtered with a 12 micron stainless screen (Twill Dutch Weave, mesh count 200×1400, absolute rating: 12-14 microns; Sefar America, Inc., Depew, N.Y.). The dispersion (10 mL) was coated onto a 40% T PET donor substrate using a CV coater at 5.8 ft/min using a #8 formed Buschman rod and dried at 33° C. for 15 min.

Ag/Elv-CN6: Above procedure was followed except using CN6 rod.

Ag/Elv-CN7: Above procedure was followed except using a CN7 rod.

Ag/Elv-CN8: Above procedure was followed except using a CN8 rod.

mAg/Elv-CN8: Above procedure was followed except using a CN8 rod and a solvent mixture of 50% DCB and 50% xylenes.

mAg/Elv-CN7: Above procedure was followed except using a CN7 rod and longer dispersion times: an extra 15 min before and an extra 5 min at the end of the sonication bath.

Ag/Elv/CNT-#8: (1% CNT and 87.5% Ag NAM O471CD with Elvacite® 2028) A mixture of CNT (HiPco R0447, 0.0121 g), 1,2-dichlorobenzene (6.030 g) and xylenes (6.019 g) were dispersed with probe sonication for 15 min, during which time the mixture was stirred with a spatula at 5 min intervals. Next, NAM O471CD Ag powder (10.503 g) and a 20 wt % solution of Elvacite® 2028 in xylenes (7.513 g) were added to the mixture, and the mixture was treated in a water bath with sonication for 1 h, during which time the mixture was stirred with a spatula at 0.5-h intervals. The mixture was then dispersed in a rt water bath with probe sonication for an additional 10 min, during which time the mixture was stirred gently with a spatula at 5-min intervals. The resulting dispersion was filtered with a 12 micron stainless screen (Twill Dutch Weave, mesh count 200×1400, absolute rating: 12-14 microns; Sefar America, Inc., Depew, N.Y.). The dispersion (10 mL) was coated onto a 40% T PET donor substrate using a CV coater at 5.8 ft/min with #8 formed Bushman rod and dried at 38° C. for 25 min.

General Procedure for Semiconductor Evaporation

Shadow masks were fabricated from 2-4 mil thick nickel foil. Shadow mask alignment to the printed array was done by hand, using a light table and stereomicroscope. Careful manipulation of the printed array relative to the shadow mask allowed ~50 micron alignment over 6 inch arrays with minimal damage to the printed array. Once aligned, magnets were used to pinch the printed array and nickel shadow mask together and this was then reinforced with Kapton tape. Finally, the aligned mask/printed array was carefully rolled onto a vacuum deposition drum in a Kurt Lesker Evaporator and loaded for semiconductor evaporation. Semiconductor was deposited by sublimation under vacuum (<3×10$^{-7}$ Torr) onto the free surface. The semiconductor was deposited with an initial rate of 0.1 Å/s up to 60 Å, and then at 0.5 Å/s until the desired thickness, typically 450 Å, was obtained, as determined by measurement with a quartz crystal microbalance. This procedure was carried out with pentacene and semiconductor compounds 77 and compound 3.

ers. The source-drain layer consisted of patterns of source-drain electrodes, capacitor electrodes, bus lines and test pads.

Multilayer printed transistor arrays were designed using a standard photolithography software package (L-Edit) and then converted to a single postscript file for each layer. Each postscript file was then used for layer-by-layer printing in the Trendsetter®. Three patterns were utilized in these examples with both solid and patterned dielectrics: (1) TFT Pattern 1: 150×15 micron source-drain channel; (2) TFT Pattern 2: 600×50 micron source-drain channel; and (3) TFT Pattern 3: 1350×50 micron source-drain channel. Next, the semiconductor was evaporated through a mask in the source-drain channel region according to the general procedure given above. The entire source-drain channel and surrounding region was covered with a rectangular patch of semiconductor in the case of Patterns 1 and 3. In the case of Pattern 2, a 450×400 micron patch of semiconductor was deposited in the channel region, to give a transistor with an effective channel of 450×50 microns.

EXAMPLES 1-16

Composition, Printing Parameters and Characterization of TFT's and TFT Arrays

The TFT's and TFT arrays reported in Examples 1-16 were prepared according to the procedures entitled "general procedure for printing bottom-gate transistors with associated capacitors, bus lines and test pads" and the "general proce-

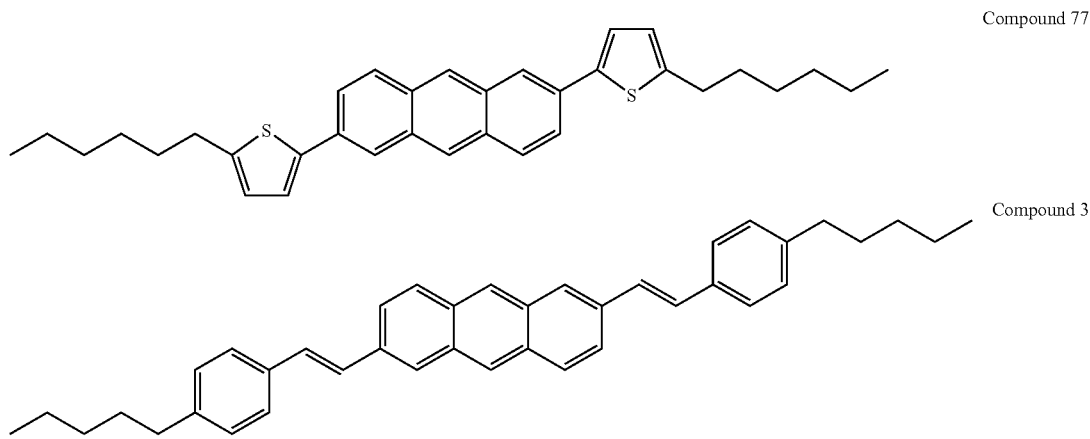

Compound 77

Compound 3

General Procedure for Printing a Bottom-Gate Transistor Array with Associated Capacitors and Bus Lines The above general procedure for printing and mounting with a Creo Trendsetter® 800 thermal platesetter was followed for all printed layers. First, the receiver was loaded onto the drum along with the gate (first layer) donor. Following printing, the gate donor was peeled away from the receiver to give a receiver with a patterned gate layer consisting of patterns of gate electrodes, capacitor electrodes, bus lines and test pads. Next, the dielectric donor was loaded onto the drum, printed, and peeled away from the receiver to give a receiver with consecutively patterned gate and dielectric layers. The dielectric layer was either patterned or printed as a solid block. Next, the source-drain donor was loaded onto the drum, printed, and peeled away from the receiver to give a receiver with patterned gate, dielectric and source-drain laydure for semiconductor evaporation". Details regarding donors and receivers, printing conditions, and TFT performance are given in Tables A 1-3 and Tables B 1-3.

TABLE A-1

| | Donors for TFT's | | | |
| --- | --- | --- | --- | --- |
| Ex | Gate Donor | Dielectric Donor | Source-Drain Donor | Semiconductor |
| 1 | Pani-7% Additional air dry for days | Diel-4 Organic LTHC Green PET donor substrate; 30 min additional dry at 45° C. | Pani-7% 40 min additional dry at 45° C. | Evaporated Pentacene |

TABLE A-1-continued

Donors for TFT's

| Ex | Gate Donor | Dielectric Donor | Source-Drain Donor | Semiconductor |
|---|---|---|---|---|
| 2 | mPani-7%-b | Diel-4<br>40% T Cr Blue PET donor substrate; 30 min additional dry at 45° C. | Pani-7% | Evaporated Pentacene |
| 3 | Pani-7% | Diel-8 w/o TEOE<br>40% T Cr Blue PET; 40 min additional dry at 45° C. | Pani-7% | Evaporated Pentacene |
| 4 | Pani-7% | Diel-8 w/o TEOE<br>40% T Cr Blue PET donor substrate; 40 min additional dry at 45° C. | Pani-7% | Evaporated Comp 77 |
| 5 | Pani-7%<br>Additional air dry for days | Diel-8 w/Byk 345<br>40% T Cr Blue PET donor substrate; 40 min additional dry at 45° C. | Pani-7%<br>40 min additional dry at 45° C. | Evaporated Pentacene |

Receiver: 5 mil Kapton HN (DuPont).

TABLE A-2

Printing Patterns and Parameters for TFT's

| Ex | TFT Pattern | Dielectric Pattern | Gate | Dielectric | Source-Drain |
|---|---|---|---|---|---|
| 1 | 1 | Solid | DS = 205 at 5.70 W | DS = 205 at 8.35 W | DS = 205 at 5.75 W |
| 2 | 1 | Solid | DS = 205 at 5.25 W | DS = 120 at 5.75 W | DS = 205 at 5.35 W |
| 3 | 1 | Solid | DS = 205 at 5.7 W | DS = 160 at 7.3 W | DS = 205 at 5.75 W |
| 4 | 1 | Solid | DS = 205 at 5.7 W | DS = 200 at 8.5 W | DS = 205 at 5.75 W |
| 5 | 1 | Solid | DS = 205 at 5.7 W | DS = 160 at 7.5 W | DS = 205 at 5.75 W |

TABLE A-3

Electrical Performance of TFT's

| Ex | Mobility ($cm^2V^{-1}s^{-1}$) | $V_{Th}$ (V) | $I_{on}$ (A) | $I_{off}$ (A) | $I_{on}/I_{off}$ |
|---|---|---|---|---|---|
| 1 | 0.120 | −5.60 | 1.70E−06 | 9.7E−12 | 1.80E+05 |
| 2 | 0.060 | −6.00 | 8.00E−07 | 8.00E−13 | 1.00E+06 |
| 3[a] | 0.180 | 4.70 | 3.60E−06 | 2.10E−11 | 1.70E+05 |
| 4[a] | 0.536 | −8.20 | 6.59E−06 | 3.16E−11 | 2.10E+05 |
| 5 | 0.120 | −1.80 | 2.10E−06 | 1.00E−11 | 2.00E+05 |

[a]The current versus gate voltage sweep with drain voltage = −50 V for transistors printed in an identical manner and with identical materials as the transistors of Examples 3 and 4 exhibited improved lifetimes for the compound 77-based transistor versus the pentacene transistor over a period of 50 days. That is, the pentacene transistor experienced approximately 10 V negative threshold voltage shift, with greater than 2x mobility decrease, leading to about an order-of-magnitude drop in the on/off current ratio for the voltage range characterized (−50 to +30 V). In contrast, the compound 77-based transistor experienced little or no threshold voltage shift with a decrease of approximately 2x in mobility, leading to an approximately 2x reduction in on/off current ratio in the voltage range characterized.

TABLE B-1

Donors for Printed TFT Arrays

| Ex | Gate Donor | Dielectric Donor | Source-Drain Donor | Semiconductor |
|---|---|---|---|---|
| 6 | Ag/Elv-#8<br>40 min additional dry at 45° C. | Diel-6<br>40% T Cr Blue PET donor substrate; 40 min additional dry at 45° C. | Pani-7%<br>40 min additional dry at 45° C. followed by air dry for 3 days | Evaporated Pentacene |
| 7 | Pani-7%<br>Additional air dry for days | Diel-7<br>WPTS ® 3737[a] | Pani-7%<br>40 min additional dry at 50° C. | Evaporated Pentacene |
| 8 | Ag/Elv-CN7<br>40 min additional dry at 50° C. | Diel-2<br>40% T Cr Blue PET donor substrate; 40 min additional dry at 45° C. | Pani-7%<br>40 min additional dry at 50° C. | Evaporated Pentacene |
| 9 | mPani-7%-b | Diel-1<br>40% T Cr Blue PET donor substrate; 40 min additional dry at 45° C. | Pani-7%[c] | Evaporated Pentacene |
| 10 | Pani-7%<br>10 min additional dry at 50° C. | Diel-3<br>40% T Cr Blue PET donor substrate; 40 min additional dry at 45° C. | Pani-7%<br>40 min additional dry at 45° C. | Evaporated Pentacene |
| 11 | Pani-7%[d] | Diel-4<br>50% T Cr Blue PET donor substrate; 40 min additional dry at 50° C. | Ag/ElvCNT-#8<br>60 min additional dry at 50° C. | Evaporated Pentacene |
| 12 | mAg/Elv-CN8<br>40 min additional dry at 45° C. | Diel-5<br>50% T Cr Blue PET donor substrate; 40 min additional dry at 45° C. | Pani-7%[c]<br>40 min additional dry at 50° C. | Evaporated Comp 77 |
| 13 | mAg/Elv-CN8<br>40 min additional dry at 45° C. | Diel-5<br>50% T Cr Blue PET donor substrate; 40 min additional dry at 45° C. | Pani-7%[c]<br>40 min additional dry at 50° C. | Evaporated Comp 3 |
| 14 | Ag/Elv-CN8<br>40 min | Diel-9<br>40% T Cr Blue PET | Pani-7%<br>40 min additional | Evaporated Pentacene |

TABLE B-1-continued

Donors for Printed TFT Arrays

| Ex | Gate Donor | Dielectric Donor | Source-Drain Donor | Semi-conductor |
|---|---|---|---|---|
| | additional dry at 50° C. | donor substrate; 40 min additional dry at 45° C. | dry at 50° C. | |
| 15 | Ag/Elv-CN7 60 min | Diel-5 40% T Cr Blue PET | Pani-7% 40 min additional | Evaporated Pentacene |
| | additional dry at 50° C. | donor substrate; 40 min additional dry at 45° C. | dry at 45° C. | |
| 16 | Ag/Elv-CN7 40 min | LH-10-2GA Laminated from R-3 | Pani-7% 90 min additional | Evaporated Pentacene |
| | additional dry at 50° C. | Receiver[b] | dry at 45° C. | |

Receiver: 5 mil Kapton HN.
[a]WPTS ® 3737: (WaterProof ® Transfer Sheet) (DuPont; Towanda, PA).
[b]Dye-free dielectric of composition LH-10-2GA (Layer C) was laminated from R-3.
[c]Following source-drain printing and before evaporation of pentacene, peel defects between the source and drain electrodes were selectively removed from the receiver together with peel defects along line edges according to the following procedure: A piece of 50% T Cr PET donor substrate was cut to approximately the same size as the receiver and cleaned with a pressurized nitrogen stream to rid the surface of particle contamination. The receiver was placed on a flat surface, and the Cr-coated substrate was placed on top of the receiver with the Cr surface contacting the patterned surface of the receiver. A SDI Dust Removal System-1 roller was rolled over the entire area of the backside of the Cr-coated substrate in a period of approximately 30-90 seconds. The Cr-coated substrate was lifted off of the patterned receiver surface. Peel defects the size of the source-drain channel were visible on the Cr surface when it was examined under a microscope at 5x magnification.
[d]Peel defects were removed from the gate layer of this transistor. The procedure is similar to that used for the source-drain layer as described in the immediately preceding footnote with the following exceptions: After removal of the pani gate layer donor, the receiver was left in place on the drum. The Cr-coated donor was placed on top of the receiver and peel defects were removed as previously described (footnote c).

TABLE B-2

Printing Patterns and Parameters for Printed TFT Arrays

| Ex | TFT Pattern | Dielectric Pattern | Gate | Dielectric | Source-Drain |
|---|---|---|---|---|---|
| 6 | 1 | Solid | DS = 160 at 7.65 W | DS = 160 at 7.35 W | DS = 205 at 5.75 W |
| 7 | 2 | Solid | DS = 205 at 5.6 W | Laminated from WPTS ® at 3 min, 2250 lbs, 80° C. | DS = 205 at 5.20 W |
| 8 | 2 | Patterned | DS = 160 at 6.7 W | DS = 180 at 8.50 W | DS = 205 at 5.45 W |
| 9 | 3 | Solid | DS = 205 at 5.6 W | DS = 180 at 7.75 W | DS = 205 at 5.75 W |
| 10 | 3 | Solid | DS = 205 at 5.7 W | DS = 180 at 7.70 W | DS = 205 at 5.75 W |
| 11 | 1 | Solid | DS = 205 at 5.7 W | DS = 160 at 7.50 W | DS = 160 at 7.30 W |
| 12 | 2 | Solid | DS = 160 at 7.8 W | DS = 160 at 7.35 W | DS = 205 at 5.50 W |
| 13 | 2 | Solid | DS = 160 at 7.8 W | DS = 160 at 7.35 W | DS = 205 at 5.50 W |
| 14 | 2 | Solid | DS = 160 at 7.6 W | DS = 200 at 9.50 W | DS = 205 at 5.60 W |
| 15 | 2 | Solid | DS = 160 at 7.6 W | DS = 160 at 7.40 W | DS = 205 at 5.60 W |
| 16 | 2 | Solid | DS = 160 at 6.75 W | Laminated from R-3 at 3 min, 2250 lbs, 80° C. | DS = 205 at 5.45 W |

TABLE B-3

Electrical Performance of Printed TFT Arrays

| Ex | Array Size | Median Mobility ($cm^2V^{-1}s^{-1}$) | Median $V_{Th}$ (V) | Median $I_{off}$ (A) | Median $I_{on}/I_{off}$ | Yield |
|---|---|---|---|---|---|---|
| 6 | 54 | 0.06 | -8[b] | 1.0E-11 | 1E+05 | 98.1% |
| 7 | 54 | 0.010 | -15 | 1.0E-11 | 3.2E+04 | 98.1% |
| 8 | 54 | 0.001 | -12 | 3.2E-12 | 3.2E+03 | 96.3% |
| 9 | 108 | 0.05 | -7 | 1.0E-10 | 3.2E+03 | 75.9% |
| 10 | 108 | 0.05 | 5 | 3.2E-11 | 2.0E+03 | 72.2% |
| 11 | 54 | 0.02 | 5 | 1.0E-10 | 3.2E+03 | 100%[a] |
| 12 | 108 | 0.00025 | -22 | 3.2E-12 | 6.3E+02 | 76.9% |
| 13 | 54 | 0.008 | -18 | 6.3E-12 | 6.3E+02 | 92.6% |
| 14 | 54 | 0.025 | -12 | 6.3E-12 | 4.0E+04 | 92.6% |
| 15 | 54 | 0.07 | -5 | 5.0E-11 | 2.0E+05 | 94.4% |
| 16 | 54 | 0.003 | -5 | 1.0E-11 | 3.2E+03 | 88.9% |

[a]Yield of corresponding capacitor array is also 100%, e.g., 100% of the 54 capacitors have $I_{leaks}$ of less than 1.0E-10 A with a median $I_{leaks}$ of 3.2E-12 A.
[b]85% of the transistors have threshold voltage between -15 to -5 V.

What we claim is:

1. A thin film transistor comprising:
   a) a substrate;
   b) a gate electrode;
   c) a dielectric layer;
   d) a source electrode;
   e) a drain electrode; and
   f) a semiconductor layer;
   wherein the dielectric layer has a resistivity of about $10^{14}$ ohm-cm or greater, and comprises at least one Layer A, comprising:
   (1) one or more dielectric polymer(s) selected from the group consisting of : acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxystyrene), poly(4-hydroxystyrene), and copolymers of poly(4-hydroxystyrene) with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly(vinyl acetate); and
   (2) about 0.5 wt % to about 10 wt %, based on a dry weight of Layer A, of one or more near-IR dye(s) having an absorption maximum in the range of about 600 to about 1200 nm within Layer A.

2. The thin film transistor of claim 1 wherein the gate dielectric layer is interposed between the gate electrode and the semiconductor layer, the source electrode and the drain electrode both contact the semiconductor layer and the electrodes do not contact each other.

3. The thin film transistor of claim 1, wherein, within Layer A said one or more dielectric polymer(s) is selected from acrylic and styrenic polymers selected from the group consisting of: acrylic, styrenic and styrenic-acrylic latexes, solution-based acrylic, styrenic and styrenic-acrylic polymers, and combinations thereof; and comprises one or more latex(es) comprising at least about 85 wt % of monomers selected from the group consisting of: alkyl (meth)acrylate, styrene, and alkyl-substituted styrene wherein the alkyl group is a C1 to C18 straight or branched chain alkyl group.

4. The thin film transistor of claim 1 wherein, within Layer A, the one or more near-IR dye(s) comprises an indocyanine dye.

5. The thin film transistor of claim 1, wherein the dielectric layer comprises two or more Layers A that are gradient dye layers, each gradient dye layer having by a dry wt % of near-IR dye of about 0.5 to about 10 wt %; wherein at least one gradient dye layer has a lower wt % of near-IR dye, at least one gradient dye layer has a higher wt % of near-IR dye, and said higher wt % of near-IR dye is a value at least 20% higher than that of the lower wt % of near-IR dye.

6. The thin film transistor of claim 1, wherein Layer A further comprises a high K nanoparticle fraction of up to about 90 wt % of Layer A, with the nanoparticle fraction having a dielectric constant greater than about 20 and an average particle size of about 5 nm to about 500 nm; with the proviso that if the nanoparticle fraction is greater than 80 wt %, the near-IR dye is less than 6 wt % of the layer of material.

7. The thin film transistor of claim 6, wherein the dielectric layer comprises two or more Layers A that are gradient nanoparticle layers, each gradient nanoparticle layer independently having a dry wt % of high κ nanoparticle fraction of up to about 90 wt %; wherein at least one gradient nanoparticle layer has a lower wt % of high κ nanoparticle fraction, at least one gradient nanoparticle layer has a higher wt % of high κ nanoparticle fraction, and said higher wt % is a value at least 20% higher than that of the lower wt %.

8. The thin film transistor of claim 1, wherein the dielectric layer further comprises a Layer B, comprising one or more dielectric polymers, having a resistivity of about $10^{14}$ ohm-cm or greater.

9. The thin film transistor of claim 1, wherein the semiconductor layer is selected from pentacene, compound 3 and compound 77:

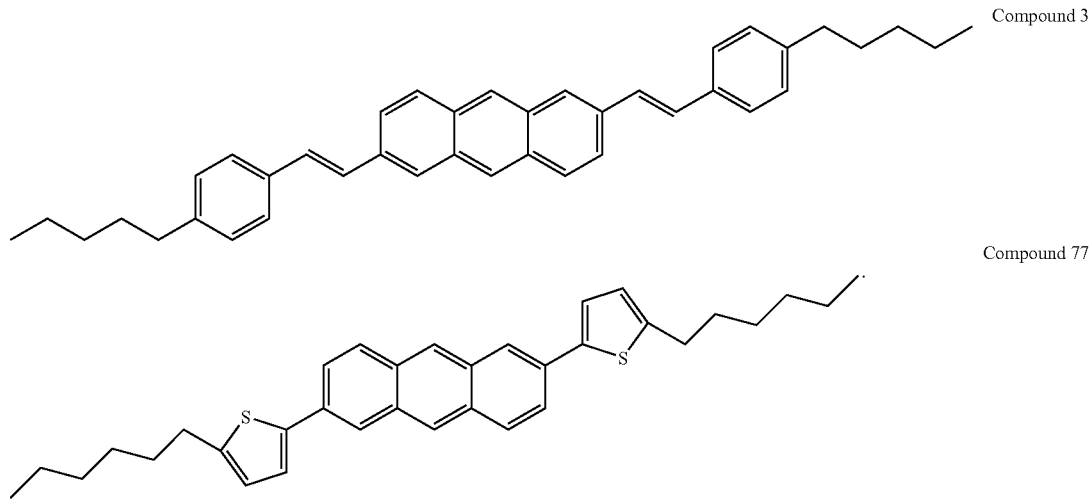

Compound 3

Compound 77

10. The thin film transistor of claim 1, wherein the semiconductor layer comprises a compound of Formula (III):

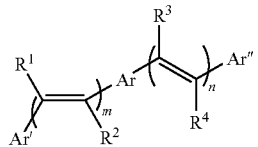

Formula (III)

wherein Ar is selected from the group consisting of:

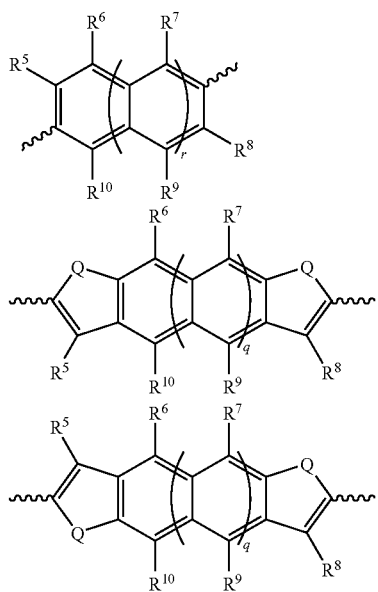

-continued

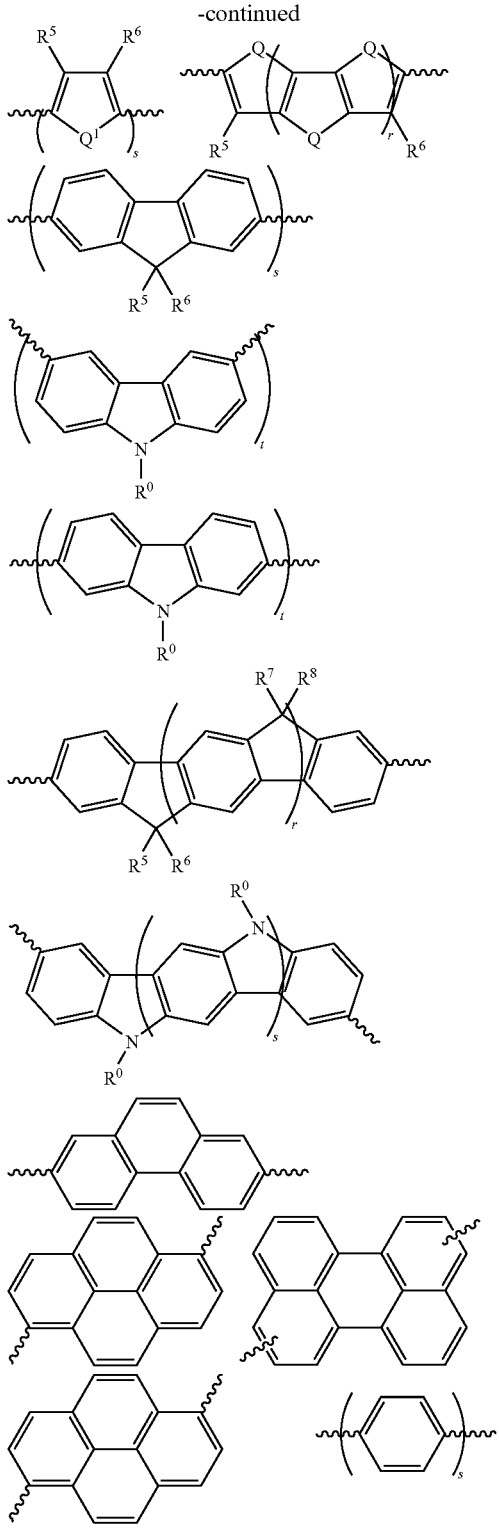

and combinations thereof, wherein:
Ar' and Ar'' are selected independently from the group consisting of aryl groups;
m and n are integers each independently having a value of from 0 to 5;
Q is selected from the group consisting of S, Se, Te, O, and NR⁰; Q¹ is selected from the group consisting of Se, Te, O, and NR⁰;

q and r are selected independently from the group consisting of 0, 1, 2, 3, 4, and 5;
s is an integer having a value of from 1 to 5;
t is an integer having a value of from 2 to 5;
R⁰ is selected from the group consisting of hydrogen, alkyl, and aryl;
R¹ through R¹⁰ are selected independently from the group consisting of hydrogen, alkyl, aryl, halogen, hydroxyl, aryloxy, alkoxy, alkenyl, alkynyl, amino, alkylthio, phosphino, silyl, —COR, —COOR, —PO₃R₂, —OPO₃R₂, and CN; and
R is selected from the group consisting of hydrogen, alkyl, aryl, alkenyl, and alkynyl;
wherein any two adjacent groups, R⁵ through R¹⁰ can be taken together to form a ring.

11. The thin film transistor of claim 10, wherein Ar is

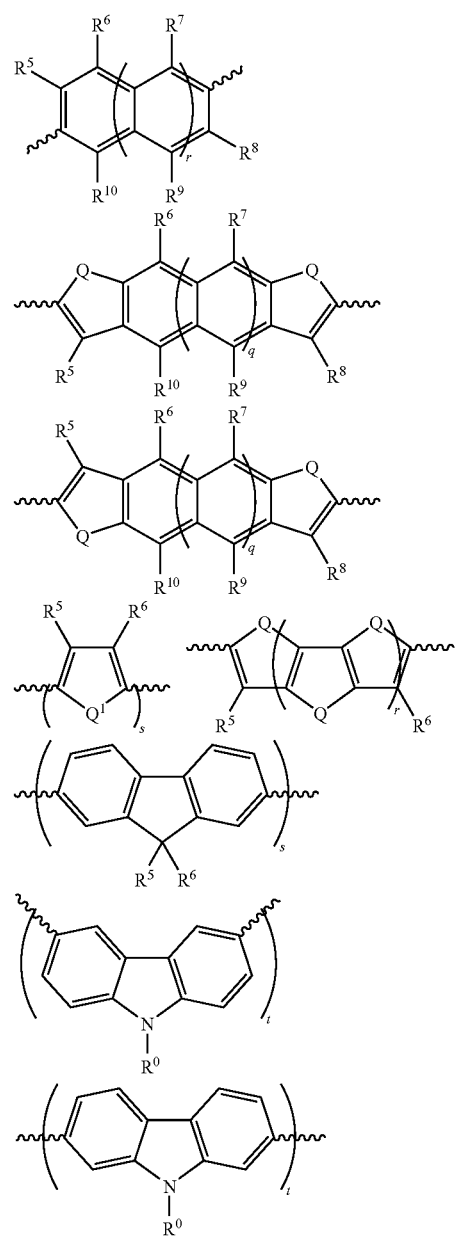

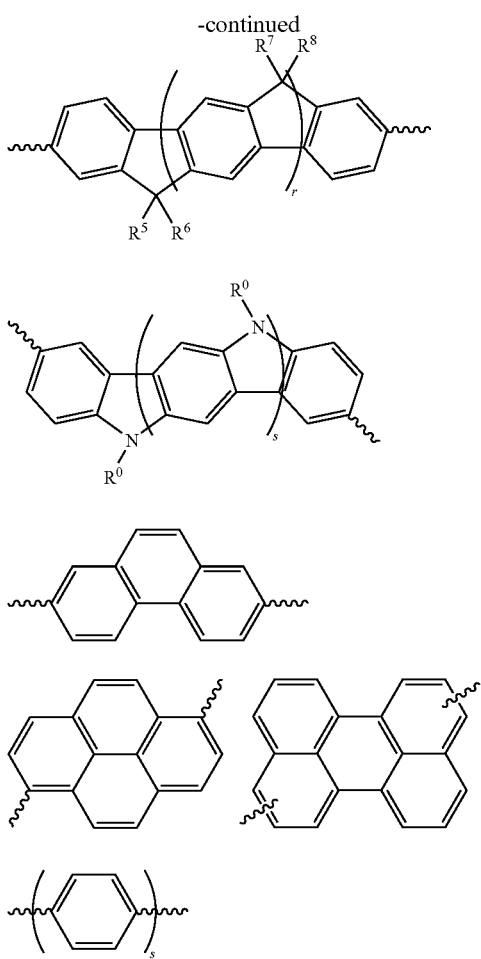

wherein r=2 or 3 and m and n=1.

12. The thin film transistor of claim 1, wherein the substrate is selected from the group: polyethylene terephthalate, polyethylene naphthalate, triacetyl cellulose, glass and polyimide.

13. The thin film transistor of claim 1, wherein at least one of the gate electrode, source electrode or drain electrode, comprises a conducting polymer selected from the group: polyaniline, polythiophene, polypyrrole, polyheteroaromatic vinylene and their derivatives; being characterized by the presence of nitrogen or sulfur atoms in a polymer backbone; and further comprises 0.1 to 12 wt % single wall carbon nanotubes and an organic protic acid having 1 to 30 carbons, said acid at a molar equivalent amount of about 25% to about 100% of the nitrogen or sulfur atoms in the polymer backbone.

14. A thin film transistor comprising:
a) a substrate;
b) a gate electrode;
c) a dielectric layer;
d) a source electrode;
e) a drain electrode; and
f) a semiconductor layer;
wherein the dielectric layer has a resistivity of about $10^{14}$ ohm-cm or greater, and comprises at least one Layer C, comprising one or more dielectric polymer(s) selected from the group consisting of: acrylic, styrenic and styrenic-acrylic latexes; comprising at least about 85 wt % of monomers selected from the group consisting of: alkyl (meth)acrylate, styrene, and alkyl-substituted styrene wherein the alkyl group is a C1 to C18 straight or branched chain alkyl group.

15. The thin film transistor of claim 14 wherein the gate electrode and the semiconductor layer both contact the dielectric layer, the source electrode and the drain electrode both contact the semiconductor layer and the electrodes are not in contact with each other.

16. The thin film transistor of claim 14, wherein Layer C further comprises a high κ nanoparticle fraction of up to about 90 wt % of Layer C, with the nanoparticle fraction having a dielectric constant greater than about 20 and an average particle size of about 5 nm to about 500 nm.

17. The thin film transistor of claim 14, wherein the semiconductor layer is selected from the group consisting of: pentacene, Compound 3 and Compound 77:

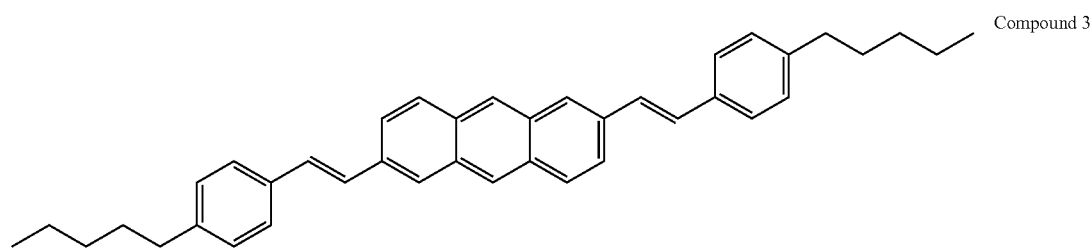

Compound 3

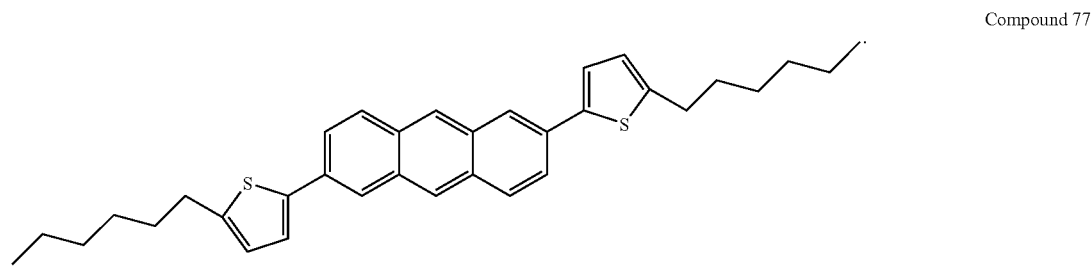

Compound 77

18. The thin film transistor of claim 14, wherein the semiconductor layer comprises a compound of Formula (III):

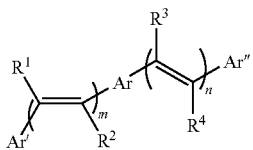

Formula (III)

wherein Ar is selected from the group consisting of:

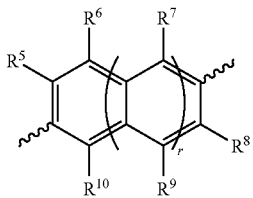

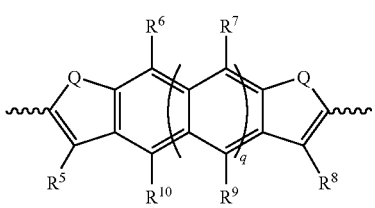

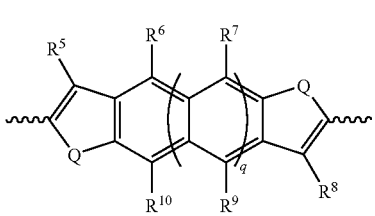

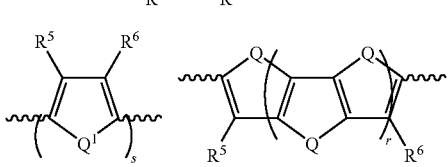

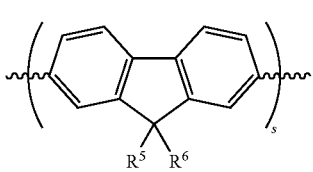

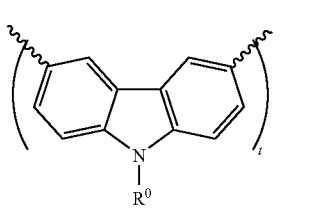

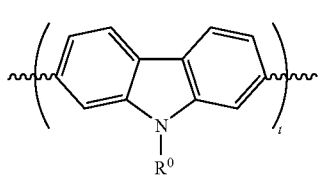

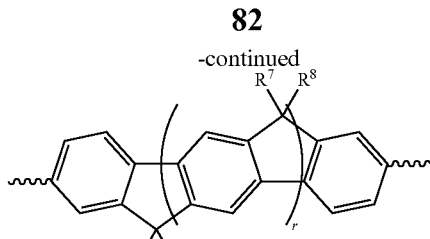

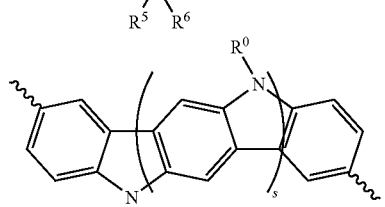

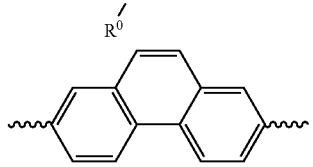

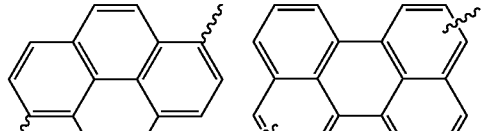

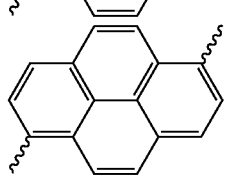 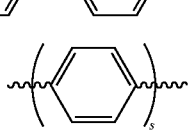

and combinations thereof, wherein:

Ar' and Ar'' are selected independently from the group consisting of aryl groups;

m and n are integers each independently having a value of from 0 to 5;

Q is selected from the group consisting of S, Se, Te, O, and NR⁰;

Q¹ is selected from the group consisting of Se, Te, O, and NR⁰;

q and r are selected independently from the group consisting of 0, 1, 2, 3, 4, and 5;

s is an integer having a value of from 1 to 5;

t is an integer having a value of from 2 to 5;

R⁰ is selected from the group consisting of hydrogen, alkyl, and aryl;

R¹ through R¹⁰ are selected independently from the group consisting of hydrogen, alkyl, aryl, halogen, hydroxyl, aryloxy, alkoxy, alkenyl, alkynyl, amino, alkylthio, phosphino, silyl, —COR, —COOR, —PO₃R₂, —OPO₃R₂, and CN; and R is selected from the group consisting of hydrogen, alkyl, aryl, alkenyl, and alkynyl,;

wherein any two adjacent groups, R⁵ through R¹⁰ can be taken together to form a ring.

19. The thin film transistor of claim 18, wherein r≠0, and s≠1.

20. The thin film transistor of claim 18, wherein Ar is

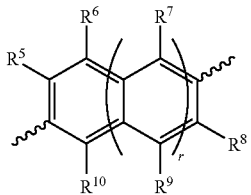

wherein r=2 or 3 and m and n=1.

21. The thin film transistor of claim 14, wherein the substrate is selected from the group: polyethylene terephthalate, polyethylene naphthalate, triacetyl cellulose, glass and polyimide.

22. The thin film transistor of claim 14, wherein at least one of the gate electrode, source electrode or drain electrode comprises a conducting polymer selected from the group: polyaniline, polythiophene, polypyrrole, polyheteroaromatic vinylenes and their derivatives; being characterized by the presence of nitrogen or sulfur atoms in a polymer backbone; and further comprises 0.1 to 12 wt % single wall carbon nanotubes and an organic protic acid having 1 to 30 carbons, said acid at a molar equivalent amount of about 25% to about 100 % of the nitrogen or sulfur atoms in the polymer backbone.

23. The thin film transistor of claim 1 having an Ion/off of about 1 E+05 or greater.

24. A thin film transistor array comprising a plurality of transistors of claim 1 having a yield of functional transistors of about 98 % or greater.

25. The thin film transistor of claim 1 having a mobility of about 0.5 $cm^2V^{-1}s^{-1}$ or greater.

26. The thin film transistor of claim 10, wherein r≠0, and s≠1.

27. The thin film transistor of claim 10, wherein Ar is selected from the group consisting of:

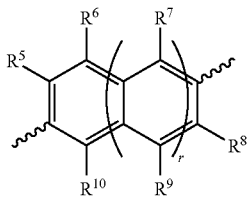

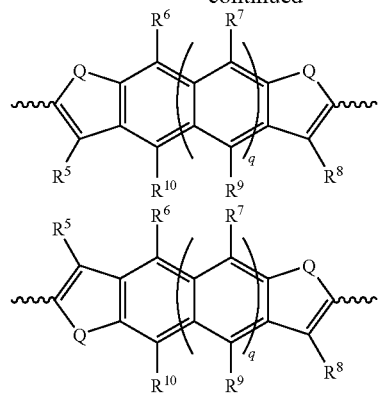

and combinations thereof, wherein r≠0.

28. The thin film transistor of claim 18, wherein Ar is selected from the group consisting of:

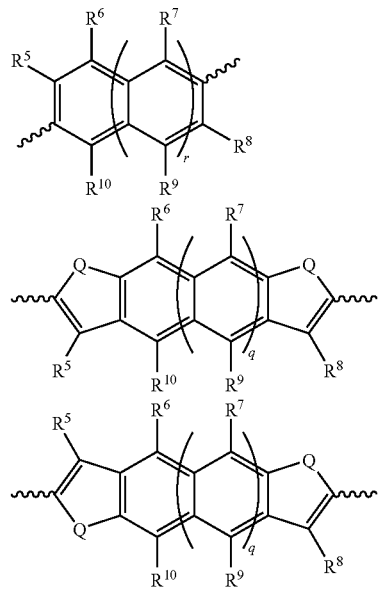

and combinations thereof, wherein r≠0.

* * * * *

UNITED STATES PATENT AND TRADEMARK OFFICE
CERTIFICATE OF CORRECTION

PATENT NO.       : 8,053,840 B2
APPLICATION NO.  : 12/403685
DATED            : November 8, 2011
INVENTOR(S)      : Richard Kevin Bailey et al.

It is certified that error appears in the above-identified patent and that said Letters Patent is hereby corrected as shown below:

Columns 27 and 28, last line, the chemical structure for Compound 33 should appear as follows:

The label and structure for Compound 42 are printed twice, once spanning the bottom of columns 29 and 30 and once spanning the top of columns 31 and 32.

Column 77, line 55, the first chemical structure should appear as follows:

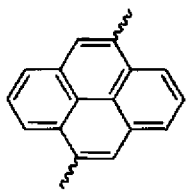

Column 82, line 30, the first chemical structure should appear as follows:

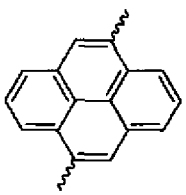

Column 78, line 18, cancel the text and chemical structures beginning with "11. The thin film transistor" to and ending "and m and n=1." in column 79, line 39, and insert the following claim:

Signed and Sealed this
Fourteenth Day of February, 2012

David J. Kappos
*Director of the United States Patent and Trademark Office*

--11. The thin film transistor of claim 10, wherein Ar is
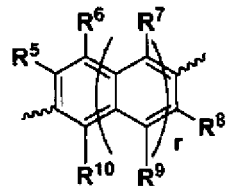
wherein r = 2 or 3 and m and n = 1.--